US008663907B2

(12) United States Patent
Kato et al.

(10) Patent No.: US 8,663,907 B2
(45) Date of Patent: Mar. 4, 2014

(54) METHOD OF FORMING PATTERN

(75) Inventors: Keita Kato, Shizuoka (JP); Sou Kamimura, Shizuoka (JP); Yuichiro Enomoto, Shizuoka (JP); Kaoru Iwato, Shizuoka (JP); Shohei Kataoka, Shizuoka (JP); Shoichi Saitoh, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 50 days.

(21) Appl. No.: 13/216,903

(22) Filed: Aug. 24, 2011

(65) Prior Publication Data

US 2012/0052449 A1 Mar. 1, 2012

(30) Foreign Application Priority Data

Aug. 25, 2010 (JP) ................. 2010-188639

(51) Int. Cl.
*G03F 7/26* (2006.01)

(52) U.S. Cl.
USPC ........................................ 430/325

(58) Field of Classification Search
USPC ......................... 430/322, 325, 331
See application file for complete search history.

(56) References Cited

U.S. PATENT DOCUMENTS

| 7,183,368 B2 | 2/2007 | Hada et al. |
| 2009/0142693 A1 | 6/2009 | Iwashita |
| 2010/0040972 A1 * | 2/2010 | Tarutani et al. ............ 430/270.1 |
| 2010/0323305 A1 | 12/2010 | Tsubaki et al. |
| 2011/0258837 A1 * | 10/2011 | Scannon et al. ................ 29/592 |

FOREIGN PATENT DOCUMENTS

| JP | 2000-206694 A | | 7/2000 |
| JP | 2004-330056 | * | 11/2004 |
| JP | 2006-195050 A | | 7/2006 |
| JP | 2006-259582 A | | 9/2006 |
| JP | 2006-317803 A | | 11/2006 |
| JP | 2007-258367 A | | 10/2007 |
| JP | 2008-292975 A | | 12/2008 |
| JP | 2009-25708 A | | 2/2009 |
| JP | 2009-053657 A | | 3/2009 |
| JP | 2010-152353 A | | 7/2010 |
| JP | 2010-078981 A | | 8/2010 |
| WO | 2010/061977 A2 | | 6/2010 |

OTHER PUBLICATIONS

English translation of JP Publication 2004-330056, Nov. 2004.*
Japanese Office Action for corresponding Application No. 2010-188639 issued Jan. 7, 2014.

* cited by examiner

*Primary Examiner* — Brittany Raymond
(74) *Attorney, Agent, or Firm* — Sughrue Mion, PLLC

(57) ABSTRACT

Provided is a method of forming pattern including (a) forming a chemically amplified resist composition into a film, (b) exposing the film to light, and (c) developing the exposed film with a developer containing a first organic solvent, wherein in the developer, particles each having a diameter of 0.3 μm or greater amount to a density of 30 particles/ml or less.

18 Claims, No Drawings

METHOD OF FORMING PATTERN

CROSS-REFERENCE TO RELATED APPLICATIONS

This application is based upon and claims the benefit of priority from prior Japanese Patent Application No. 2010-188639, filed Aug. 25, 2010, the entire contents of which are incorporated herein by reference.

BACKGROUND OF THE INVENTION

1. Field of the Invention

The present invention relates to a method of forming a pattern. More particularly, the present invention relates to a method of forming a pattern that is suitable for use in, for example, a semiconductor production process for an IC or the like, a circuit board production process for a liquid crystal, a thermal head or the like and other photoapplication lithography processes. In particular, the present invention relates to a method of forming a pattern that is suitable for the lithography using an ArF exposure apparatus or liquid-immersion projection exposure apparatus in which a far-ultraviolet light of wavelength 300 nm or shorter is employed as a light source.

2. Description of the Related Art

Since the development of the resist for a KrF excimer laser (248 nm), a pattern forming method based on chemical amplification has been employed as a resist patterning method in order to compensate for any sensitivity decrease caused by light absorption. A positive pattern forming method based on chemical amplification will be described by way of example. In this pattern forming method, the acid generator contained in exposed areas is decomposed upon exposure to light, such as an excimer laser, electron beams or an extreme ultraviolet light, to thereby generate an acid. In the stage of the bake after the exposure (Post-Exposure Bake: PEB), the generated acid is utilized as a reaction catalyst so that alkali-insoluble groups are converted to alkali-soluble groups. Thereafter, the exposed areas are removed by an alkali developer.

For use in the above method, various alkali developers have been proposed. For example, an aqueous alkali developer containing 2.38 mass % TMAH (aqueous solution of tetramethylammonium hydroxide) is universally used.

Moreover, the shortening of the wavelength of exposure light sources and the realization of high numerical apertures (high NA) for projector lenses have been advanced in order to cope with the miniaturization of semiconductor elements. To now, an exposure unit using an ArF excimer laser of 193 nm wavelength as a light source has been developed. Further, a method, known as a liquid-immersion method, in which the space between a projector lens and a sample is filled with a liquid of high refractive index (hereinafter also referred to as an "immersion liquid") has been proposed as a technology for enhancing the resolving power. Still further, an EUV lithography or the like in which exposure is carried out using an ultraviolet of further shorter wavelength (13.5 nm) has been proposed.

In another aspect, not only the currently mainstream positive type but also negative chemically amplified resist compositions for use in the pattern formation by alkali development are being developed (see, for example, patent references 1 to 4). This reflects the situation in which in the production of semiconductor elements and the like, while there is a demand for the formation of a pattern with various configurations, such as a line, a trench and a hole, there exist patterns whose formation is difficult with the use of current positive resists.

Also, the development of negative resist developers is being promoted. For example, patent reference 5 discloses using as a developer a negative developer comprising an organic solvent in which the content of metal impurities is controlled at a given value or less in order to realize a pattern formation exhibiting a high sensitivity, excelling in the resolution of trench pattern and ensuring favorable iso/dense bias.

Moreover, a double development technique as a double patterning technology capable of enhancing the resolving power is described in patent reference 6 and patent reference 7. In this technique, using the phenomenon that upon exposure, the polarity of the resin contained in the resist composition becomes high in a region of high light intensity while the polarity of the resin is kept low in a region of low light intensity, the region of high exposure in a specified resist film is dissolved by a developer of high polarity while the region of low exposure is dissolved by a developer comprising an organic solvent. Thus, the region of intermediate exposure amount remains undissolved away during the development, so that a line-and-space pattern with a half pitch of exposure mask is formed.

CITATION LIST

Patent Literature

[Patent reference 1] Jpn. Pat. Appln. KOKAI Publication No. (hereinafter referred to as JP-A-) 2006-317803,
[Patent reference 2] JP-A-2006-259582,
[Patent reference 3] JP-A-2006-195050,
[Patent reference 4] JP-A-2000-206694,
[Patent reference 5] JP-A-2009-025708,
[Patent reference 6] JP-A-2008-292975, and
[Patent reference 7] JP-A-2010-152353.

BRIEF SUMMARY OF THE INVENTION

It is an object of the present invention to provide a method of forming a pattern by which a pattern of low defect density can be formed.

The present invention is, for example, as follows.

Herein, the term "particle density" refers to the value measured by means of an in-liquid particle sensor KS-41A (manufactured by Rion Co., Ltd.). In particular, the number of particles each having a diameter of 0.3 μm or greater is counted by means of this instrument, and the number is divided by the volume of the fluid used in the measurement. Thus, the "particle density (number/ml)" is determined.

[1] A method of forming a pattern, comprising:
  (a) forming a chemically amplified resist composition into a film,
  (b) exposing the film to light, and
  (c) developing the exposed film with a developer containing a first organic solvent,
wherein in the developer, particles each having a diameter of 0.3 μm or greater amount to a density of 30 particles/ml or less.

[2] The method according to item [1], wherein the first organic solvent contained in the developer is one filled in a storage container in an environment whose cleanliness defined in US Federal Standard (USA Fed. Std.) 209E is class 10,000 or below.

[3] The method according to item [1] or [2], which further comprises:
  (d) rinsing the developed film by a rinse liquid containing a second organic solvent, wherein in the rinse liquid, particles each having a diameter of 0.3 μm or greater amount to a density of 30 particles/ml or less.

[4] The method according to item [3], wherein the second organic solvent contained in the rinse liquid is one filled in a storage container in an environment whose cleanliness defined in US Federal Standard (USA Fed. Std.) 209E is class 10,000 or below.

[5] The method according to any one of items [1] to [4], wherein the exposure (b) is carried out using an ArF excimer laser.

[6] The method according to any one of items [1] to [5], wherein the composition comprises a resin containing a group that when acted on by an acid, is decomposed to thereby produce a polar group and a compound that when exposed to actinic rays or radiation, generates an acid.

[7] The method according to item [6], wherein the resin has an alicyclic hydrocarbon structure.

[8] The method according to item [6] or [7], wherein substantially no aromatic ring is contained in the resin.

[9] A developer containing an organic solvent, wherein particles each having a diameter of 0.3 μm or greater are contained in a density of 30 particles/ml or less, for use in the method according to any one of items [1] to [8].

[10] A rinse liquid containing an organic solvent, wherein particles each having a diameter of 0.3 μm or greater are contained in a density of 30 particles/ml or less, for use in the method according to any one of items [3] to [8].

The present invention has made it feasible to provide a method of forming a pattern by which a pattern of low defect density can be formed.

DETAILED DESCRIPTION OF THE INVENTION

Embodiments of the present invention will be described in detail below.

Herein, the groups and atomic groups for which no statement is made as to substitution or nonsubstitution are to be interpreted as including those containing no substituents and also those containing substituents. For example, the "alkyl groups" for which no statement is made as to substitution or nonsubstitution are to be interpreted as including not only the alkyl groups containing no substituents (unsubstituted alkyl groups) but also the alkyl groups containing substituents (substituted alkyl groups).

Further, herein, the terms "actinic rays" and "radiation" mean, for example, brightline spectra from a mercury lamp, far ultraviolet represented by an excimer laser, extreme ultraviolet (EUV), X-rays and electron beams (EB). The term "light" means actinic rays or radiation. The term "exposure" means not only irradiation with light, such as light from a mercury lamp, far ultraviolet, X-rays or EUV light, but also lithography using particle beams, such as electron beams and ion beams.

Heretofore, a method comprising (a) forming a chemically amplified resist composition into a film, (b) exposing the film to light and (c) developing the exposed film with a developer containing an organic solvent is known as a negative patterning method.

The inventors have found that the defect density of the pattern is likely to become relatively high when a pattern is formed by this method. The reason therefor is not necessarily apparent. However, the inventors have arrived at the following further finding.

Namely, in the positive patterning method using an alkali developer, the pattern remaining after the development is hydrophobic. In contrast, in the negative patterning method using a developer containing an organic solvent, the pattern remaining after the development is hydrophilic. Accordingly, in the latter instance, the pattern remaining after the development has polarity. Therefore, in this instance, particles derived from the developer are likely to adhere onto the pattern having been formed or being formed. Consequently, in this instance, there is the possibility of increasing of the defect density of the pattern caused by particles being present in the developer.

Taking these aspects into account, the inventors have studied the use of a developer with the following formulation. Consequently, the inventors have proved that the defect density of the pattern can be strikingly reduced by employing the following formulation.

[1] Developer and Rinse Liquid

In the developer containing an organic solvent for use in the method of the present invention, the density of particles each having a diameter of 0.3 μm or greater is 30 particles/ml or less. The particle density is preferably 25 particles/ml or less, more preferably 20 particles/ml or less, further more preferably 15 particles/ml or less, still further more preferably 10 particles/ml or less and most preferably 5 particles/ml or less.

As the means for regulating the particle density of the developer containing an organic solvent so as to fall within the above ranges, there can be mentioned, for example, the following methods. Two or more of these methods may be used in combination.

(1) As the organic solvent contained the developer, use is made of one having been passed through a filter with a small pore size. The filter is preferably a polyethylene filter. The pore size of the filter is preferably 0.10 μm or less, more preferably 0.05 μm or less.

(2) As the organic solvent contained in the developer, use is made of one filled in a storage container in an environment whose cleanliness defined in US Federal Standard (USA Fed. Std.) 209E is class 10,000 or below. This filling is preferably performed in an environment whose cleanliness is class 1000 or below, more preferably an environment whose cleanliness is class 100 or below.

(3) As the organic solvent contained in the developer, use is made of one filled in a storage container having been rinsed with the above organic solvent and dried.

(4) As the organic solvent contained in the developer, use is made of one having been subjected to distilling operation.

As the developers containing an organic solvent, there can be mentioned, for example, developers containing a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone or propylene carbonate.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate (EEP), 3-methoxybutyl acetate, 3-methyl-3-methoxybutyl acetate, methyl formate, ethyl formate, butyl formate, propyl formate, ethyl lactate, butyl lactate, propyl lactate, methyl propionate, ethyl propionate or propyl propionate. In particular, acetic acid alkyl esters, such as methyl acetate, butyl acetate, ethyl acetate, isopropyl acetate and amyl acetate, and propionic acid alkyl esters, such as methyl propionate, ethyl propionate and propyl propionate, are preferred.

As the alcohol solvent, there can be mentioned, for example, an alcohol, such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol, such as ethylene glycol, diethylene glycol or triethylene glycol; or a glycol ether, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol.

As the ether solvent, there can be mentioned, for example, not only any of the above-mentioned glycol ethers but also dioxane, tetrahydrofuran or the like.

As the amide solvent, there can be mentioned, for example, N-methyl-2-pyrrolidone, N,N-dimethylacetamide, N,N-dimethylformamide, hexamethylphosphoric triamide or 1,3-dimethyl-2-imidazolidinone.

As the hydrocarbon solvent, there can be mentioned, for example, an aromatic hydrocarbon solvent, such as toluene or xylene, or an aliphatic hydrocarbon solvent, such as pentane, hexane, octane or decane.

Two or more of these solvents may be mixed together before use. Alternatively, each of the solvents may be used in a mixture with a solvent other than those mentioned above and/or water within a proportion not detrimental to full exertion of performance. The water content of the whole developer is preferably below 10 mass %. More preferably, the developer contains substantially no water. Namely, it is preferred for the developer to consist substantially only of an organic solvent. Even if so, the developer can contain any of surfactants to be described hereinafter. Also, even if so, the developer may contain unavoidable impurities from the atmosphere.

The amount of organic solvent used in the developer is preferably in the range of 80 to 100 mass %, more preferably 90 to 100 mass % and further more preferably 95 to 100 mass % based on the whole amount of the developer.

It is especially preferred for the organic solvent contained in the developer to be at least one member selected from among a ketone solvent, an ester solvent, an alcohol solvent, an amide solvent and an ether solvent.

The vapor pressure of the developer containing an organic solvent at 20° C. is preferably 5 kPa or below, more preferably 3 kPa or below and most preferably 2 kPa or below. When the vapor pressure of the developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the developers exhibiting a vapor pressure of 5 kPa or below, there can be mentioned a ketone solvent, such as 1-octanone, 2-octanone, 1-nonanone, 2-nonanone, 4-heptanone, 2-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below, there can be mentioned a ketone solvent, such as 1-octanone, 2-octanone, 1-nonanone, 2-nonanone, 4-heptanone, 2-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, 4-methyl-2-pentanol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer.

The surfactant is not particularly limited. For example, use can be made of any of ionic and nonionic fluorinated and/or siliconized surfactants. As such fluorinated and/or siliconized surfactants, there can be mentioned, for example, those described in JP-A's S62-36663, S61-226746, S61-226745, S62-170950, 563-34540, H7-230165, H8-62834, H9-54432 and H9-5988 and U.S. Pat. Nos. 5,405,720, 5,360,692, 5,529,881, 5,296,330, 5,436,098, 5,576,143, 5,294,511 and 5,824,451. Nonionic surfactants are preferred. Using a nonionic fluorinated surfactant or siliconized surfactant is more preferred.

The amount of surfactant used is generally in the range of 0.001 to 5 mass %, preferably 0.005 to 2 mass % and further more preferably 0.01 to 0.5 mass % based on the whole amount of the developer.

The method of forming a pattern according to the present invention may further comprise (d) rinsing the developed film by means of a rinse liquid containing a second organic solvent. It is preferred for the rinse liquid to be one in which the density of particles each having a diameter of 0.3 μm or greater is 30 particles/ml or less. The particle density is more preferably 25 particles/ml or less, further more preferably 20 particles/ml or less, still further more preferably 15 particles/ml or less, yet still further more preferably 10 particles/ml or less and most preferably 5 particles/ml or less.

As the means for regulating the particle density of the rinse liquid containing an organic solvent so as to fall within the above ranges, there can be mentioned, for example, the same methods as described above in connection with the developer.

The rinse liquid for use in the rinse operation is not particularly limited as long as it does not dissolve substantially the pattern after development, and solutions containing common organic solvents can be used.

As the rinse liquid, there can be mentioned, for example, one containing at least one organic solvent selected from among a hydrocarbon solvent, a ketone solvent, an ester solvent, an alcohol solvent, an amide solvent and an ether solvent. It is preferred for the rinse liquid to be one containing at least one organic solvent selected from among a ketone solvent, an ester solvent, an alcohol solvent and an amide solvent. A rinse liquid containing an alcohol solvent or an ester solvent is more preferred.

The rinse liquid further more preferably contains a monohydric alcohol, most preferably a monohydric alcohol having 5 or more carbon atoms.

The monohydric alcohol may be in the form of a linear chain, a branched chain or a ring. Particular examples of the monohydric alcohols include 1-butanol, 2-butanol, 3-methyl-1-butanol, tert-butyl alcohol, 1-pentanol, 2-pentanol, 1-hexanol, 4-methyl-2-pentanol, 1-heptanol, 1-octanol, 2-hexanol, cyclopentanol, 2-heptanol, 2-octanol, 3-hexanol, 3-heptanol, 3-octanol and 4-octanol. Particular examples of the monohydric alcohols each having 5 or more carbon atoms include 1-hexanol, 2-hexanol, 4-methyl-2-pentanol, 1-pentanol and 3-methyl-1-butanol.

Two or more of these components may be mixed together before use. Also, they may be mixed with other organic solvents before use.

The water content of the rinse liquid is preferably below 10 mass %, more preferably below 5 mass % and further more preferably below 3 mass %. Namely, the amount of organic solvent used in the rinse liquid is preferably in the range of 90 to 100 mass %, more preferably 95 to 100 mass % and most preferably 97 to 100 mass % based on the whole amount of the rinse liquid. Favorable development performance can be attained by controlling the water content of the rinse liquid at below 10 mass %.

The vapor pressure of the rinse liquid at 20° C. is preferably in the range of 0.05 to 5 kPa, more preferably 0.1 to 5 kPa and further more preferably 0.12 to 3 kPa. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

An appropriate amount of surfactant may be added to the rinse liquid.

[2] Method of Forming Pattern

The method of forming a pattern according to the present invention comprises:
  (a) forming a chemically amplified resist composition into a film,
  (b) exposing the film to light, and
  (c) developing the exposed film with the above-described developer.

As mentioned above, this method may further comprise (d) rinsing the developed film with a rinse liquid containing an organic solvent.

Preferably, this method still further comprises (e) baking the film having been rinsed with the above rinse liquid. Namely, it is preferred for the method of forming a pattern according to the present invention to still further comprise the operation of postbake.

The method of forming a pattern according to the present invention preferably comprises the operation of baking (f) to be performed after the operation of film formation (a) but prior to the operation of exposure (b).

Further, the method of forming a pattern according to the present invention preferably comprises the operation of baking (g) to be performed after the operation of exposure (b) but prior to the operation of development (c).

Still further, the method of forming a pattern according to the present invention may comprise (h) the operation of development using an aqueous alkali developer.

Operation of Forming Resist Film

The resist film formed in the method of forming a pattern according to the present invention is one formed from the chemically amplified resist composition according to the present invention to be described hereinafter. In particular, the resist film is preferably formed on a substrate.

The substrate that can be employed in the present invention is not particularly limited. Use can be made of any of an inorganic substrate of silicon, SiN, $SiO_2$, TiN or the like, a coated inorganic substrate such as SOG and substrates commonly employed in a semiconductor production process for an IC or the like, a circuit board production process for a liquid crystal, a thermal head or the like and other photoapplication lithography processes. Further, according to necessity, an organic antireflection film may be provided between the film and the substrate.

In the method of forming a pattern according to the present invention, any of the above-mentioned operations can be carried out using generally known techniques.

Prebake Operation and Post-Exposure Bake Operation

As mentioned above, the method preferably comprises a prebake (PB) operation to be performed after the film formation but prior to the exposure operation.

Also, the method preferably comprises a post-exposure bake (PEB) operation to be performed after the exposure operation but prior to the development operation.

In both the PB operation and the PEB operation, the baking is preferably performed at 70 to 120° C., more preferably 80 to 110° C.

The baking time is preferably in the range of 30 to 300 seconds, more preferably 30 to 180 seconds and further more preferably 30 to 90 seconds.

The baking can be performed by means provided in the common exposure/development equipment. The baking can also be performed using a hot plate or the like.

The baking accelerates the reaction in exposed areas, so that the sensitivity and pattern profile can be enhanced.

Operation of Exposure

In the present invention, the wavelength of the light source for use in the exposure equipment is not limited. For example, a KrF excimer laser wavelength (248 nm), an ArF excimer laser wavelength (193 nm) and an $F_2$ excimer laser wavelength (157 nm) can be applied.

With respect to the resist film according to the present invention, in the stage of exposure to actinic rays or radiation, the exposure (liquid immersion exposure) may be carried out while filling the space between the film and the lens with a liquid (immersion medium) having a refractive index higher than that of air. This enhances the resolution. As the immersion medium, any liquid can be used as long as it exhibits a refractive index higher than that of air. Preferably, pure water is employed.

In the liquid immersion exposure, the hydrophobic resin to be described hereinafter may be added to the resist composition in advance. Alternatively, the formation of the resist film may be followed by providing thereon a film that is highly insoluble in the immersion liquid (hereinafter also referred to as a "top coat").

The performance expected from the top coat, the method of using the same, etc. are described in Chapter 7 of "Process and Material of Liquid Immersion Lithography" published by CMC Publishing Co., Ltd.

From the viewpoint of the transparency to a laser of 193 nm wavelength, it is preferred for the top coat to be formed of a polymer not abundantly containing an aromatic moiety. As such a polymer, there can be mentioned, for example, a hydrocarbon polymer, an acrylic ester polymer, polymethacrylic acid, polyacrylic acid, polyvinyl ether, a siliconized polymer, a fluoropolymer or the like. Any of the above-mentioned hydrophobic resins (HR) can be appropriately used as the top coat, and commercially available top coat materials can also be appropriately used.

When the top coat is detached after the exposure, use may be made of a developer. Alternatively, a separate peeling agent may be used. The peeling agent is preferably a solvent exhibiting less permeation into the film. Detachability by a developer is preferred from the viewpoint of simultaneously performing the detachment operation and the operation of film development processing.

Operation of Development

As the development method, use can be made of, for example, a method in which the substrate is dipped in a tank filled with a developer for a given period of time (dip method), a method in which a developer is puddled on the surface of the substrate by its surface tension and allowed to stand still for a given period of time to thereby effect development (puddle method), a method in which a developer is sprayed onto the surface of the substrate (spray method), or a method in which a developer is continuously discharged onto the substrate being rotated at a given speed while scanning a developer discharge nozzle at a given speed (dynamic dispense method).

In the above various development methods, when the operation of discharging a developer toward the resist film through a development nozzle of a development apparatus is included, the discharge pressure of discharged developer (flow rate per area of discharged developer) is preferably 2 ml/s/mm$^2$ or below, more preferably 1.5 ml/s/mm$^2$ or below and further more preferably 1 ml/s/mm$^2$ or below. There is no particular lower limit of the flow rate. However, from the viewpoint of through-put, it is preferred for the flow rate to be 0.2 ml/s/mm$^2$ or higher.

Pattern defects attributed to any resist residue after development can be markedly reduced by regulating the discharge pressure of discharged developer so as to fall within the above range.

The detail of the mechanism thereof is not apparent. However, it is presumed that regulating the discharge pressure so as to fall within the above range would lower the pressure on the resist film exerted by the developer, thereby inhibiting any inadvertent shaving or crumbling of the resist film and resist pattern.

The discharge pressure of developer (ml/s/mm$^2$) refers to a value at the outlet of the development nozzle of the development apparatus.

As the method of regulating the discharge pressure of the developer, there can be mentioned, for example, a method in which the discharge pressure is regulated by means of a pump or the like, a method in which the discharge pressure of the developer is changed through the pressure regulation by supply from a pressure tank, or the like.

In the development operation, when use is made of the developer in which the density of particles each having a diameter of 0.3 μm or greater is 30 particles/ml or less, the defect density can be reduced even if the following rinse operation is skipped. In that instance, not only can the total amount of solvent required for pattern formation be decreased but also the time required for pattern formation can be shortened.

Operation of Rinse

In the rinse operation, the wafer having undergone the development is rinsed using the rinse liquid containing an organic solvent to be described hereinafter. The method of rinse treatment is not particularly limited. For example, use can be made of any of a method in which the rinse liquid is continuously applied onto the substrate being rotated at a given speed (spin application method), a method in which the substrate is dipped in a tank filled with the rinse liquid for a given period of time (dip method) and a method in which the rinse liquid is sprayed onto the surface of the substrate (spray method). Preferably, the rinse treatment is carried out according to the spin application method among the above methods, and thereafter the substrate is rotated at a rotating speed of 2000 to 4000 rpm to thereby remove the rinse liquid from the top of the substrate. The duration of substrate rotation can be set within the range ensuring the attainment of the removal of the rinse liquid from the top of the substrate, depending on the rotating speed. The duration of substrate rotation is generally in the range of 10 seconds to 3 minutes.

Operation of Postbake

Any inter-pattern and intra-pattern remaining developer and/or rinse liquid can be removed by carrying out a postbake. The postbake operation is generally performed at 40 to 160° C., preferably 70 to 95° C., for a period of 10 seconds to 3 minutes, preferably 30 to 90 seconds.

[3] Chemically Amplified Resist Composition

[3-1] Resin (A)

A negative pattern is formed from the chemically amplified resist composition according to the present invention by the above pattern forming method of the present invention.

Namely, in the resist film obtained from the chemically amplified resist composition according to the present invention, the exposed areas have their solubility in the developer containing an organic solvent decreased under the action of an acid and are rendered insoluble or highly insoluble therein. On the other hand, the nonexposed areas are soluble in the developer containing an organic solvent. Thus, a negative pattern is obtained.

It is optional for the resin (A) to contain a repeating unit containing an acid group. Preferably, the resin (A) does not contain such a repeating unit.

As the acid group, there can be mentioned, for example, a carboxyl group, a sulfonamido group, a sulfonylimido group, a bissulfonylimido group, an aliphatic alcohol substituted at its a-position with an electron withdrawing group (for example, a hexafluoroisopropanol group —$C(CF_3)_2OH$) or the like.

When the resin (A) contains an acid group, the content of repeating unit containing an acid group in the resin (A) is preferably 10 mol % or below, more preferably 5 mol % or below. When the resin (A) contains a repeating unit containing an acid group, the content of repeating unit containing an acid group in the resin (A) is generally not lower than 1 mol %.

As long as the film formed from the resist composition is soluble in the developer containing an organic solvent, this resin does not necessarily have to be by itself soluble in the developer. For example, the resin can be by itself insoluble in the developer when the film formed from the resist composition is soluble in the developer, depending on the properties and content of other components contained in the resist composition.

The resin (A) is generally synthesized by polymerization, such as radical polymerization, of monomers each with a polymerizable partial structure. The resin (A) contains the repeating units derived from the monomers each with a polymerizable partial structure. As the polymerizable partial structure, there can be mentioned, for example, an ethylenically polymerizable partial structure.

The various repeating units that can be contained in the resin (A) will be described in detail below.

(a1) Repeating unit containing an acid-decomposable group

The resin (A) is a resin whose solubility in the developer containing an organic solvent is decreased by the action of an acid. The resin (A) comprises, in its principal chain or side chain, or both of its principal chain and side chain, a repeating unit containing a group (hereinafter also referred to as "an acid-decomposable group") that is decomposed by the action of an acid to thereby produce a polar group. When the polar group is produced, the affinity of the resin for the developer containing an organic solvent is lowered to thereby promote the insolubilization or solubility drop (conversion to negative) of the resin.

It is preferred for the acid-decomposable group to have a structure in which the polar group is protected by a group that is decomposed by the action of an acid to thereby be cleaved.

The polar group is not particularly limited as long as it is a group insolubilized in the developer containing an organic solvent. As preferred examples thereof, there can be mentioned acid groups (groups that are dissociated in a 2.38 mass % aqueous tetramethylammonium hydroxide solution conventionally used as a resist developer), such as a carboxyl group, a fluoroalcohol group (preferably a hexafluoroisopropanol) and a sulfonic acid group.

The acid-decomposable group is preferably a group as obtained by substituting the hydrogen atom of any of these groups with an acid-cleavable group.

As the acid-cleavable group, there can be mentioned, for example, $-C(R_{36})(R_{37})(R_{38})$, $-C(R_{36})(R_{37})(OR_{39})$, $-C(R_{01})(R_{02})(OR_{39})$ or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded to each other to thereby form a ring.

Each of $R_{01}$ and $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The repeating unit with an acid-decomposable group that may be contained in the resin (A) is preferably any of those of the following general formula (AI).

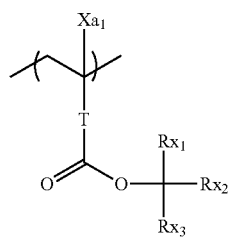

(AI)

In general formula (AI), $Xa_1$ represents a hydrogen atom, an optionally substituted methyl group or any of the groups of the formula $-CH_2-R_9$. $R_9$ represents a hydroxyl group or a monovalent organic group. The monovalent organic group is, for example, an alkyl group having 5 or less carbon atoms or an acyl group having 5 or less carbon atoms. Preferably, the monovalent organic group is an alkyl group having 3 or less carbon atoms, more preferably a methyl group. $Xa_1$ is preferably a hydrogen atom, a methyl group, a trifluoromethyl group or a hydroxymethyl group, more preferably a hydrogen atom, a methyl group or a hydroxymethyl group.

T represents a single bond or a bivalent connecting group.

Each of $Rx_1$ to $Rx_3$ independently represents an alkyl group (linear or branched) or a cycloalkyl group (monocyclic or polycyclic).

$Rx_2$ and $Rx_3$ may be bonded with each other to thereby form a cycloalkyl group (monocyclic or polycyclic).

As the bivalent connecting group represented by T, there can be mentioned an alkylene group, a group of the formula $-COO-Rt-$, a group of the formula $-O-Rt-$, a group comprising a combination of at least two of these, or the like. The total number of carbon atoms in the bivalent connecting group is preferably in the range of 1 to 12. In the formulae, Rt represents an alkylene group or a cycloalkylene group.

T is preferably a single bond or a group of the formula $-COO-Rt-$Rt is preferably an alkylene group having 1 to 5 carbon atoms, more preferably a $-CH_2-$group, $-(CH_2)_2-$ group or $-(CH_2)_3-$ group.

The alkyl group represented by each of $Rx_1$ to $Rx_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of $Rx_1$ to $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group.

The cycloalkyl group formed by bonding of $Rx_2$ and $Rx_3$ is preferably a cycloalkyl group of one ring, such as a cyclopentyl group or a cyclohexyl group, or a cycloalkyl group of multiple rings, such as a norbornyl group, a tetracyclodecanyl group, a tetracyclododecanyl group or an adamantyl group. The cycloalkyl group of a single ring having 5 or 6 carbon atoms is particularly preferred.

In a preferred mode, $Rx_1$ is a methyl group or an ethyl group, and $Rx_2$ and $Rx_3$ are bonded with each other to thereby form any of the above-mentioned cycloalkyl groups.

Each of the groups, above, may have a substituent. As the substituent, there can be mentioned, for example, an alkyl group (having 1 to 4 carbon atoms), a cycloalkyl group (having 3 to 15 carbon atoms), a halogen atom, a hydroxyl group, an alkoxy group (having 1 to 4 carbon atoms), a carboxyl group, an alkoxycarbonyl group (having 2 to 6 carbon atoms) or the like. Substituents having 8 or less carbon atoms are preferred.

Specific examples of the preferred repeating units with acid-decomposable groups will be shown below, which however in no way limit the scope of the present invention.

In the following formulae, each of Rx and $Xa_1$ represents a hydrogen atom, $CH_3$, $CF_3$ or $CH_2OH$. Each of Rxa and Rxb represents an alkyl group having 1 to 4 carbon atoms. Z, each independently in the presence of two or more groups, represents a substituent containing a polar group. p represents 0 or a positive integer. As the substituent containing a polar group, there can be mentioned, for example, a linear or branched alkyl group, or cycloalkyl group, in which a hydroxyl group, a cyano group, an amino group, an alkylamido group or a sulfonamido group is introduced. An alkyl group in which a hydroxyl group is introduced is preferred. As a branched alkyl group, an isopropyl group is especially preferred.

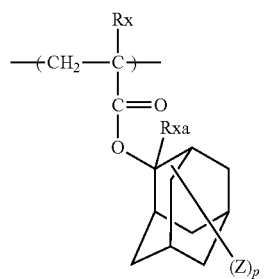
1
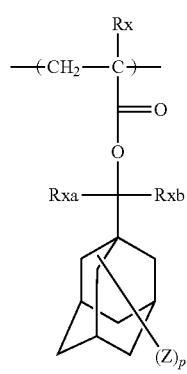
2
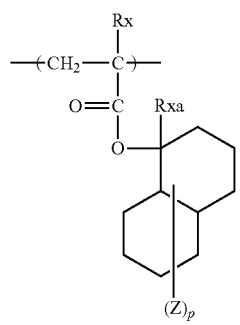
3
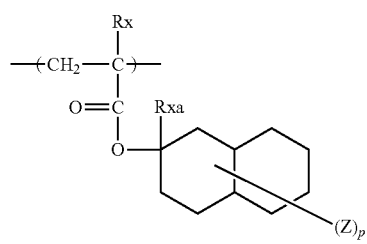
4
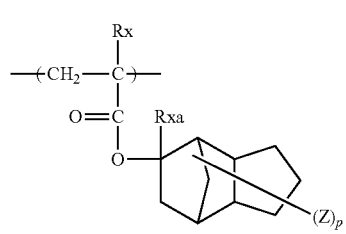
5
-continued
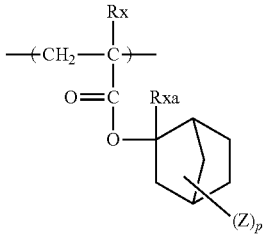
6
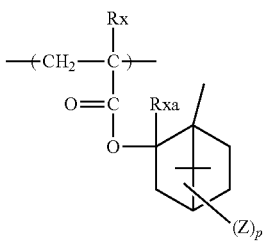
7
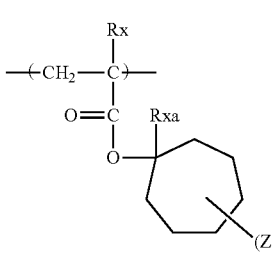
8
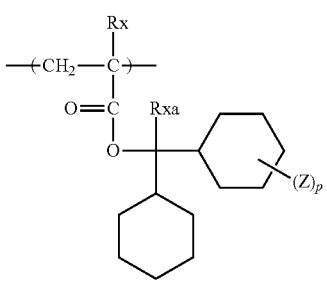
9
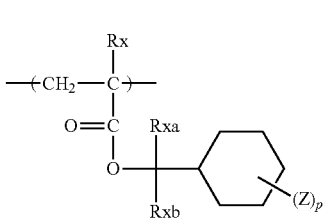
10
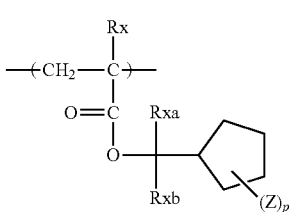
11

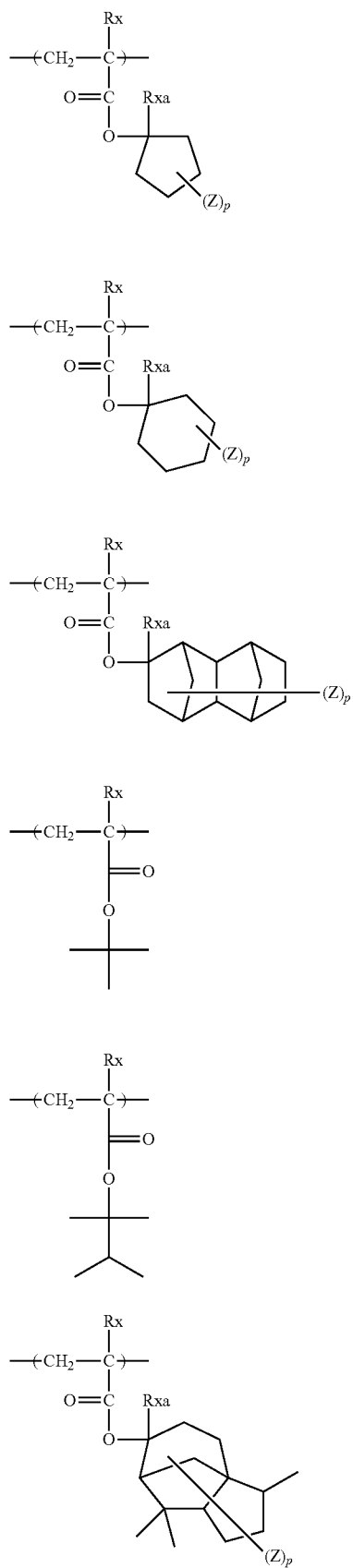
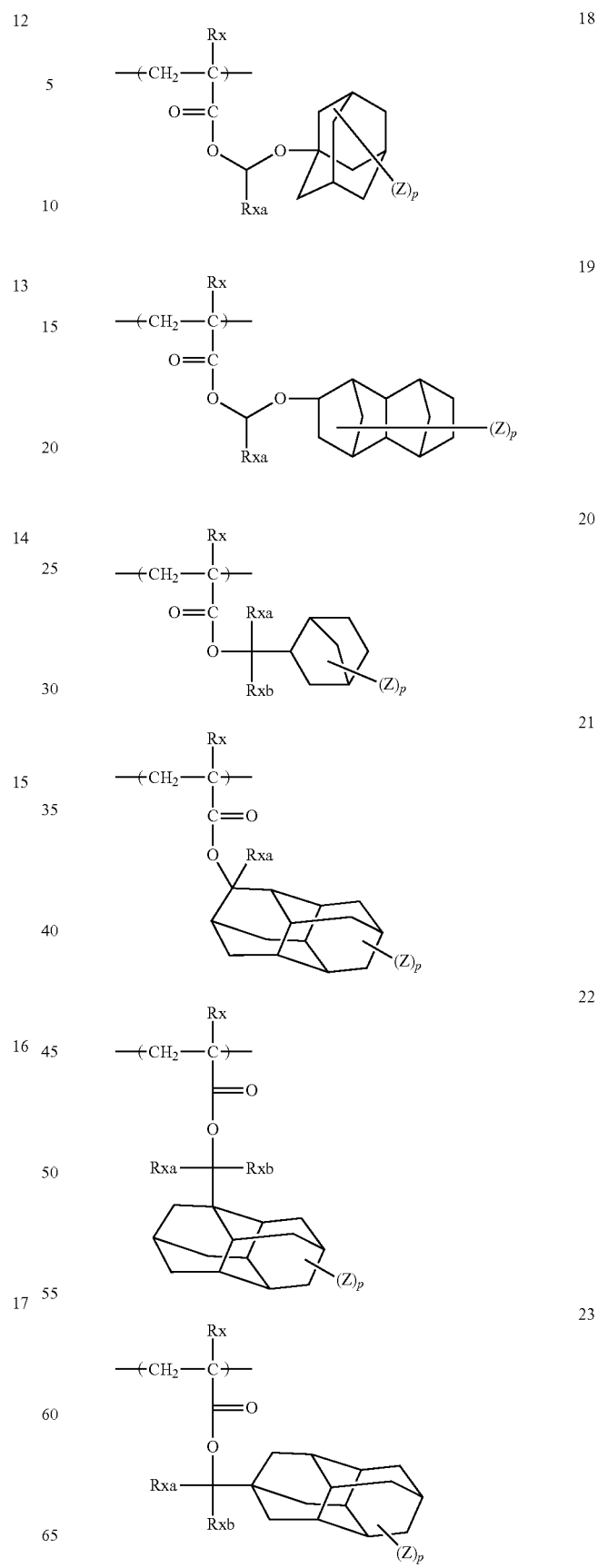

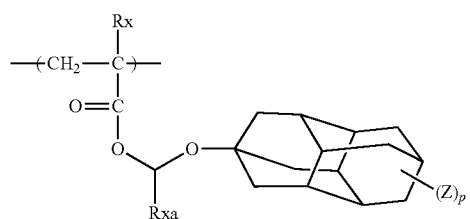
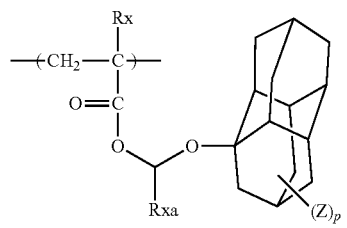
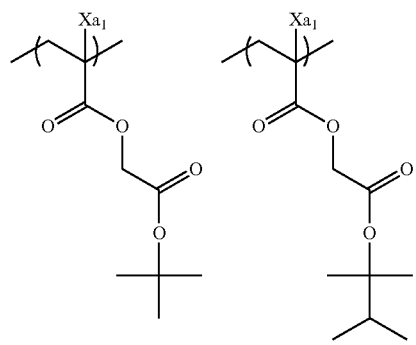
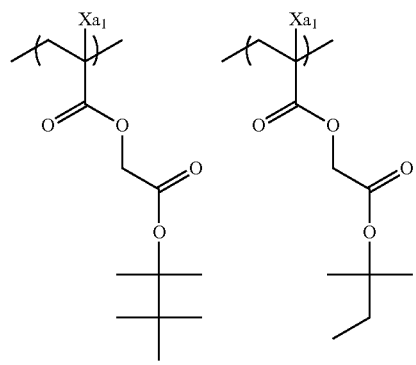
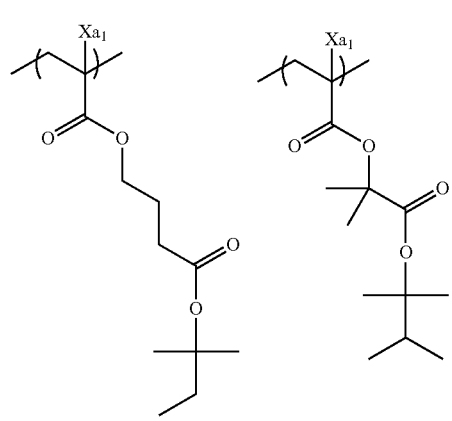
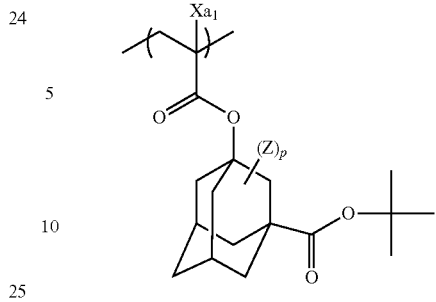
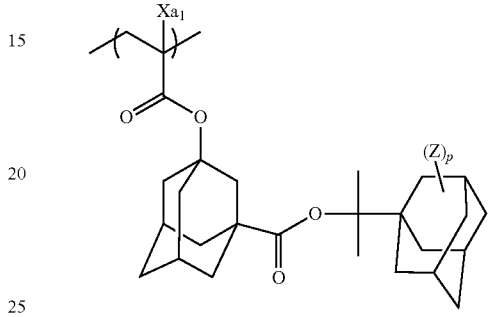
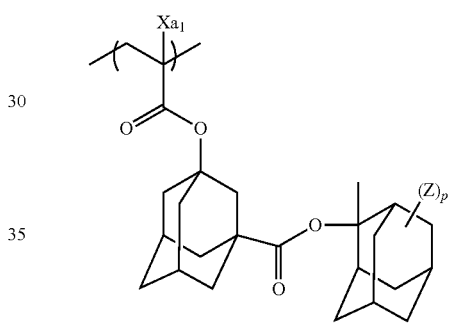
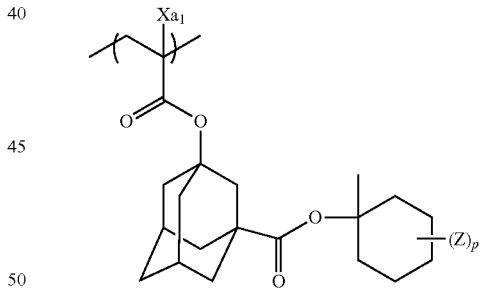
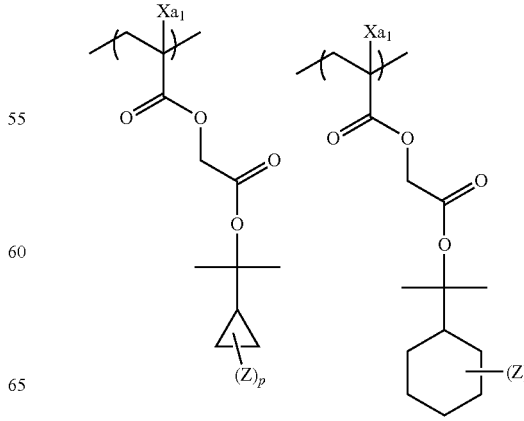

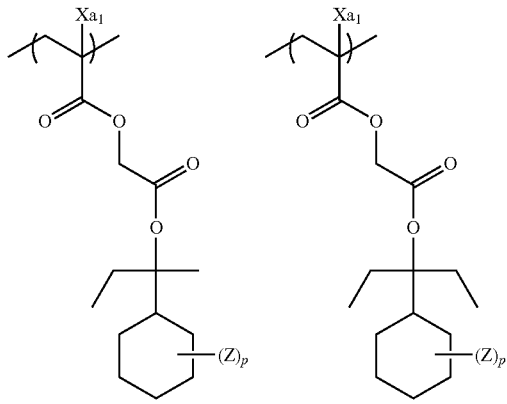
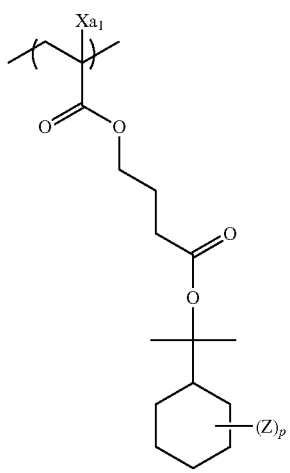
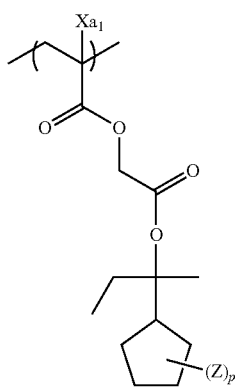
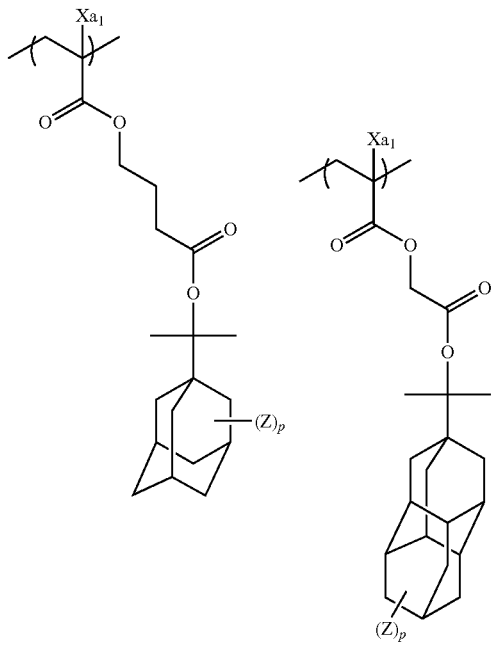
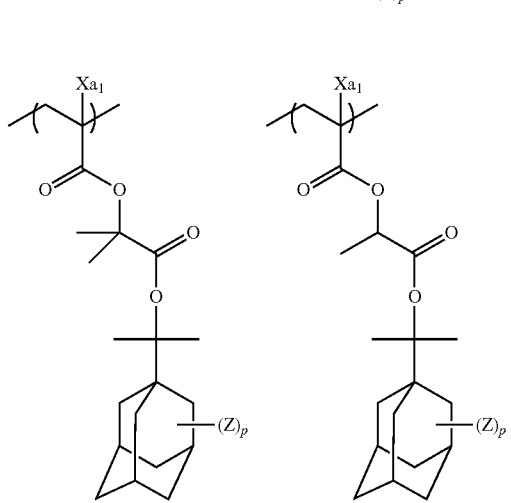
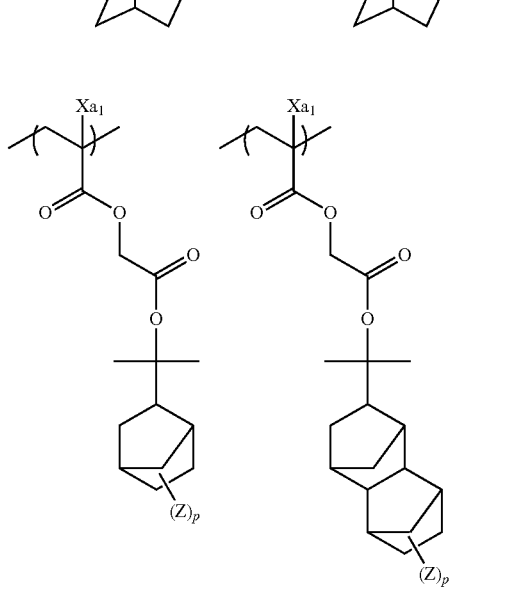

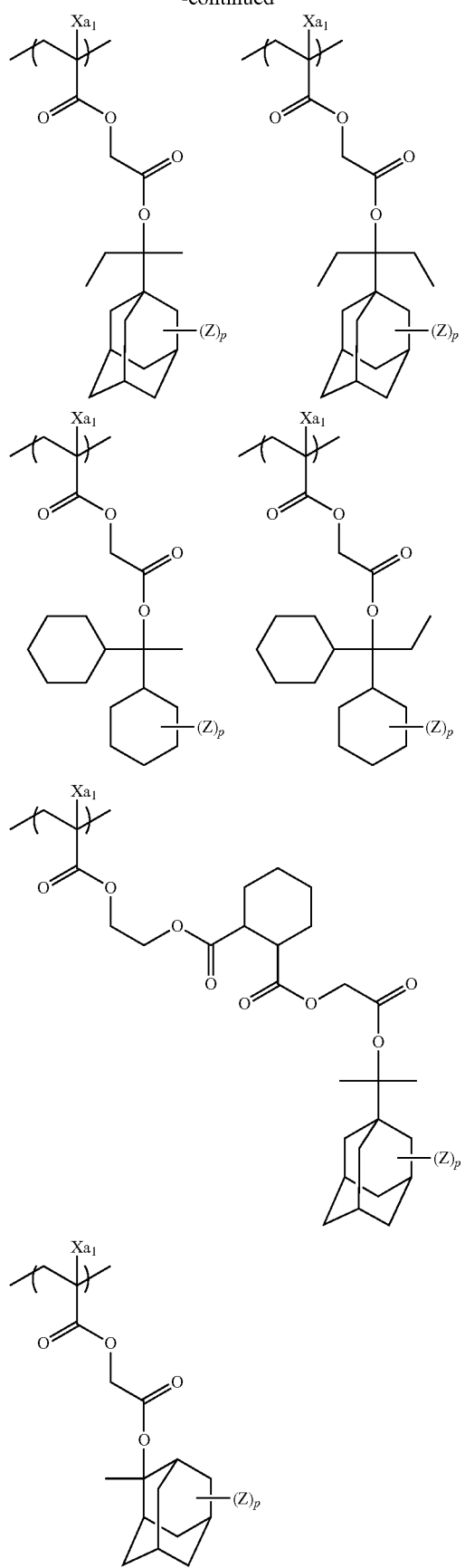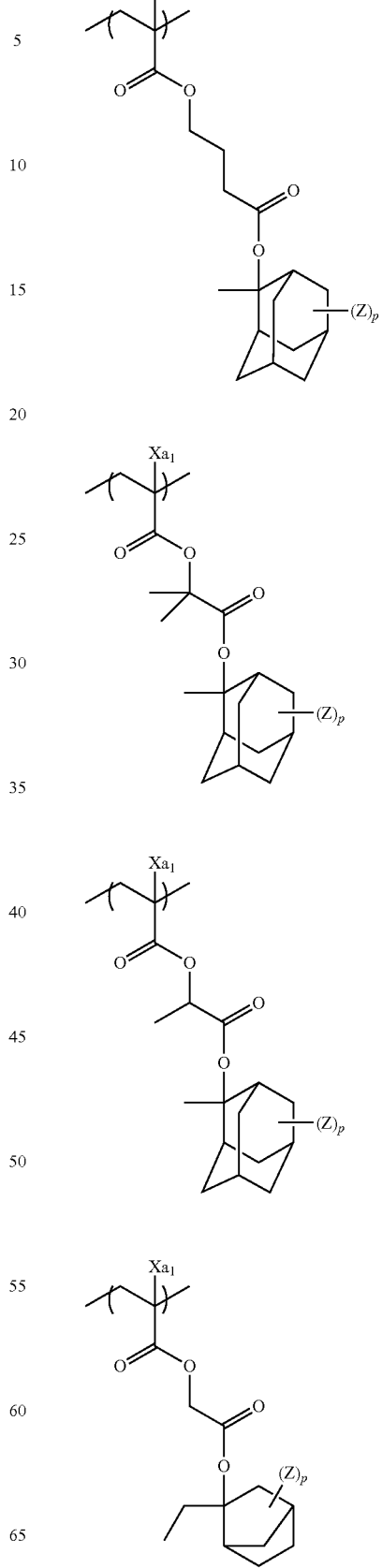

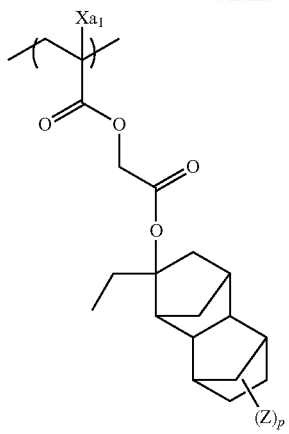

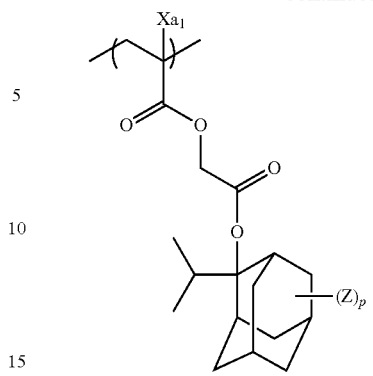

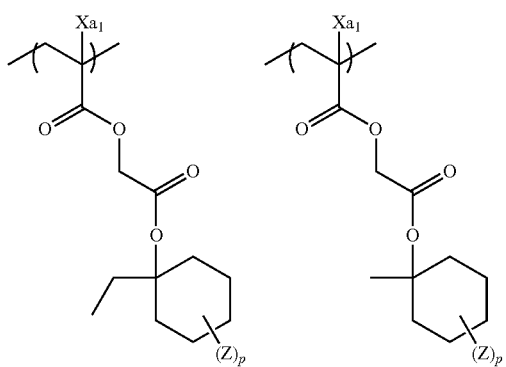

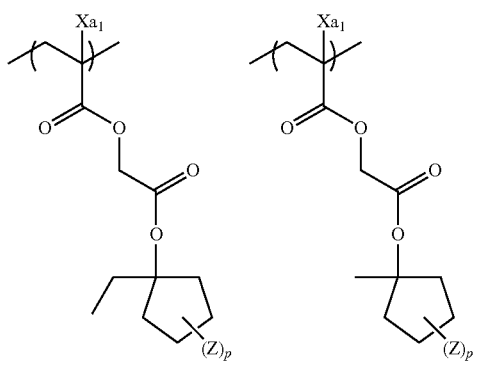

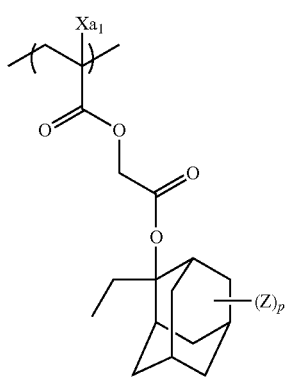

When the resin (A) comprises a plurality of repeating units each containing an acid-decomposable group, or when a plurality of resins (A) comprise repeating units containing acid-decomposable groups different from each other, as preferred combinations of repeating units, there can be mentioned, for example, the following. In the formulae shown below, each of R's independently represents a hydrogen atom or a methyl group.

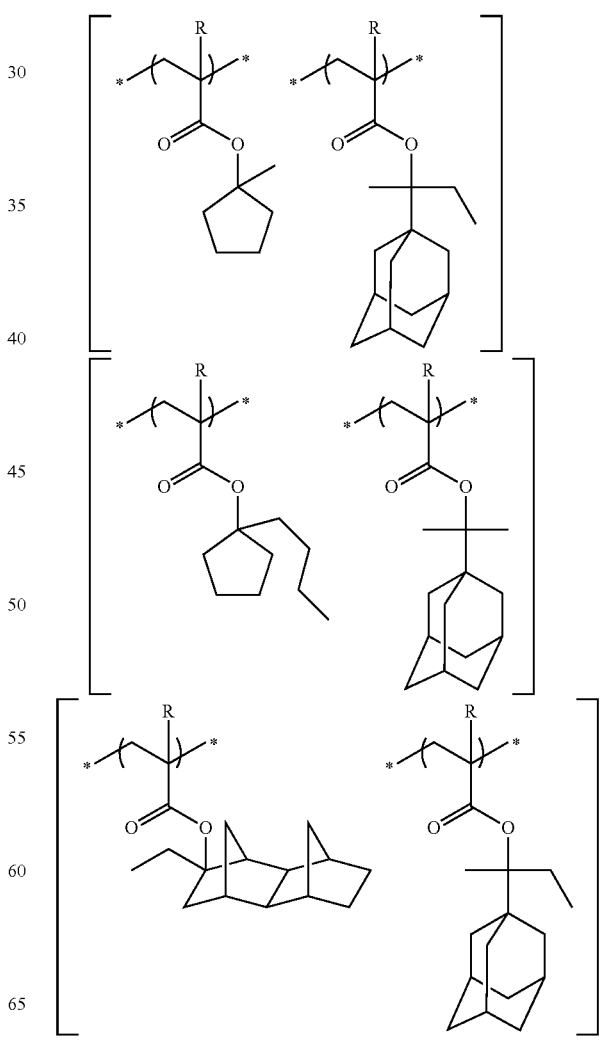

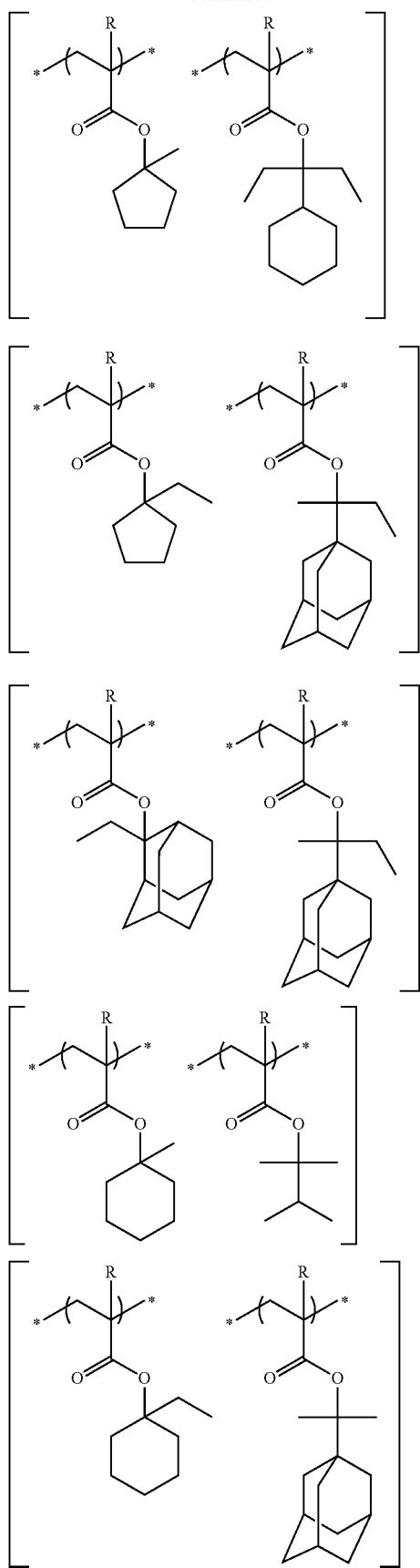
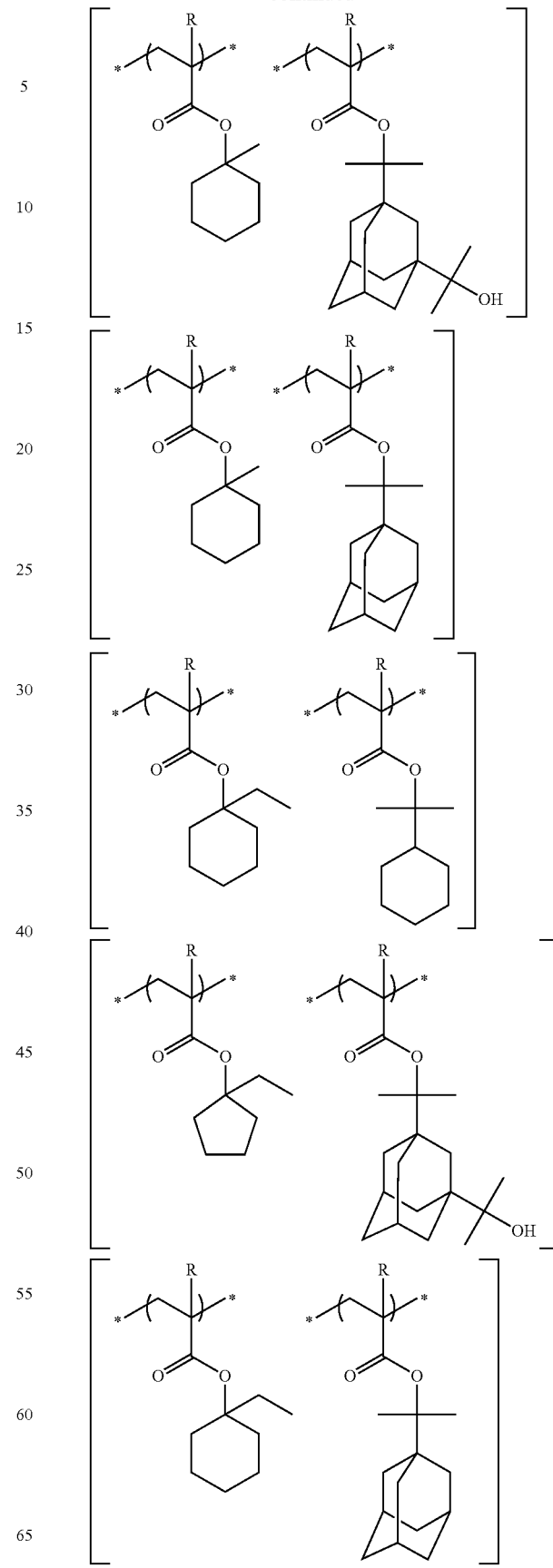

-continued

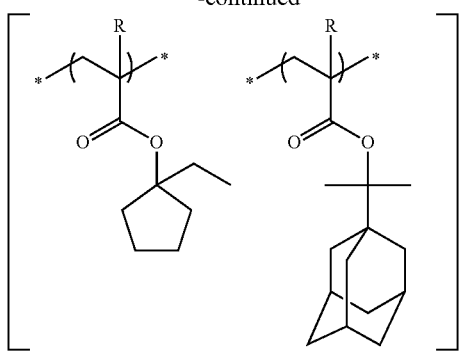

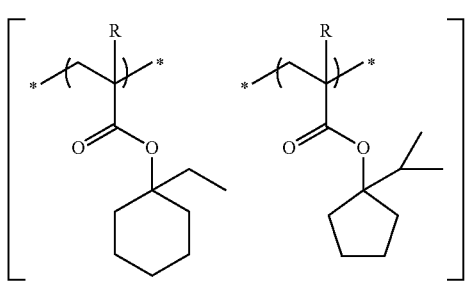

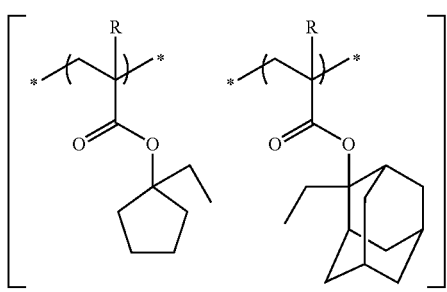

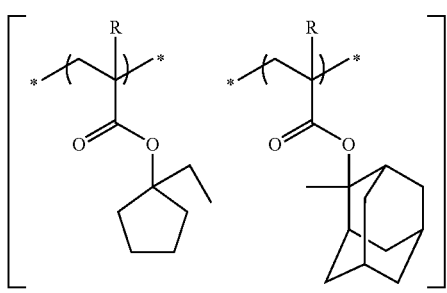

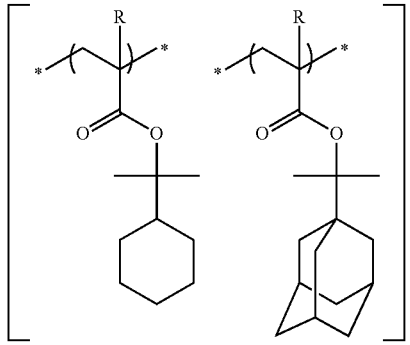

-continued

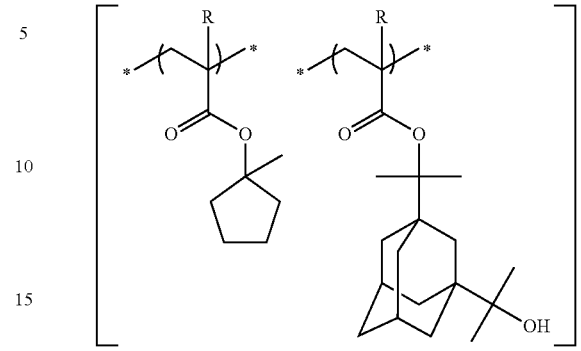

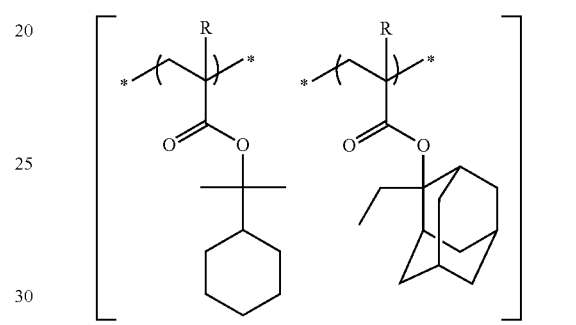

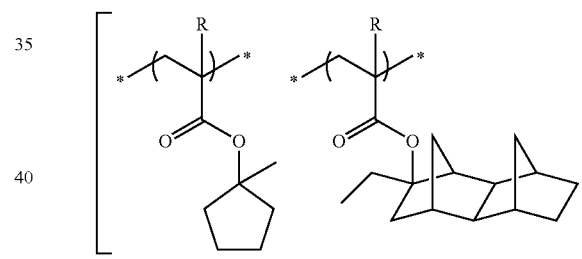

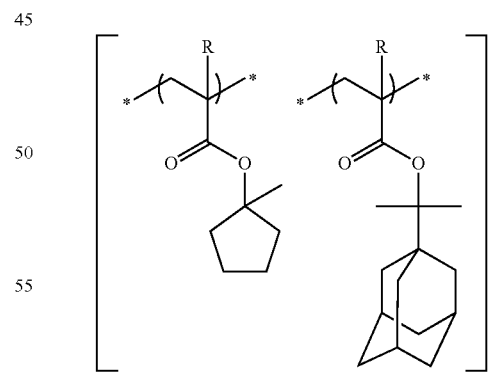

As forms of repeating units other than those shown above by way of example, preferred use is made of the following repeating units that when acted on by an acid, each produce an alcoholic hydroxyl group. The term "alcoholic hydroxyl group" used herein means a nonphenolic hydroxyl group, in particular, a hydroxyl group whose pKa value is in the range of 12 to 20.

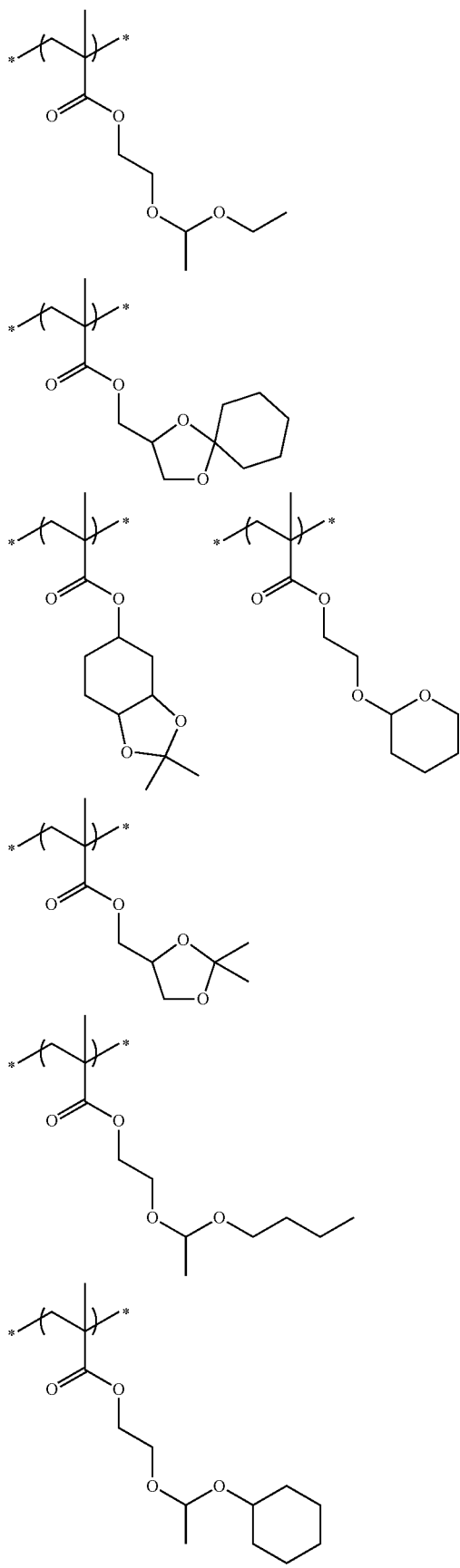
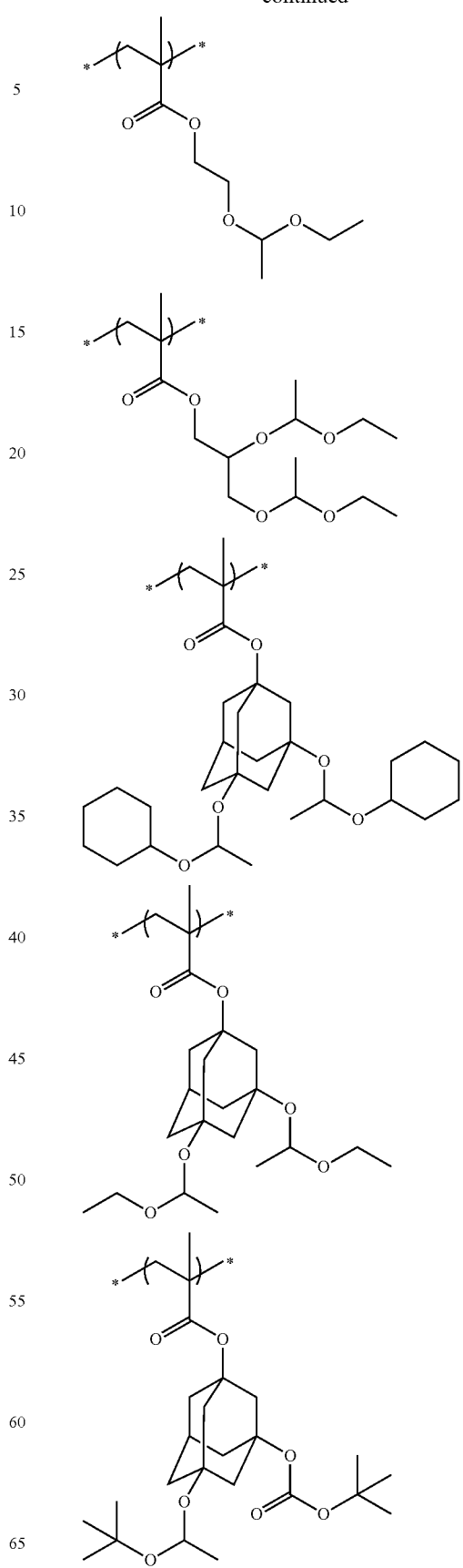

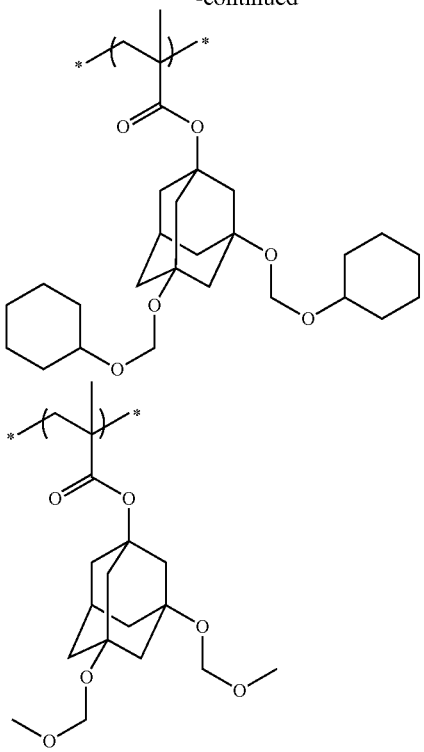

(a2) Repeating Unit Containing an Alcoholic Hydroxyl Group

The resin (A) may comprise, in at least either the principal chain or a side chain thereof, a repeating unit (a2) containing an alcoholic hydroxyl group. An enhancement of the adherence to a substrate can be expected by virtue of the introduction of such a repeating unit. When the resist composition of the present invention contains a crosslinking agent to be described hereinafter, it is preferred for the resin (A) to comprise the repeating unit (a2) containing an alcoholic hydroxyl group. This is because as the alcoholic hydroxyl group functions as a crosslinking group, the hydroxyl group reacts with a crosslinking agent under the action of an acid to thereby promote the insolubilization or solubility drop of the resist film in a developer containing an organic solvent with the result that the effect of enhancing the line width roughness (LWR) performance is exerted.

In the present invention, the alcoholic hydroxyl group is not limited as long as it is a hydroxyl group bonded to a hydrocarbon group and is other than a hydroxyl group (phenolic hydroxyl group) directly bonded onto an aromatic ring. However, in the present invention, it is preferred for the alcoholic hydroxyl group to be other than the hydroxyl group of an aliphatic alcohol substituted at its α-position with an electron withdrawing group, mentioned hereinbefore as an acid group. From the viewpoint of enhancing the efficiency of the reaction with a crosslinking agent (C), it is preferred for the alcoholic hydroxyl group to be a primary alcoholic hydroxyl group (group in which the carbon atom substituted with a hydroxyl group has two hydrogen atoms besides the hydroxyl group) or a secondary alcoholic hydroxyl group in which another electron withdrawing group is not bonded to the carbon atom substituted with a hydroxyl group.

Preferably 1 to 3 alcoholic hydroxyl groups, more preferably 1 or 2 alcoholic hydroxyl groups are introduced in each repeating unit (a2).

As these repeating units, there can be mentioned the repeating units of general formulae (2) and (3).

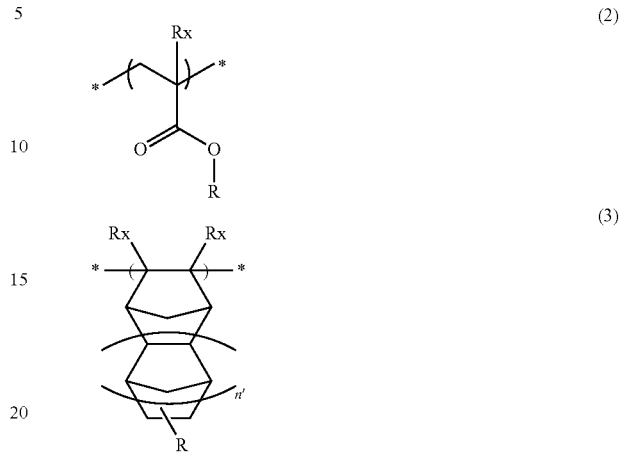

In general formula (2) above, at least either Rx or R represents a structure with an alcoholic hydroxyl group.

In general formula (3), at least any of two Rx's and R represents a structure with an alcoholic hydroxyl group. Two Rx's may be identical to or different from each other.

As the structure with an alcoholic hydroxyl group, there can be mentioned, for example, a hydroxyalkyl group (preferably 2 to 8 carbon atoms, more preferably 2 to 4 carbon atoms), a hydroxycycloalkyl group (preferably 4 to 14 carbon atoms), a cycloalkyl group substituted with a hydroxyalkyl group (preferably 5 to 20 carbon atoms in total), an alkyl group substituted with a hydroxyalkoxy group (preferably 3 to 15 carbon atoms in total), a cycloalkyl group substituted with a hydroxyalkoxy group (preferably 5 to 20 carbon atoms in total) or the like. As mentioned above, a residue of primary alcohol is preferred. The structure —$(CH_2)_n$-OH (n is an integer of 1 or greater, preferably an integer of 2 to 4) is more preferred.

Rx represents a hydrogen atom, a halogen atom, a hydroxyl group, an optionally substituted alkyl group (preferably 1 to 4 carbon atoms) or an optionally substituted cycloalkyl group (preferably 5 to 12 carbon atoms). As preferred substituents that may be introduced in the alkyl group and cycloalkyl group represented by Rx, there can be mentioned a hydroxyl group and a halogen atom. As the halogen atom represented by Rx, there can be mentioned a fluorine atom, a chlorine atom, a bromine atom or an iodine atom. Rx is preferably a hydrogen atom, a methyl group, a hydroxymethyl group, a hydroxyl group or a trifluoromethyl group. A hydrogen atom and a methyl group are especially preferred.

R represents an optionally hydroxylated hydrocarbon group. The hydrocarbon group represented by R is preferably a saturated hydrocarbon group. As such, there can be mentioned an alkyl group (preferably 1 to 8 carbon atoms, more preferably 2 to 4 carbon atoms) or a mono- or polycyclohydrocarbon group (preferably 3 to 20 carbon atoms, for example, an alicyclic group to be described hereinafter). In the formula, n' is an integer of 0 to 2.

The repeating unit (a2) is preferably a repeating unit derived from an ester of acrylic acid in which the principal chain at its α-position (for example, Rx in formula (2)) may be substituted, more preferably a repeating unit derived from a monomer with a structure corresponding to formula (2). Further, containing an alicyclic group in the unit is preferred.

With respect to the alicyclic group, a mono- or polycyclic structure can be considered. A polycyclic structure is preferred from the viewpoint of the resistance to etching.

As the alicyclic groups, there can be mentioned, for example, monocyclic structures, such as cyclobutyl, cyclopentyl, cyclohexyl, cycloheptyl and cyclooctyl, and polycyclic structures, such as norbornyl, isobornyl, tricyclodecanyl, tetracyclododecanyl, hexacycloheptadecanyl, adamantyl, diadamantyl, spirodecanyl and spiroundecanyl. Of these, adamantyl, diadamantyl and norbornyl structures are preferred.

Examples of the repeating units (a2) are shown below, which however in no way limit the scope of the present invention. In the examples, Rx represents a hydrogen atom or a methyl group.

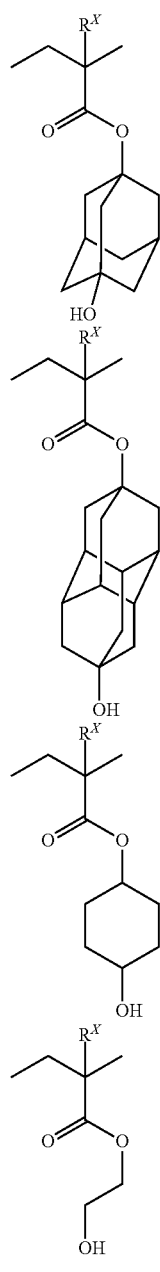
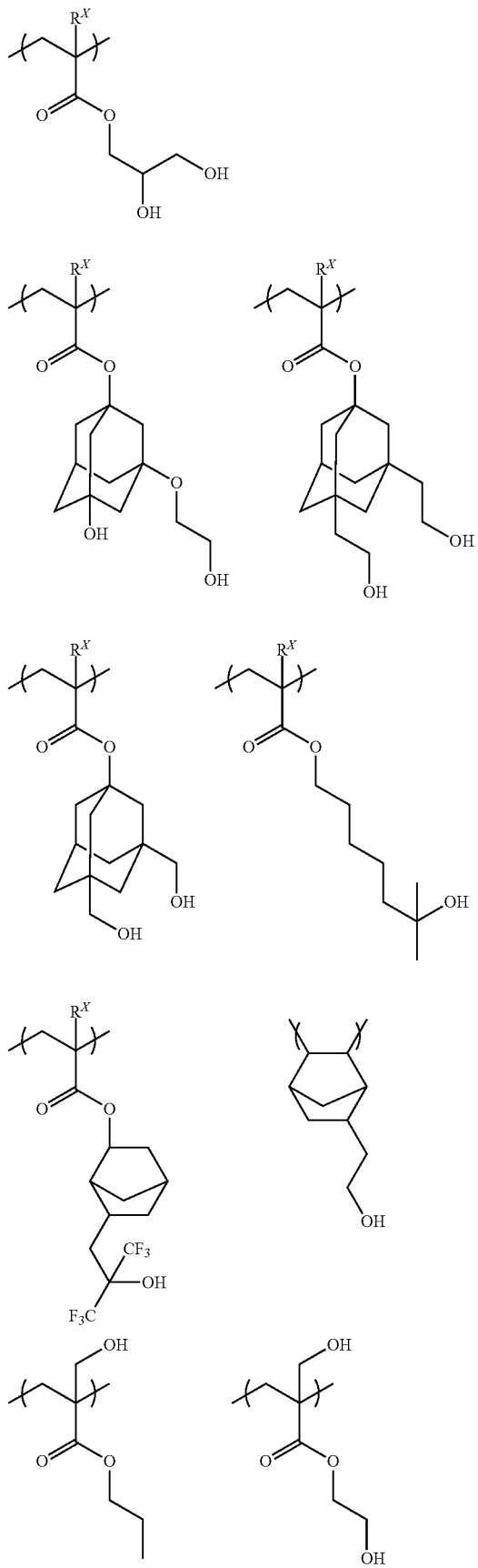

-continued

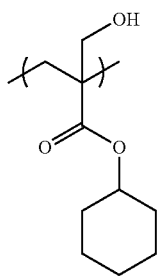
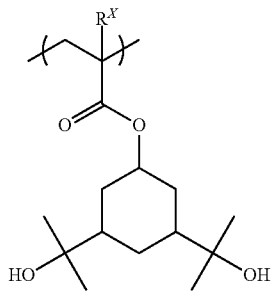
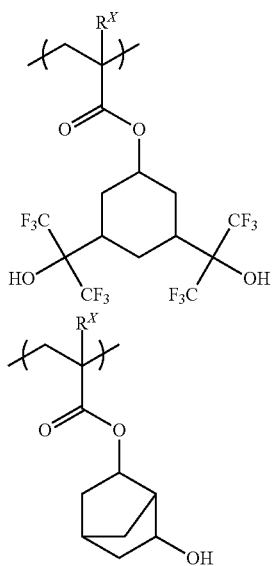
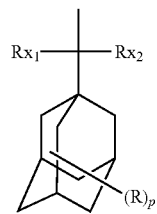

The repeating unit (a2) may have a structure in which at least one of the above-mentioned repeating unit (a1) and repeating units (a3) and (a4) to be described hereinafter contains an alcoholic hydroxyl group. For example, the repeating unit (a2) may have a structure in which in the above-mentioned repeating unit (a1) containing an acid-decomposable group, the moiety cleaved under the action of an acid contains an alcoholic hydroxyl group. It is presumed that the efficiency of crosslinking can be optimized by containing such a repeating unit. As this structure, there can be mentioned, for example, a structure in which in the above general formula (A1), the moiety of atomic group —C(Rx$_1$)(Rx$_2$)(Rx$_3$) contains a hydroxyl group. More particularly, there can be mentioned, for example, the structures of the repeating units of general formula (AI) in which the moiety of atomic group —C(Rx$_1$)(Rx$_2$)(Rx$_3$) is expressed by the formula below wherein R represents a hydroxyl group, a hydroxylated linear or branched alkyl group or a hydroxylated cycloalkyl group and p is an integer of 1 or greater.

(a3) Repeating Unit Containing a Nonpolar Group

It is preferred for the resin (A) to further comprise a repeating unit (a3) containing a nonpolar group. By introducing this repeating unit, not only can leaching of low-molecular components from the resist film into an immersion liquid in the stage of liquid-immersion exposure be reduced but also the solubility of the resin in the stage of development with a developer containing an organic solvent can be appropriately regulated. It is preferred for the repeating unit (a3) containing a nonpolar group to be a repeating unit in which no polar group (for example, the above-mentioned acid group, a hydroxyl group, a cyano group or the like) is contained. It is also preferred for the repeating unit (a3) to be a repeating unit containing neither the acid-decomposable group mentioned above nor the lactone structure to be described hereinafter. As these repeating units, there can be mentioned the repeating units of general formulae (4) and (5) below.

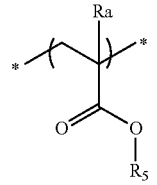

(4)

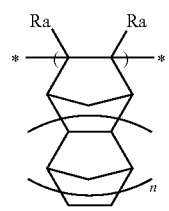

(5)

In the general formulae,

R$_5$ represents a hydrocarbon group having neither a hydroxyl group nor a cyano group.

Ra, or each of Ra's independently, represents a hydrogen atom, a hydroxyl group, a halogen atom or an alkyl group (preferably 1 to 4 carbon atoms). A substituent may be introduced in the alkyl group represented by Ra, and as the substituent, there can be mentioned a hydroxyl group or a halogen atom. As the halogen atom represented by Ra, there can be mentioned a fluorine atom, a chlorine atom, a bromine atom or an iodine atom. Ra is preferably a hydrogen atom, a methyl group, a trifluoromethyl group or a hydroxymethyl group. A hydrogen atom and a methyl group are most preferred.

In the formula, n is an integer of 0 to 2.

It is preferred for R$_5$ to have at least one cyclic structure.

The hydrocarbon groups represented by $R_5$ include, for example, linear and branched hydrocarbon groups, monocyclohydrocarbon groups and polycyclohydrocarbon groups. From the viewpoint of the resistance to dry etching, it is preferred for $R_5$ to include monocyclohydrocarbon groups and polycyclohydrocarbon groups, especially polycyclohydrocarbon groups.

$R_5$ preferably represents any of the groups of formula: -$L_4$-$A_4$-($R_4$) $L_4$ represents a single bond or a bivalent hydrocarbon group, being preferably a single bond, an alkylene group (preferably 1 to 3 carbon atoms) or a cycloalkylene group (preferably 5 to 7 carbon atoms). More preferably, $L_4$ represents a single bond. $A_4$ represents a (n4+1)-valent hydrocarbon group (preferably 3 to 30 carbon atoms, more preferably 3 to 14 carbon atoms and further more preferably 6 to 12 carbon atoms), preferably an alicyclic hydrocarbon group of a single ring or multiple rings. In the formula, n4 is an integer of 0 to 5, preferably an integer of 0 to 3. $R_4$ represents a hydrocarbon group, being preferably an alkyl group (preferably 1 to 3 carbon atoms) or a cycloalkyl group (preferably 5 to 7 carbon atoms).

As the linear or branched hydrocarbon group, there can be mentioned, for example, an alkyl group having 3 to 12 carbon atoms. As the monocyclic hydrocarbon group, there can be mentioned, for example, a cycloalkyl group having 3 to 12 carbon atoms, a cycloalkenyl group having 3 to 12 carbon atoms or a phenyl group. Preferably, the monocyclic hydrocarbon group is a monocyclic saturated hydrocarbon group having 3 to 7 carbon atoms.

The polycyclic hydrocarbon groups include ring-assembly hydrocarbon groups (for example, a bicyclohexyl group) and crosslinked-ring hydrocarbon groups. As the crosslinked-ring hydrocarbon groups, there can be mentioned, for example, a bicyclic hydrocarbon group, a tricyclic hydrocarbon group and a tetracyclic hydrocarbon group. Further, the crosslinked-ring hydrocarbon groups include condensed-ring hydrocarbon groups (for example, groups each resulting from condensation of a plurality of 5- to 8-membered cycloalkane rings). As preferred crosslinked-ring hydrocarbon groups, there can be mentioned a norbornyl group and an adamantyl group.

A substituent may further be introduced in each of these groups. As a preferred substituent, there can be mentioned a halogen atom, an alkyl group or the like. As a preferred halogen atom, there can be mentioned a bromine atom, a chlorine atom or a fluorine atom. As a preferred alkyl group, there can be mentioned a methyl, an ethyl, a butyl or a t-butyl group. Still further, a substituent may be introduced in this alkyl group. As the substituent that may still further be introduced, there can be mentioned a halogen atom or an alkyl group.

Particular examples of the repeating units each containing a nonpolar group are shown below, which in no way limit the scope of the present invention. In the formulae, Ra represents a hydrogen atom, a hydroxyl group, a halogen atom or an optionally substituted alkyl group having 1 to 4 carbon atoms. As preferred substituents that may be introduced in the alkyl group represented by Ra, there can be mentioned a hydroxyl group and a halogen atom. As the halogen atom represented by Ra, there can be mentioned a fluorine atom, a chlorine atom, a bromine atom or an iodine atom. Ra is preferably a hydrogen atom, a methyl group, a hydroxymethyl group or a trifluoromethyl group. A hydrogen atom and a methyl group are especially preferred.

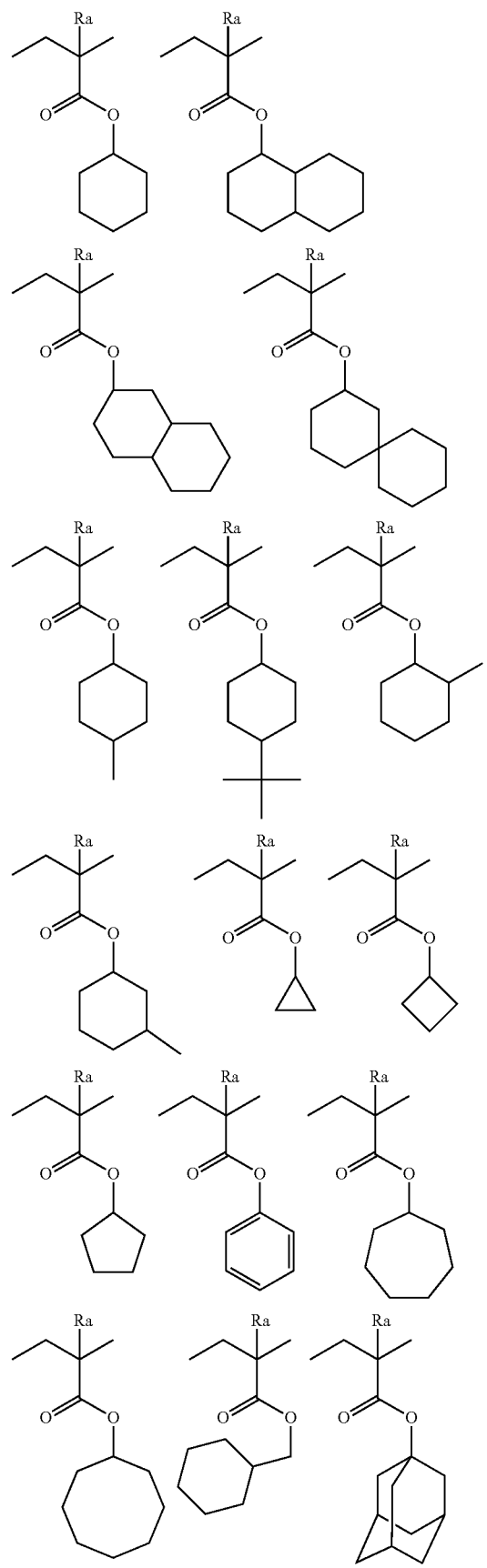

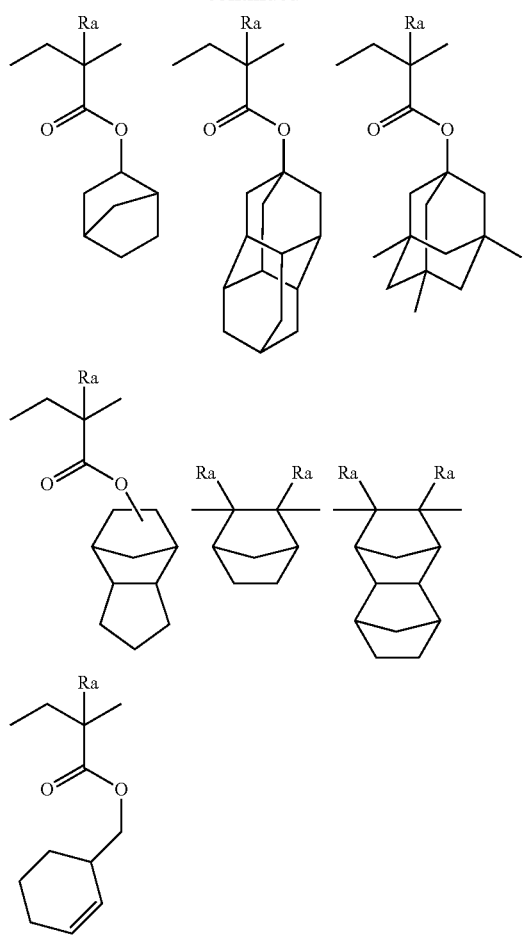

(a4) Repeating Unit Containing a Lactone Structure

The resin (A) may have a repeating unit containing a lactone structure.

Any lactone groups can be employed as long as a lactone structure is possessed therein. However, lactone structures of a 5 to 7-membered ring are preferred, and in particular, those resulting from condensation of lactone structures of a 5 to 7-membered ring with other cyclic structures effected in a fashion to form a bicyclo structure or spiro structure are preferred. The possession of repeating units having a lactone structure represented by any of the following general formulae (LC1-1) to (LC1-17) is more preferred. The lactone structures may be directly bonded to the principal chain of the resin. Preferred lactone structures are those of formulae (LC1-1), (LC1-4), (LC1-5), (LC1-6), (LC1-13), (LC1-14) and (LC1-17). The use of these specified lactone structures would ensure improvement in the LWR and development defect.

LC1-1

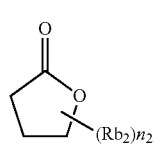

LC1-2

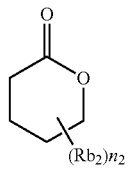

LC1-3

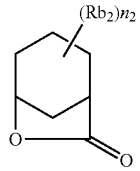

LC1-4

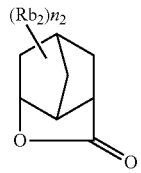

LC1-5

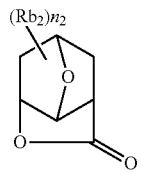

LC1-6

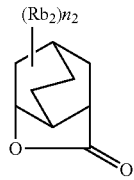

LC1-7

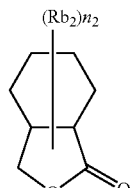

LC1-8

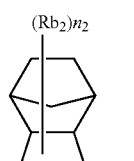

LC1-9

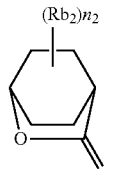

LC1-10
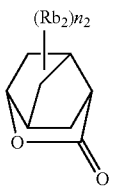

LC1-11
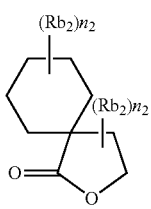

LC1-12
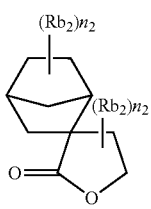

LC1-13
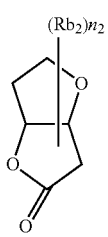

LC1-14
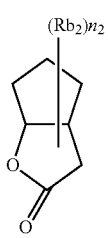

LC1-15
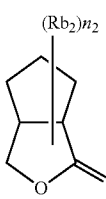

LC1-16
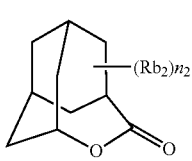

LC1-17
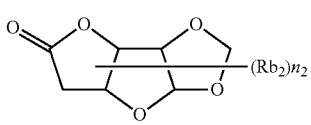

The presence of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. Of these, an alkyl group having 1 to 4 carbon atoms, a cyano group and an acid-decomposable group are more preferred. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded to each other to thereby form a ring.

The repeating unit having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90% or higher, more preferably 95% or higher.

As the repeating unit having a lactone structure, it is preferred for the resin (A) to contain any of the repeating units represented by general formula (III) below.

(III)

In formula (III),

A represents an ester bond (—COO—) or an amido bond (—CONH—).

Ro, each independently in the presence of two or more groups, represents an alkylene group, a cycloalkylene group or a combination thereof.

Z, each independently in the presence of two or more groups, represents an ether bond, an ester bond, an amido bond, a urethane bond (a group represented by —O—C(O)—N(R)— or —N(R)—C(O)—O—), or a urea bond (a group represented by —N(R)—C(O)—N(R)—).

Each of Rs independently represents a hydrogen atom, an alkyl group, cycloalkyl group or an aryl group.

$R_8$ represents a monovalent organic group with a lactone structure.

n represents the number of repetitions of the structure of the formula —$R_0$—Z— and is an integer of 0 to 5. n preferably represents 0 or 1.

$R_7$ represents a hydrogen atom, a halogen atom or an optionally substituted alkyl group.

Each of the alkylene group and cycloalkylene group represented by R₀ may have a substituent.

Z preferably represents an ether bond or an ester bond, most preferably an ester bond.

The alkyl group represented by R₇ is preferably an alkyl group having 1 to 4 carbon atoms, more preferably a methyl group or an ethyl group and most preferably a methyl group. As the substituent of the alkyl group, there can be mentioned, for example, a hydroxyl group, a halogen atom and the like.

Each of the alkylene group and cycloalkylene group represented by R₀ and the alkylene group represented by R₇ may have a substituent. As the substituent, there can be mentioned, for example, a halogen atom such as a fluorine atom, a chlorine atom or a bromine atom, a mercapto group, a hydroxyl group, an alkoxy group such as a methoxy group, an ethoxy group, an isopropoxy group, a t-butoxy group or a benzyloxy group, an acyloxy group such as an acetyloxy group or a propionyloxy group and the like.

R₇ preferably represents a hydrogen atom, a methyl group, a trifluoromethyl group or a hydroxymethyl group.

The alkylene group represented by R₀ is preferably a chain alkylene group having 1 to 10 carbon atoms, more preferably 1 to 5 carbon atoms, for example, a methylene group, an ethylene group, a propylene group or the like. The cycloalkylene group is preferably a cycloalkylene group having 3 to 20 carbon atoms. As such, there can be mentioned, for example, cyclohexylene, cyclopentylene, norbornylene, adamantylene or the like. The chain alkylene groups are preferred from the viewpoint of the exertion of the effect of the present invention. A methylene group is most preferred.

The monovalent organic group with a lactone structure represented by R₈ is not limited as long as the lactone structure is contained. As particular examples thereof, there can be mentioned the lactone structures of the above general formulae (LC1-1) to (LC1-17). Of these, the structures of general formula (LC1-4) are most preferred. In general formulae (LC1-1) to (LC1-17), n₂ is more preferably 2 or less.

R₈ preferably represents a monovalent organic group with an unsubstituted lactone structure or a monovalent organic group with a lactone structure substituted with a methyl group, a cyano group or an alkoxycarbonyl group. More preferably, R₈ represents a monovalent organic group with a lactone structure substituted with a cyano group (cyanolactone).

Specific examples of the repeating units having a lactone structure will be shown below, which however in no way limit the scope of the present invention.

In the following specific examples, Rx represents H, CH₃, CH₂OH or CF₃.

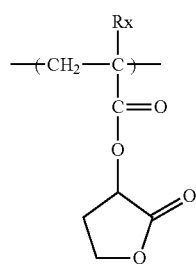 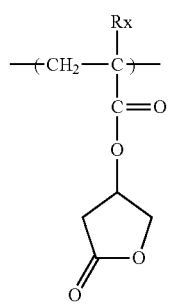 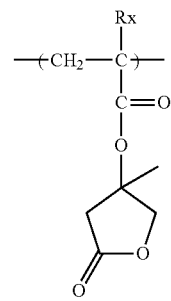 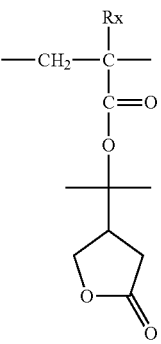

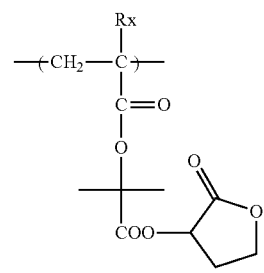 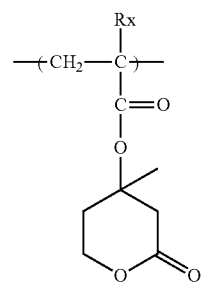

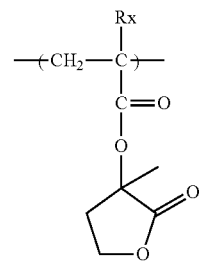 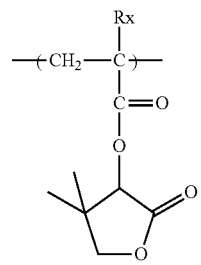

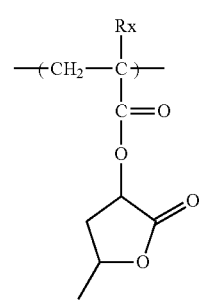 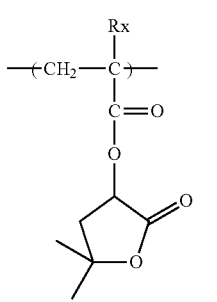

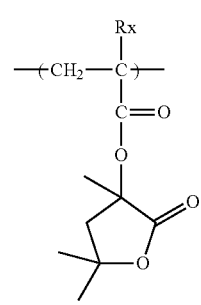 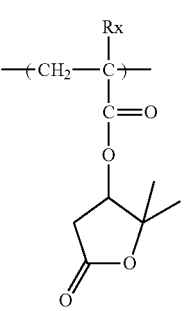

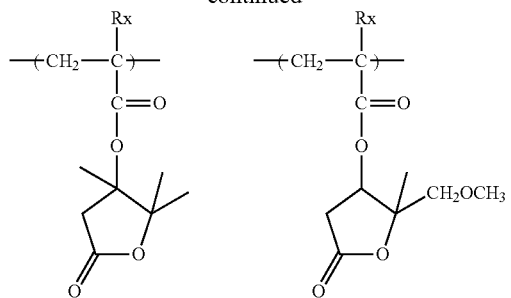
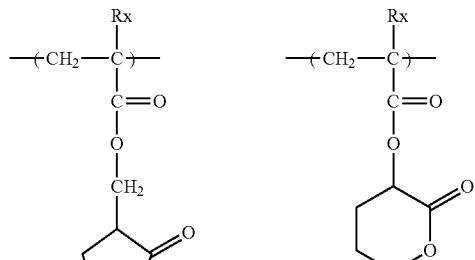
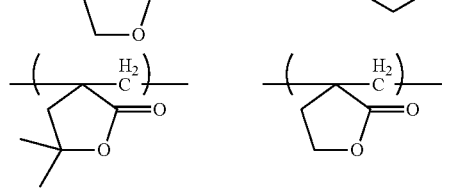
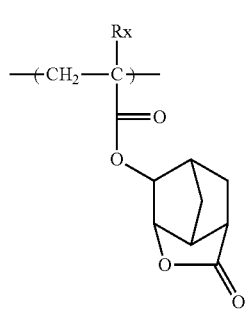
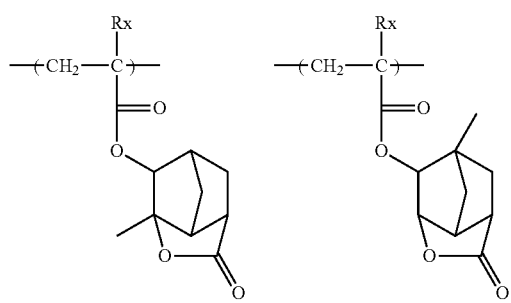
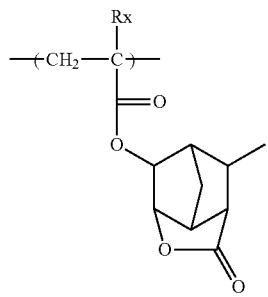
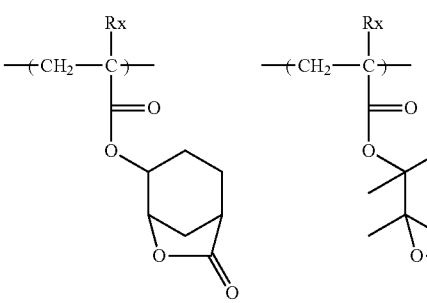
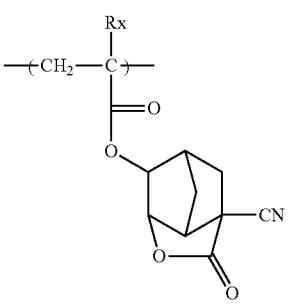
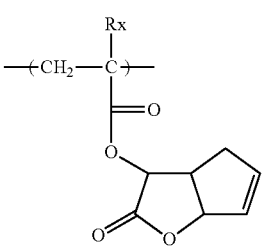
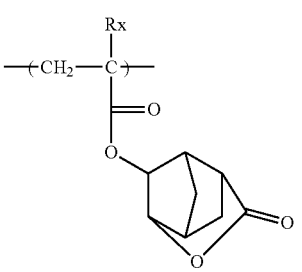
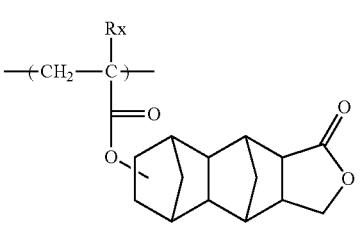
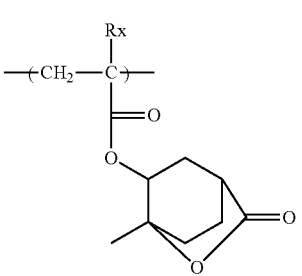

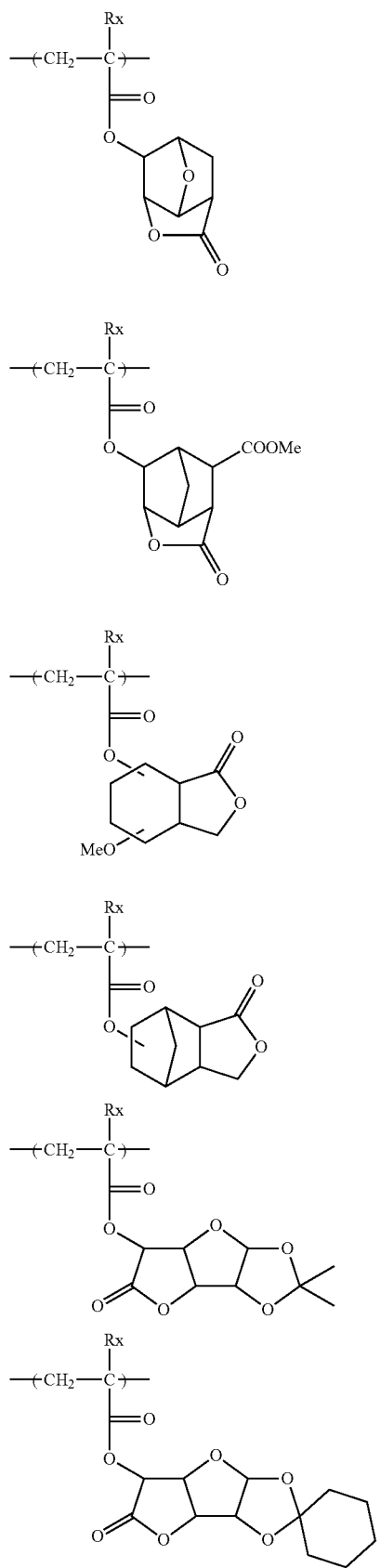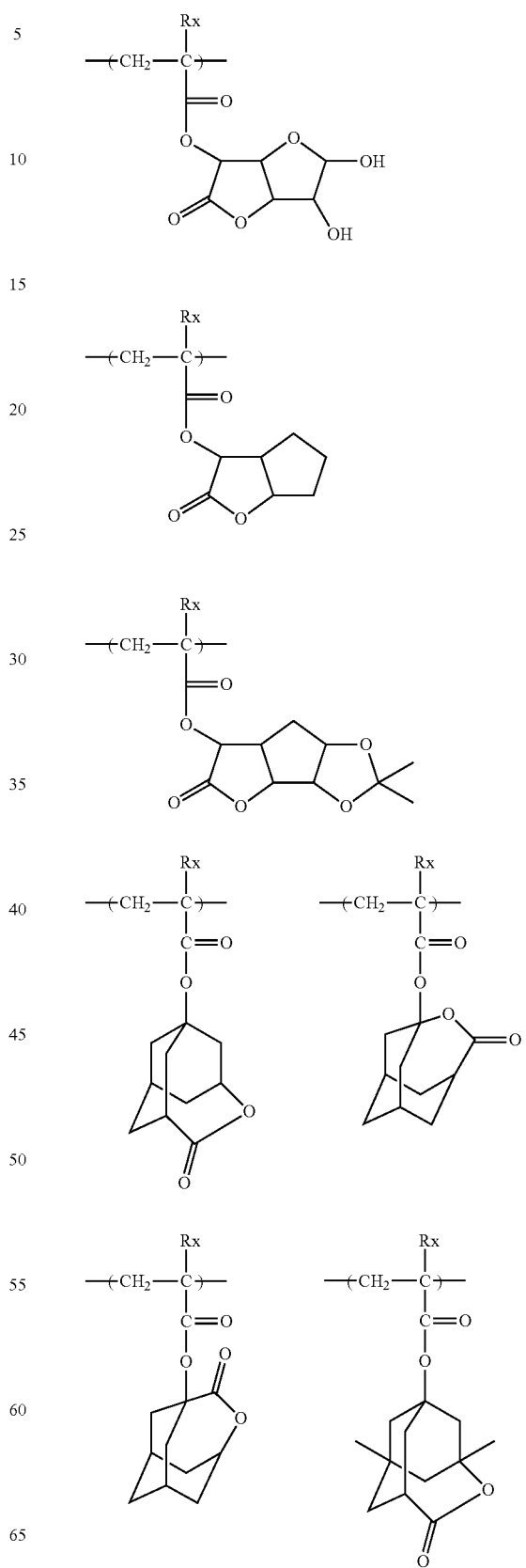

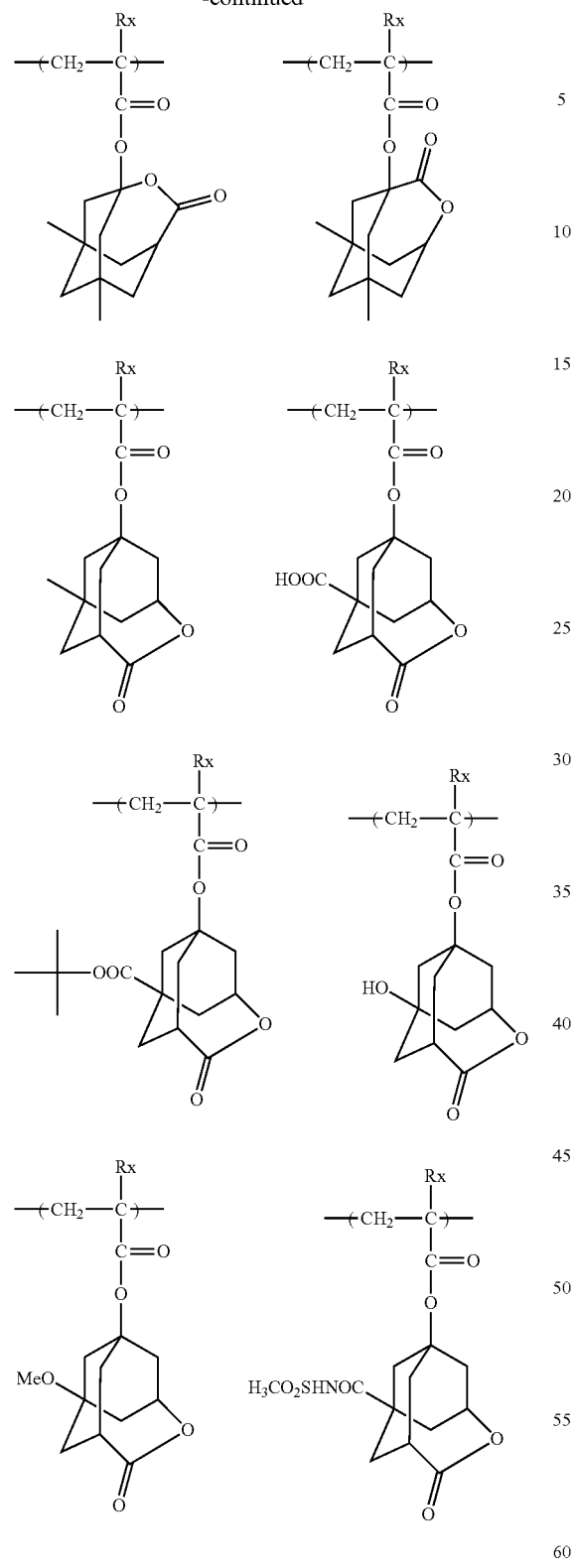
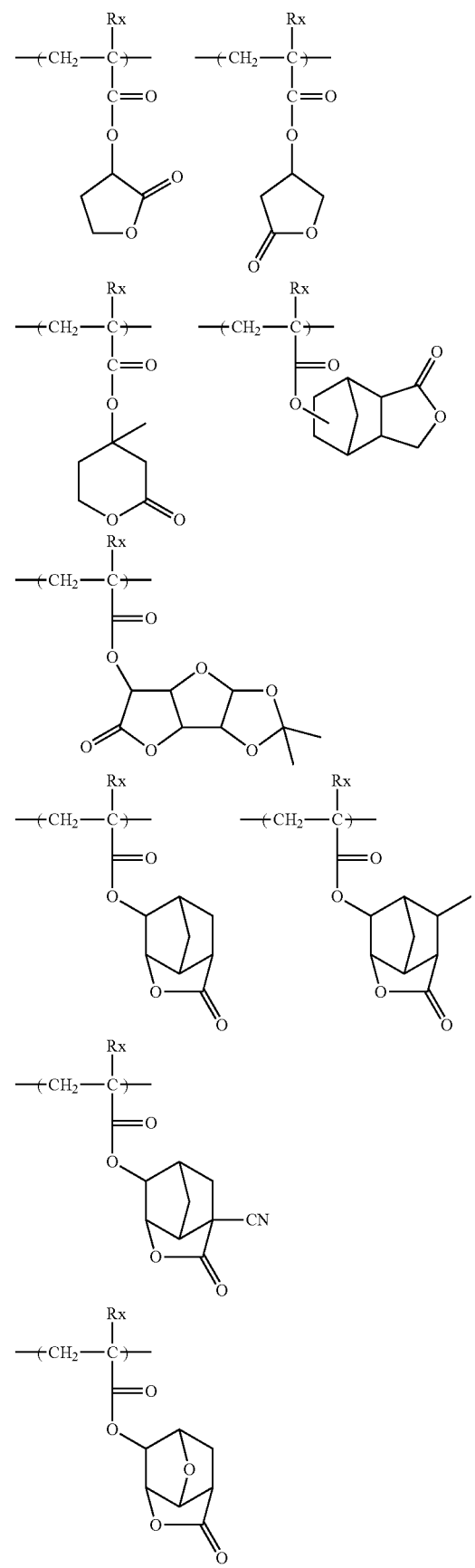
The repeating units having an especially preferred lactone structure will be shown below. An improvement in pattern profile and iso-dense bias can be attained by selection of the most appropriate lactone structure.
In the following formulae, Rx represents H, CH$_3$, CH$_2$OH or CF$_3$.

-continued
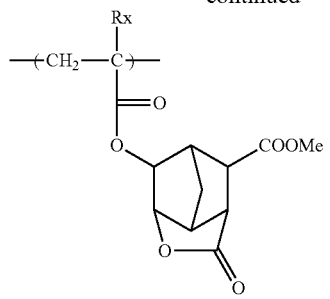
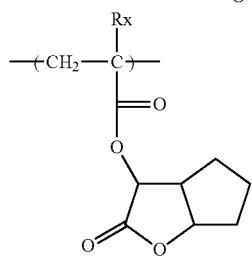
In the following specific examples, R represents a hydrogen atom, an optionally substituted alkyl group or a halogen atom. Preferably, R represents a hydrogen atom, a methyl group, a hydroxymethyl group or a trifluoromethyl group.
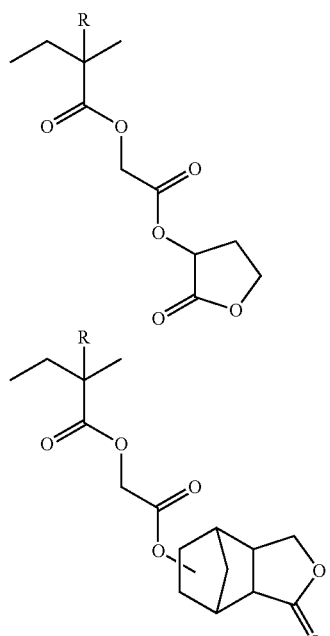
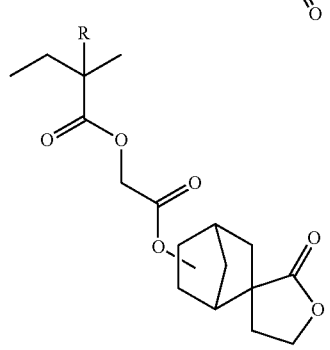
-continued
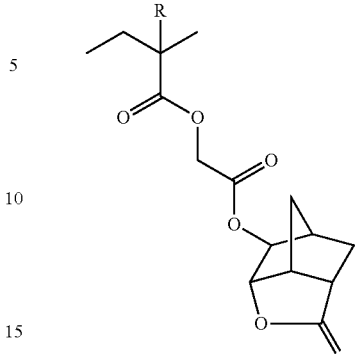
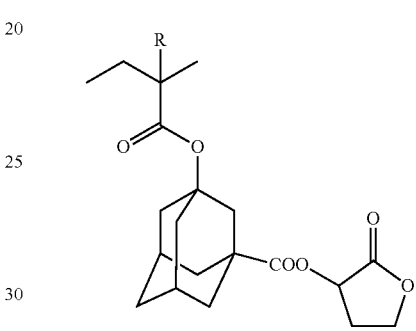
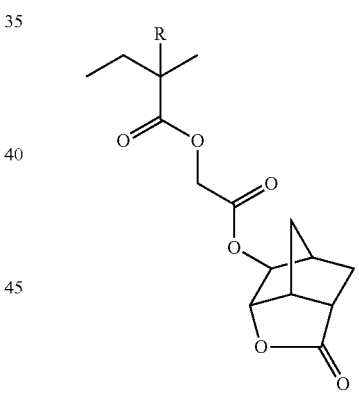
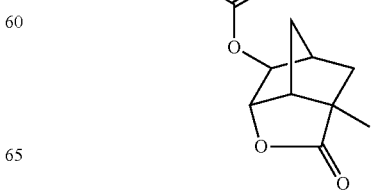

53
-continued
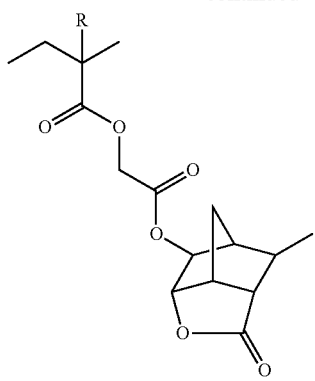
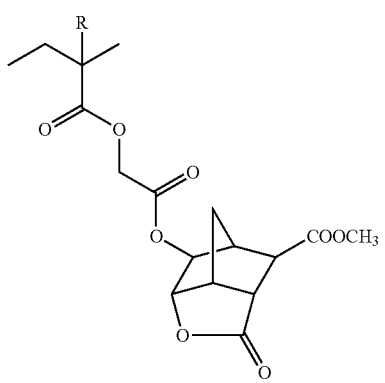
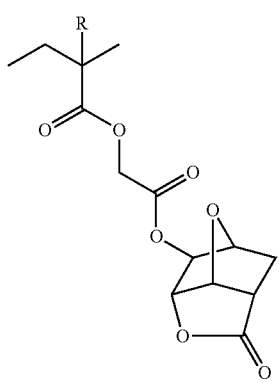
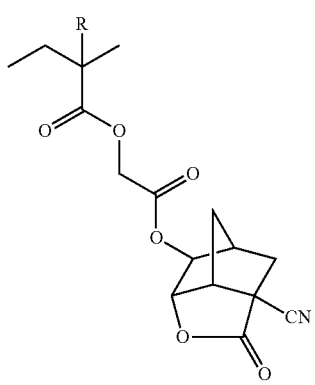
54
-continued
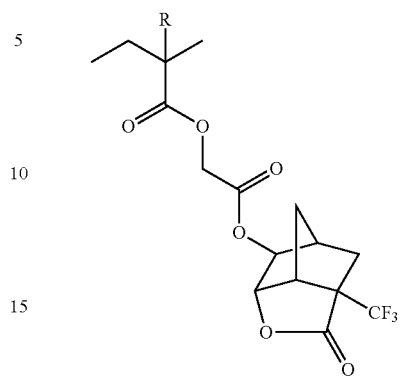
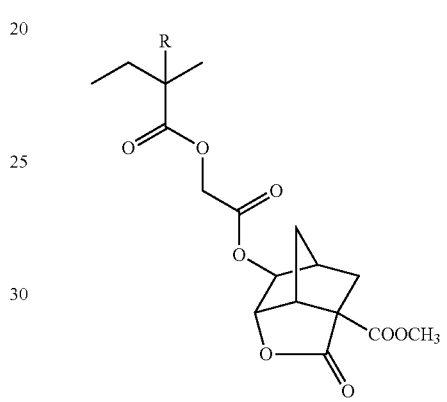
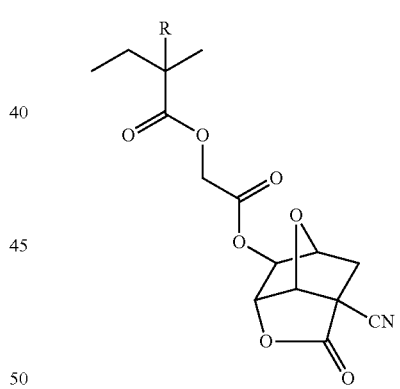
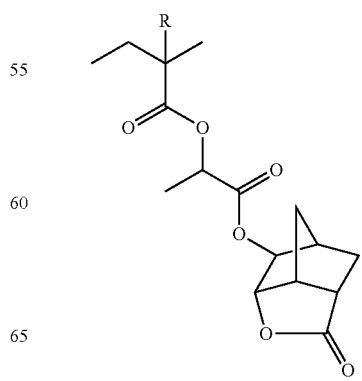

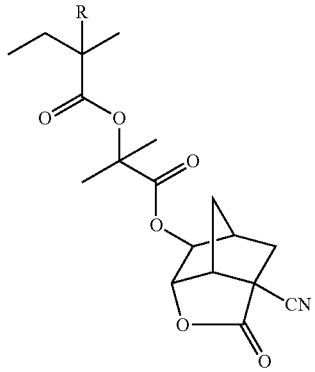
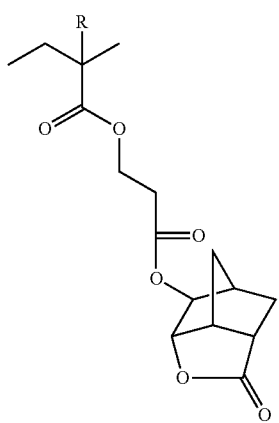
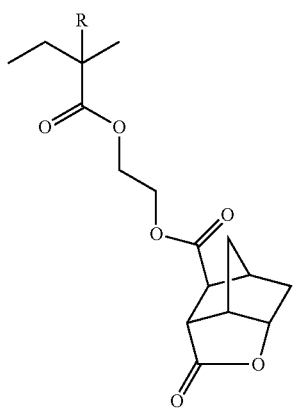
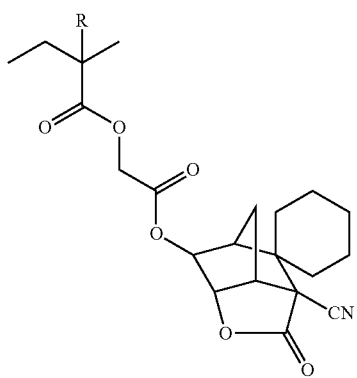
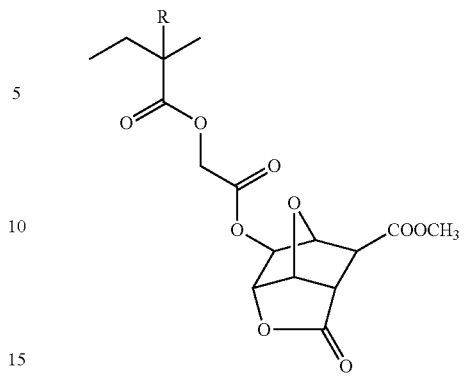
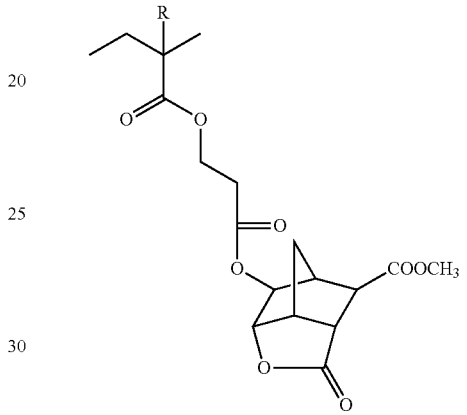
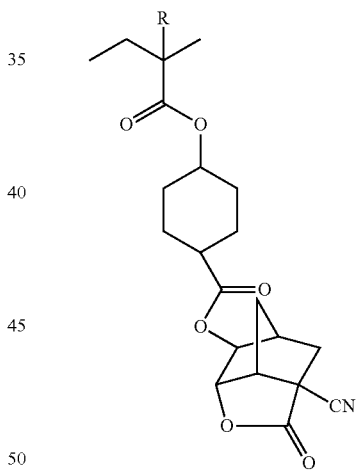
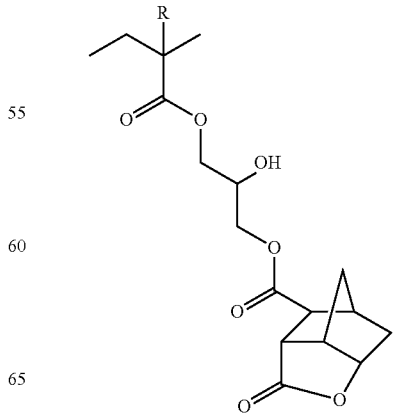

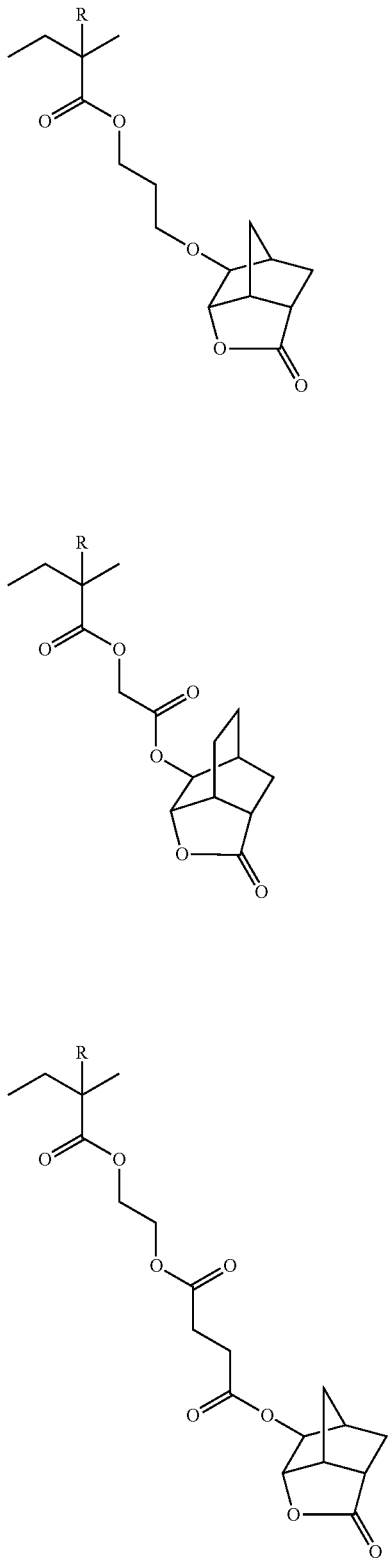
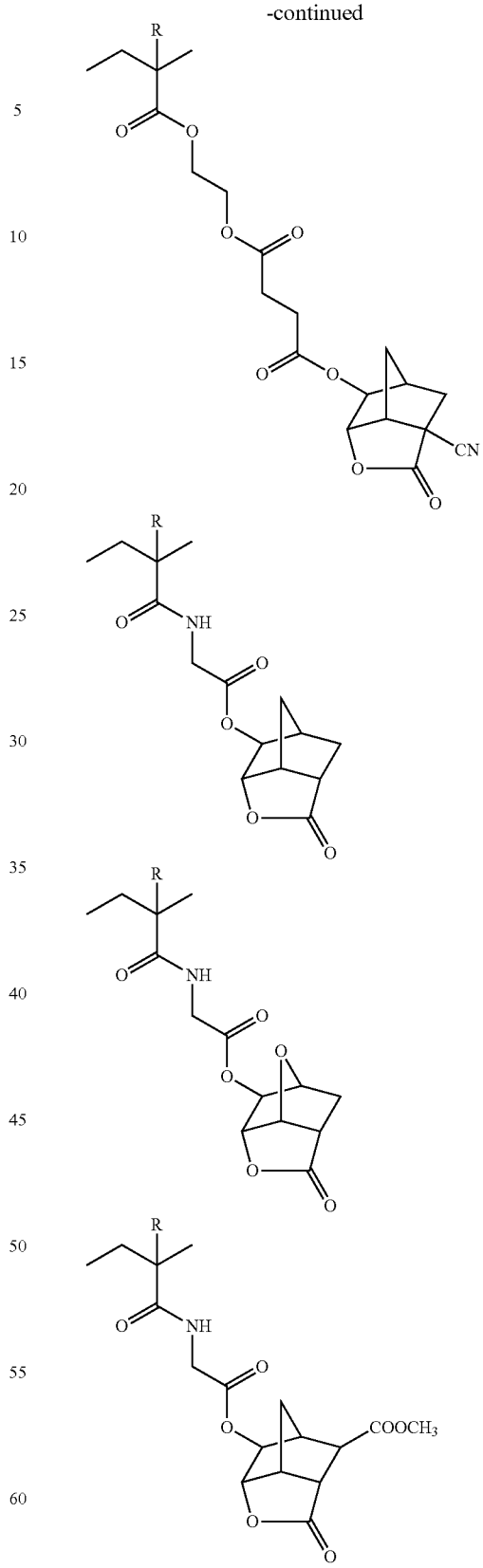
Two or more types of lactone repeating units can be simultaneously employed in order to enhance the effects of the present invention.

Resin (A) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

Resin (A) may be a resin composed of a mixture of two or more different resins. For example, a resin composed of a mixture of a resin comprising a repeating unit (a2) and a resin comprising a repeating unit (a3) can be used in order to regulate the dry etching resistance, standard developer adaptability, adherence to substrates, resist profile and generally required properties for the resist, such as resolving power, heat resistance, sensitivity and the like.

Also, preferred use is made of a resin composed of a mixture of a resin comprising a repeating unit (a1) and a resin in which no repeating unit (a1) is contained.

When the composition of the present invention is used in ArF exposure, it is preferred for the resin (A) contained in the composition of the present invention to contain substantially no aromatic group (in particular, the ratio of the repeating unit containing an aromatic group in the resin is preferably up to 5 mol %, more preferably up to 3 mol % and ideally 0 mol %, namely containing no aromatic group) from the viewpoint of transparency to ArF light. It is preferred for the resin (A) to have an alicyclic hydrocarbon structure of a single ring or multiple rings.

Further, it is preferred for the resin (A) to contain neither a fluorine atom nor a silicon atom from the viewpoint of the compatibility with hydrophobic resins to be described hereinafter.

In the present invention, the contents of individual repeating units are as follows. A plurality of different repeating units may be contained. When a plurality of different repeating units are contained, the following content refers to the total amount thereof.

The content of repeating unit (a1) containing an acid-decomposable group, based on all the repeating units constructing the resin (A), is preferably in the range of 20 to 70 mol %, more preferably 30 to 60 mol %.

When the resin (A) contains a repeating unit (a2) containing an alcoholic hydroxyl group, the content thereof based on all the repeating units constructing the resin (A) is generally in the range of 10 to 80 mol %, preferably 10 to 60 mol %.

When the resin (A) contains a repeating unit (a3) containing a nonpolar group, the content thereof based on all the repeating units constructing the resin (A) is generally in the range of 20 to 80 mol %, preferably 30 to 60 mol %.

When the resin (A) contains a repeating unit (a4) containing a lactone, the content thereof based on all the repeating units of the resin (A) is preferably in the range of 15 to 60 mol %, more preferably 20 to 50 mol % and further more preferably 30 to 50 mol %.

The molar ratio of individual repeating units contained in the resin (A) can be appropriately set for regulating the resist resistance to dry etching, developer adaptability, adherence to substrates, resist profile, generally required properties for resists, such as resolving power, heat resistance and sensitivity, and the like.

Resin (A) can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As for detailed synthesis/purification methods, reference can be made to the methods described above with respect to the main resins of the resist, the description of Chapter 2 "Polymer Synthesis" of "5-th Edition Experimental Chemistry Course 26 Polymer Chemistry" issued by Maruzen Co., Ltd., etc.

The weight average molecular weight of resin (A) in terms of polystyrene molecular weight as measured by GPC is preferably in the range of 1000 to 200,000, more preferably 2000 to 20,000, still more preferably 3000 to 15,000 and further preferably 5000 to 13,000. The regulation of the weight average molecular weight to 1000 to 200,000 would prevent deteriorations of heat resistance and dry etching resistance and also prevent deterioration of developability and increase of viscosity leading to poor film forming property.

Use is made of the resin whose dispersity (molecular weight distribution) is generally in the range of 1 to 3, preferably 1 to 2.6, more preferably 1 to 2 and most preferably 1.4 to 1.7. The lower the molecular weight distribution, the more excellent the resolving power and resist profile and the smoother the side wall of the resist pattern to thereby attain an excellence in roughness.

In the present invention, the content ratio of resin (A) based on the total solid content of the whole composition is preferably in the range of 65 to 97 mass %, more preferably 75 to 95 mass %.

In the present invention, the resins (A) may be used either individually or in combination.

[3-2] Compound (B) that when Exposed to Actinic Rays or Radiation, Generates an Acid.

The composition of the present invention contains a compound that when exposed to actinic rays or radiation, generates an acid (hereinafter referred to as an "acid generator").

As the acid generator, use can be made of a member appropriately selected from among a photoinitiator for photocationic polymerization, a photoinitiator for photoradical polymerization, a photo-achromatic agent and photo-discoloring agent for dyes, any of generally known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

As preferred compounds among the acid generators, there can be mentioned those of general formulae (ZI), (ZII) and (ZIII), below.

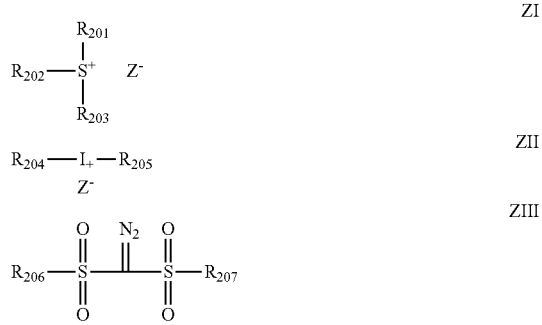

In general formula (ZI), each of $R_{201}$, $R_{202}$ and $R_{203}$ independently represents an organic group. The number of carbon atoms of the organic group represented by $R_{201}$, $R_{202}$ and $R_{203}$ is generally in the range of 1 to 30, preferably 1 to 20.

Two of $R_{201}$ to $R_{203}$ may be bonded with each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group). $Z^-$ represents a normucleophilic anion.

As the normucleophilic anion represented by $Z^-$, there can be mentioned, for example, a sulfonate anion, a carboxylate anion, a sulfonylimido anion, a bis(alkylsulfonyl)imido anion, a tris(alkylsulfonyl)methide anion or the like.

The normucleophilic anion means an anion whose capability of inducing a nucleophilic reaction is extremely low and is an anion capable of inhibiting any temporal decomposition by intramolecular nucleophilic reaction. This would realize an enhancement of the temporal stability of the actinic-ray- or radiation-sensitive resin composition.

As the sulfonate anion, there can be mentioned, for example, an aliphatic sulfonate anion, an aromatic sulfonate anion, a camphor sulfonate anion or the like.

As the carboxylate anion, there can be mentioned, for example, an aliphatic carboxylate anion, an aromatic carboxylate anion, an aralkyl carboxylate anion or the like.

The aliphatic moiety of the aliphatic sulfonate anion may be an alkyl group or a cycloalkyl group, being preferably an alkyl group having 1 to 30 carbon atoms or a cycloalkyl group having 3 to 30 carbon atoms.

As a preferred aromatic group of the aromatic sulfonate anion, there can be mentioned an aryl group having 6 to 14 carbon atoms, for example, a phenyl group, a tolyl group, a naphthyl group or the like.

The alkyl group, cycloalkyl group and aryl group of the aliphatic sulfonate anion and aromatic sulfonate anion may have a substituent.

Anions capable of producing arylsulfonic acids of formula (BI) below are preferably used as the aromatic sulfonate anion.

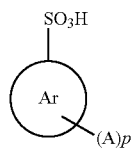

(BI)

In formula (BI),

Ar represents an aromatic ring, in which a substituent other than the sulfonic acid group and A-group may further be introduced.

In the formula, p is an integer of 0 or greater.

A represents a group comprising a hydrocarbon group.

When p is 2 or greater, a plurality of A-groups may be identical to or different from each other.

Formula (BI) will be described in greater detail below.

The aromatic ring represented by Ar is preferably an aromatic ring having 6 to 30 carbon atoms.

In particular, the aromatic ring is preferably a benzene ring, a naphthalene ring or an anthracene ring. A benzene ring is more preferred.

As the substituent other than the sulfonic acid group and A-group that can further be introduced in the aromatic ring, there can be mentioned a halogen atom (a fluorine atom, a chlorine atom, a bromine atom, an iodine atom or the like), a hydroxyl group, a cyano group, a nitro group, a carboxyl group or the like. When two or more substituents are introduced, at least two thereof may be bonded to each other to thereby form a ring.

As the hydrocarbon group of the group comprising a hydrocarbon group represented by A, there can be mentioned a noncyclic hydrocarbon group or a cycloaliphatic group. This hydrocarbon group preferably has 3 or more carbon atoms.

With respect to the A-group, it is preferred for the carbon atom adjacent to Ar to be a tertiary or quaternary carbon atom.

As the noncyclic hydrocarbon group represented by A, there can be mentioned an isopropyl group, a t-butyl group, a t-pentyl group, a neopentyl group, a s-butyl group, an isobutyl group, an isohexyl group, a 3,3-dimethylpentyl group, a 2-ethylhexyl group or the like. With respect to the upper limit of the number of carbon atoms of the noncyclic hydrocarbon group, the number is preferably 12 or less, more preferably 10 or less.

As the cycloaliphatic group represented by A, there can be mentioned a cycloalkyl group such as a cyclobutyl group, a cyclopentyl group, a cyclohexyl group, a cycloheptyl group or a cyclooctyl group, an adamantyl group, a norbornyl group, a bornyl group, a camphenyl group, a decahydronaphthyl group, a tricyclodecanyl group, a tetracyclodecanyl group, a camphoroyl group, a dicyclohexyl group, a pinenyl group or the like. The cycloaliphatic group may have a substituent. With respect to the upper limit of the number of carbon atoms of the cycloaliphatic group, the number is preferably 15 or less, more preferably 12 or less.

As a substituent that may be introduced in the noncyclic hydrocarbon group or cycloaliphatic group, there can be mentioned, for example, a halogen group such as a fluorine atom, a chlorine atom, a bromine atom or an iodine atom, an alkoxy group such as a methoxy group, an ethoxy group or a tert-butoxy group, an aryloxy group such as a phenoxy group or a p-tolyloxy group, an alkylthioxy group such as a methylthioxy group, an ethylthioxy group or a tert-butylthioxy group, an arylthioxy group such as a phenylthioxy group or a p-tolylthioxy group, an alkoxycarbonyl group such as a methoxycarbonyl group or a butoxycarbonyl group, a phenoxycarbonyl group, an acetoxy group, a linear or branched alkyl group such as a methyl group, an ethyl group, a propyl group, a butyl group, a heptyl group, a hexyl group, a dodecyl group or a 2-ethylhexyl group, a cycloalkyl group such as a cyclohexyl group, an alkenyl group such as a vinyl group, a propenyl group or a hexenyl group, an alkynyl group such as an acetylene group, a propynyl group or a hexynyl group, an aryl group such as a phenyl group or a tolyl group, a hydroxyl group, a carboxyl group, a sulfonate group, a carbonyl group, a cyano group or the like.

As particular examples of the groups each comprising a cycloaliphatic group or a noncyclic hydrocarbon group represented by A, the following structures are preferred from the viewpoint of inhibiting any acid diffusion.

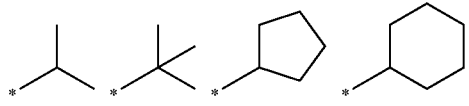

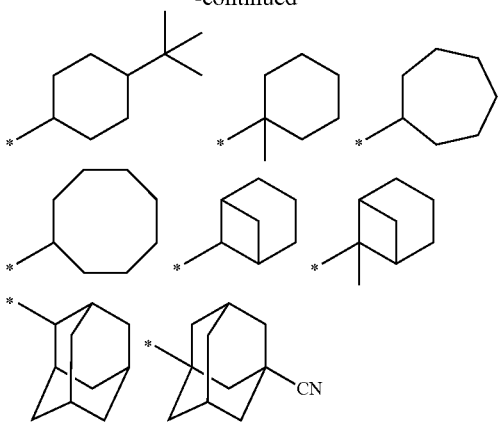

In the formula, p is an integer of 0 or greater. There is no particular upper limit as long as the number is chemically feasible. From the viewpoint of inhibiting any acid diffusion, p is generally in the range of 0 to 5, preferably 1 to 4, more preferably 2 or 3 and most preferably 3.

Further, from the viewpoint of inhibiting any acid diffusion, the substitution with A-group preferably occurs at least one o-position to the sulfonic acid group, more preferably at two o-positions to the sulfonic acid group.

The acid generator (B) according to the present invention in its one form is a compound that generates any of acids of general formula (BII) below.

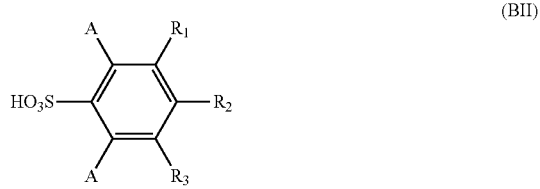

In the formula, A is as defined above in connection with general formula (BI). Two A's may be identical to or different from each other. Each of $R_1$ to $R_3$ independently represents a hydrogen atom, a group comprising a hydrocarbon group, a halogen atom, a hydroxyl group, a cyano group or a nitro group. As particular examples of the groups each comprising a hydrocarbon group, there can be mentioned the same groups as set forth above by way of example.

Further, as preferred sulfonate anions, there can be mentioned the anions that generate the acids of general formula (I) below.

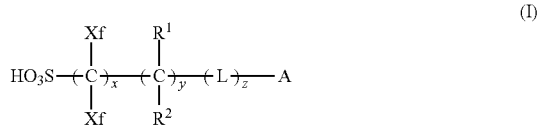

In the formula, each of Xfs independently represents a fluorine atom or an alkyl group substituted with at least one fluorine atom. Each of $R^1$ and $R^2$ independently represents a member selected from among a hydrogen atom, a fluorine atom and an alkyl group. When two or more $R^1$s or $R^2$s are contained, the two or more may be identical to or different from each other. L represents a bivalent connecting group. When two or more Ls are contained, they may be identical to or different from each other. A represents an organic group with a cyclic structure. In the formula, x is an integer of 1 to 20, y an integer of 0 to 10 and z an integer of 0 to 10.

General formula (I) will be described in greater detail below.

The alkyl group of the alkyl group substituted with a fluorine atom, represented by Xf preferably has 1 to 10 carbon atoms, more preferably 1 to 4 carbon atoms. The alkyl group substituted with a fluorine atom, represented by Xf is preferably a perfluoroalkyl group.

Xf is preferably a fluorine atom or $CF_3$. It is especially preferred that both Xfs are fluorine atoms.

Each of the alkyl group represented by each of $R^1$ and $R^2$ may have a substituent (preferably a fluorine atom), and preferably has 1 to 4 carbon atoms.

Each of $R^1$ and $R^2$ is preferably a fluorine atom or $CF_3$.

In the formula, y is preferably 0 to 4, more preferably 0; x is preferably 1 to 8, more preferably 1 to 4; and z is preferably 0 to 8, more preferably 0 to 4. The bivalent connecting group represented by L is not particularly limited. As the same, there can be mentioned, for example, any one or a combination of two or more groups selected from the group consisting of —COO—, —OCO—, —CO—, —O—, —S—, —SO—, —SO$_2$—, an alkylene group, a cycloalkylene group and an alkenylene group. The sum of carbon atoms of the bivalent connecting group represented by L is preferably 12 or less. Of these, —COO—, —OCO—, —CO—, —O— and —SO$_2$— are preferred. —COO—, —OCO— and —SO$_2$— are more preferred.

The organic group with a cyclic structure represented by A is not particularly limited. As the group, there can be mentioned an alicyclic group, an aryl group, a heterocyclic group (including not only those exhibiting aromaticity but also those exhibiting no aromaticity) or the like.

The alicyclic group may be monocyclic or polycyclic. Preferably, the alicyclic group is a cycloalkyl group of a single ring, such as a cyclopentyl group, a cyclohexyl group or a cyclooctyl group, or a cycloalkyl group of multiple rings, such as a norbornyl group, a tricyclodecanyl group, a tetracyclodecanyl group, a tetracyclododecanyl group or an adamantyl group. Of the mentioned groups, alicyclic groups with a bulky structure having at least 7 carbon atoms, namely, a norbornyl group, a tricyclodecanyl group, a tetracyclodecanyl group, a tetracyclododecanyl group and an adamantyl group are preferred from the viewpoint of inhibiting any in-film diffusion in the step of post-exposure bake (PEB) to thereby enhance Mask Error Enhancement Factor (MEEF).

As the aryl group, there can be mentioned a benzene ring, a naphthalene ring, a phenanthrene ring or an anthracene ring. Naphthalene exhibiting a low absorbance is especially preferred from the viewpoint of the absorbance at 193 nm.

As the heterocyclic groups, there can be mentioned those derived from a furan ring, a thiophene ring, a benzofuran ring, a benzothiophene ring, a dibenzofuran ring, a dibenzothiophene ring, a pyridine ring and a piperidine ring. Of these, the groups derived from a furan ring, a thiophene ring, a pyridine ring and a piperidine ring are preferred.

As the cyclic organic groups, there can also be mentioned lactone structures. As particular examples thereof, there can be mentioned the above lactone structures of general formulae (LC1-1) to (LC1-17) that may be incorporated in the resin (A).

A substituent may be introduced in each of the above cyclic organic groups. As the substituent, there can be mentioned an alkyl group (may be linear or branched, preferably having 1 to 12 carbon atoms), a cycloalkyl group (may be in the form of any of a monocycle, a polycycle and a spiro ring, preferably having 3 to 20 carbon atoms), an aryl group (preferably having 6 to 14 carbon atoms), a hydroxyl group, an alkoxy group, an ester group, an amido group, a urethane group, a ureido group, a thioether group, a sulfonamido group, a sulfonic ester group or the like. The carbon as a constituent of any of the cyclic organic groups (carbon contributing to the formation of a ring) may be a carbonyl carbon.

As the aliphatic moiety of the aliphatic carboxylate anion, there can be mentioned the same alkyl groups and cycloalkyl groups as mentioned with respect to the aliphatic sulfonate anion.

As the aromatic group of the aromatic carboxylate anion, there can be mentioned the same aryl groups as mentioned with respect to the aromatic sulfonate anion.

As a preferred aralkyl group of the aralkyl carboxylate anion, there can be mentioned an aralkyl group having 7 to 12 carbon atoms, for example, a benzyl group, a phenethyl group, a naphthylmethyl group, a naphthylethyl group, a naphthylbutyl group or the like.

The alkyl group, cycloalkyl group, aryl group and aralkyl group of the aliphatic carboxylate anion, aromatic carboxylate anion and aralkyl carboxylate anion may have a substituent. As the substituent of the alkyl group, cycloalkyl group, aryl group and aralkyl group of the aliphatic carboxylate anion, aromatic carboxylate anion and aralkyl carboxylate anion, there can be mentioned, for example, the same halogen atom, alkyl group, cycloalkyl group, alkoxy group, alkylthio group, etc. as mentioned with respect to the aromatic sulfonate anion.

As the sulfonylimido anion, there can be mentioned, for example, a saccharin anion.

The alkyl group of the bis(alkylsulfonyl)imido anion and tris(alkylsulfonyl)methide anion is preferably an alkyl group having 1 to 5 carbon atoms. As such, there can be mentioned, for example, a methyl group, an ethyl group, a propyl group, an isopropyl group, an n-butyl group, an isobutyl group, a sec-butyl group, a pentyl group, a neopentyl group or the like. As a substituent of these alkyl groups, there can be mentioned a halogen atom, an alkyl group substituted with a halogen atom, an alkoxy group, an alkylthio group, an alkyloxysulfonyl group, an aryloxysulfonyl group, a cycloalkylaryloxysulfonyl group or the like. An alkyl group substituted with a fluorine atom is preferred.

The two alkyl groups contained in the bis(alkylsulfonyl)imide anion may be identical to or different from each other. Similarly, the multiple alkyl groups contained in the tris(alkylsulfonyl)methide anion may be identical to or different from each other.

In particular, as the bis(alkylsulfonyl)imide anion and tris(alkylsulfonyl)methide anion, there can be mentioned the anions of general formulae (A3) and (A4) below.

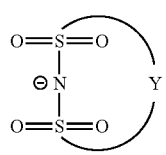

(A3)

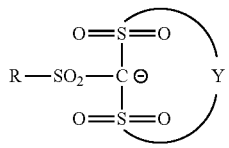

(A4)

In general formulae (A3) and (A4),

Y represents an alkylene group substituted with at least one fluorine atom, preferably having 2 to 4 carbon atoms. An oxygen atom may be contained in the alkylene chain. More preferably, Y is a perfluoroalkylene group having 2 to 4 carbon atoms. Most preferably, Y is a tetrafluoroethylene group, a hexafluoropropylene group or an octafluorobutylene group.

In formula (A4), R represents an alkyl group or a cycloalkyl group. An oxygen atom may be contained in the alkylene chain of the alkyl group or cycloalkyl group.

As the compounds containing the anions of general formulae (A3) and (A4), there can be mentioned, for example, particular examples set forth in JP-A-2005-221721.

As the other normucleophilic anions, there can be mentioned, for example, phosphorus fluoride, boron fluoride, antimony fluoride and the like.

As the organic groups represented by $R_{201}$, $R_{202}$ and $R_{203}$ of general formula (ZI), there can be mentioned, for example, groups corresponding to the following compounds (ZI-1), (ZI-2), (ZI-3) and (ZI-4).

Appropriate use may be made of compounds with two or more of the structures of general formula (ZI). For example, use may be made of compounds having a structure wherein at least one of $R_{201}$ to $R_{203}$ of a compound of general formula (ZI) is bonded with at least one of $R_{201}$ to $R_{203}$ of another compound of general formula (ZI).

As more preferred (ZI) components, there can be mentioned the following compounds (ZI-1), (ZI-2), (ZI-3) and (ZI-4).

The compounds (ZI-1) are arylsulfonium compounds of general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, there can be mentioned, for example, a pyrrole residue, a furan residue, a thiophene residue, an indole residue, a benzofuran residue, a benzothiophene residue or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), a cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds (ZI-2) will be described.

The compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms and a cycloalkyl group having 3 to 10 carbon atoms. As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having $>C=O$ at the 2-position of the alkyl group is preferred.

The 2-oxocycloalkyl group is preferably a group having $>C=O$ at the 2-position of the cycloalkyl group.

As preferred alkoxy groups of the alkoxycarbonylmethyl group, there can be mentioned alkoxy groups having 1 to 5 carbon atoms.

The $R_{201}$ to $R_{203}$ may be further substituted with a halogen atom, an alkoxy group (for example, 1 to 5 carbon atoms), a hydroxyl group, a cyano group or a nitro group.

The compounds (ZI-3) are those represented by the following general formula (ZI-3) which have a phenacylsulfonium salt structure.

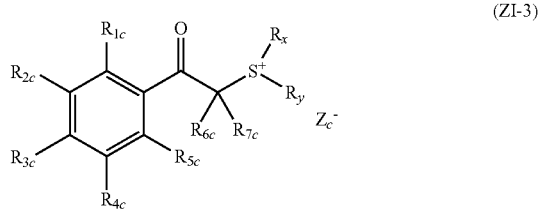

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nornucleophilic anion. There can be mentioned the same nornucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having $>C=O$ at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

Specific examples of the cations of the compounds (ZI-3) will be shown below.

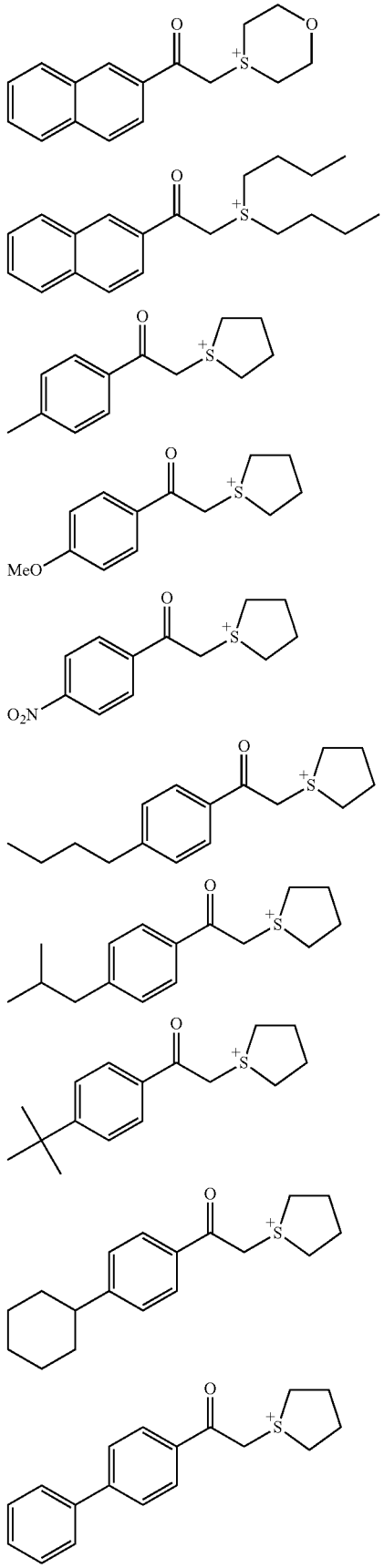

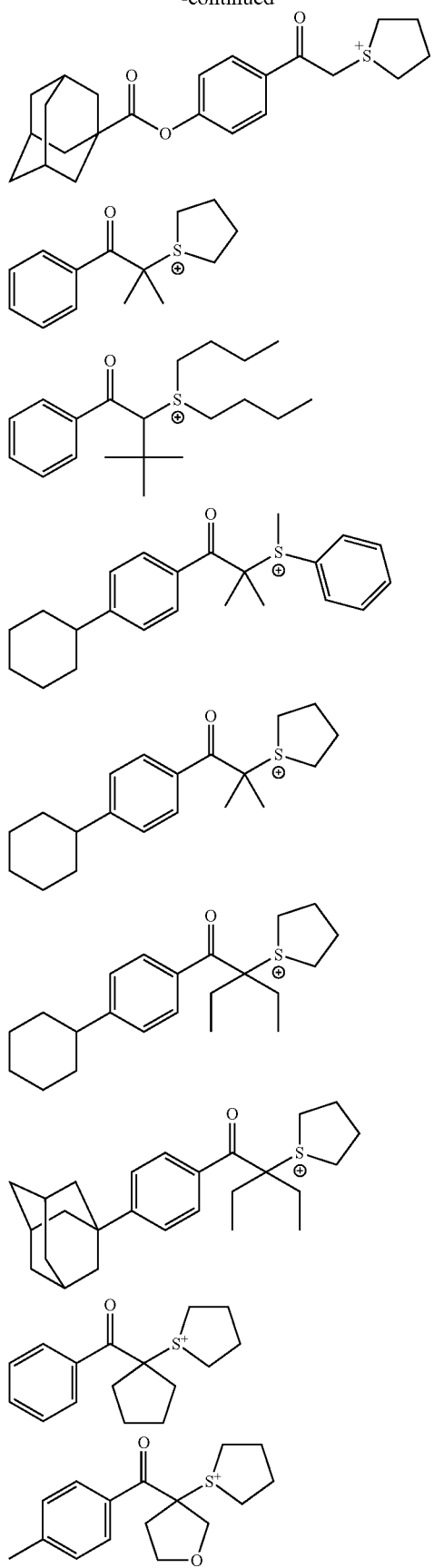
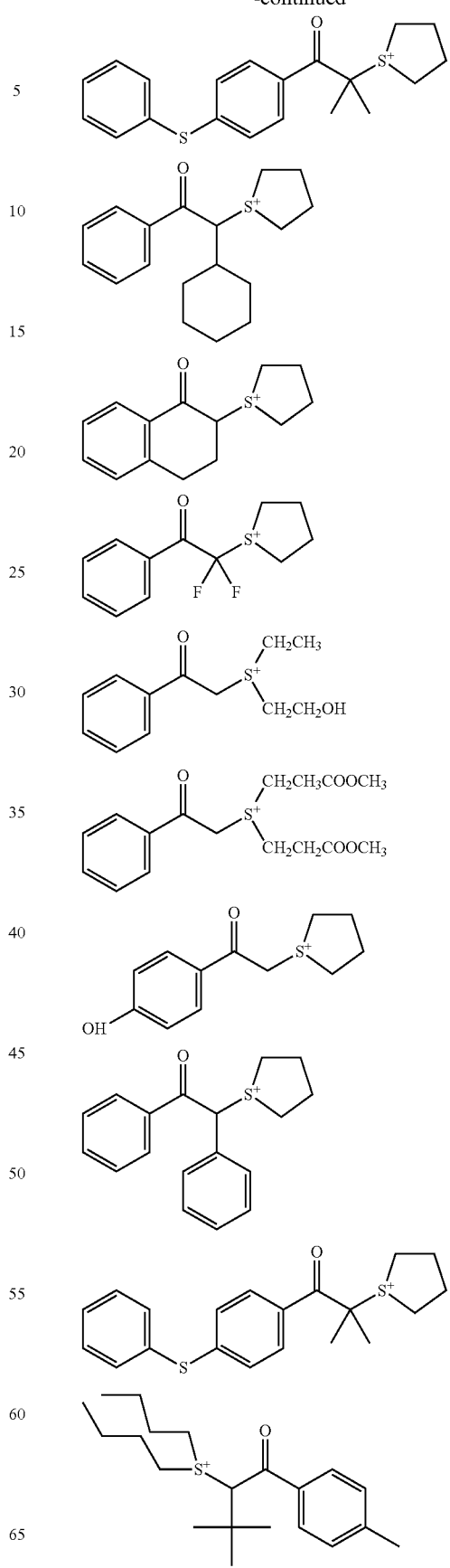

-continued

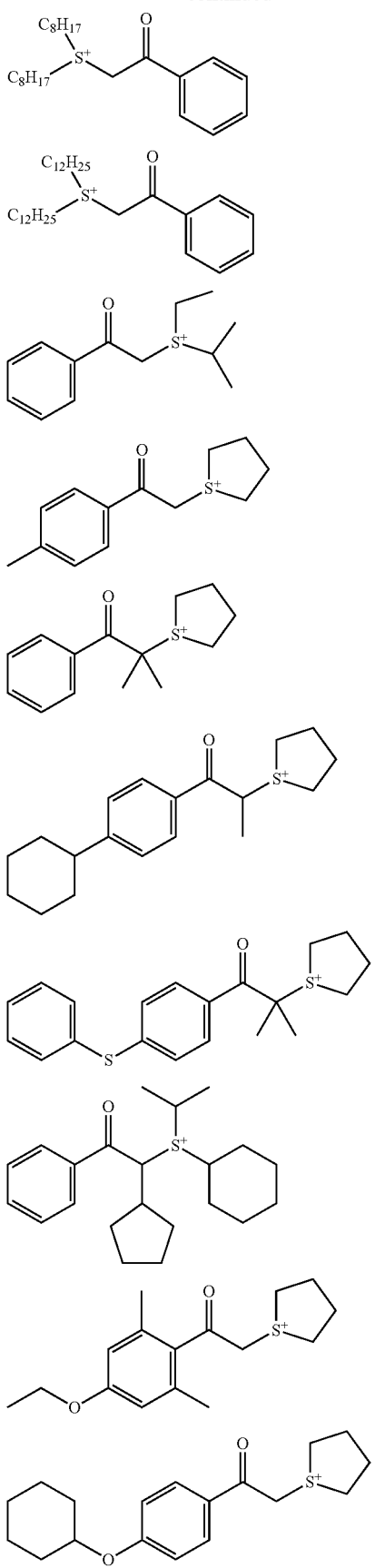

-continued

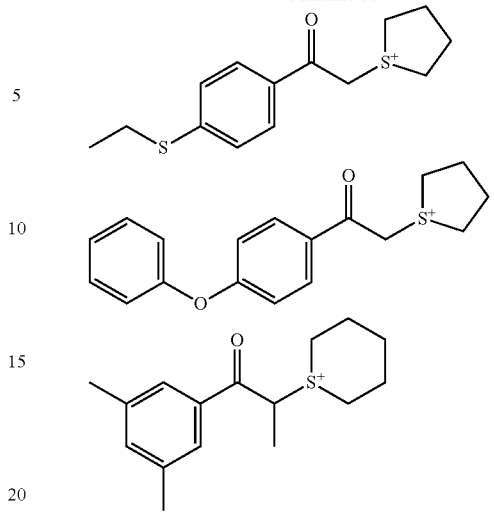

The compounds (ZI-4) are those of general formula (ZI-4) below.

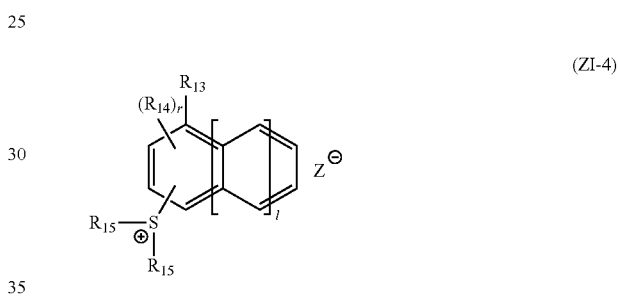

(ZI-4)

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have substituents.

Each of $R_{15}$s independently represents an alkyl group, a cycloalkyl group or a naphthyl group, provided that the two $R_{15}$s may be bonded to each other to thereby form a ring. These groups may have substituents.

In the formula, 1 is an integer of 0 to 2, and
r is an integer of 0 to 8.

$Z^-$ represents a normucleophilic anion. As such, there can be mentioned any of the same normucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

The cycloalkyl groups represented by $R_{13}$, $R_{14}$ and $R_{15}$ include a cycloalkylene group. As the cycloalkyl groups, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have a substituent. As such a substituent, there can be mentioned, for example, a halogen atom (e.g., a fluorine atom), a hydroxyl group, a carboxyl group, a cyano group, a nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have a substituent. As such a substituent, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cations of the compounds (ZI-4) will be shown below.

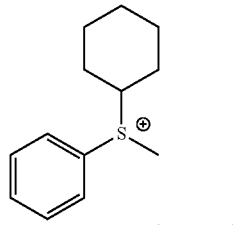
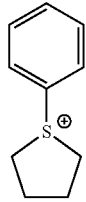
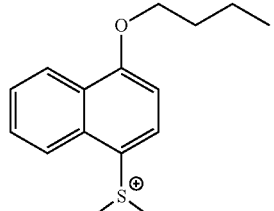
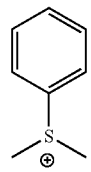
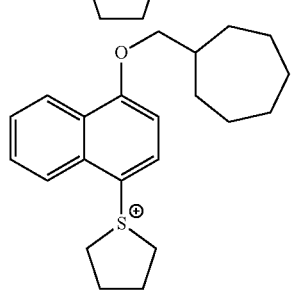
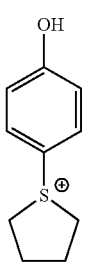

-continued

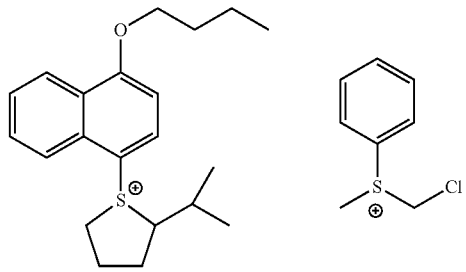
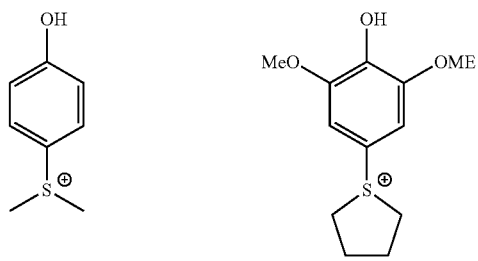
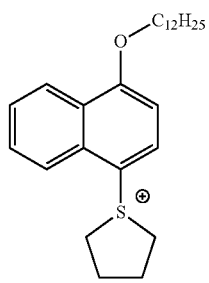
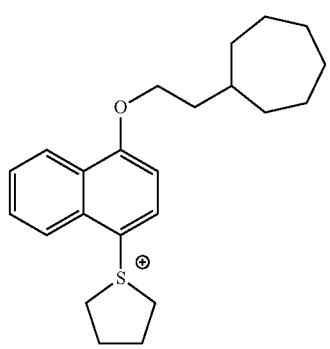
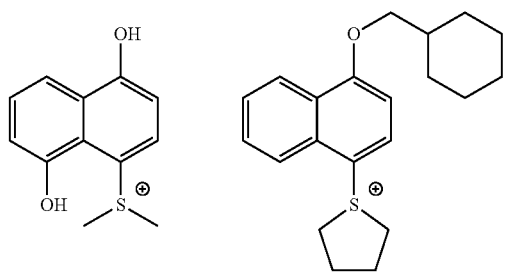

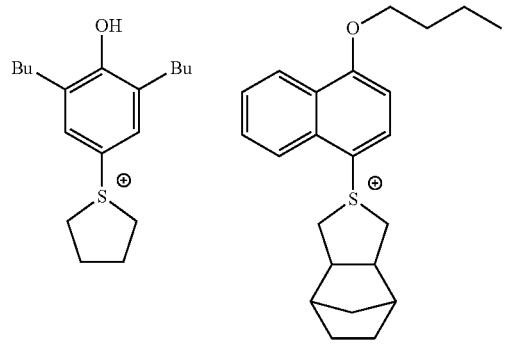
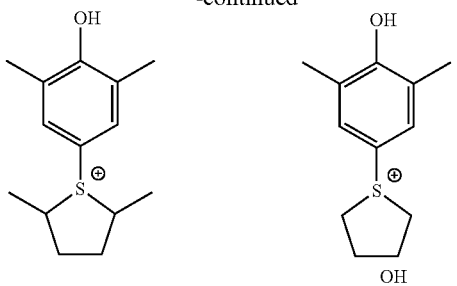
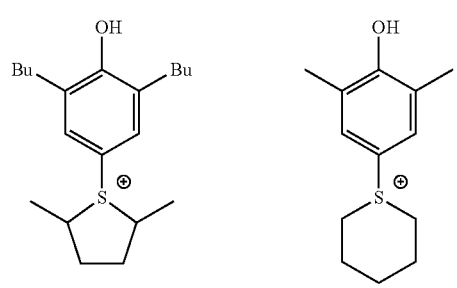
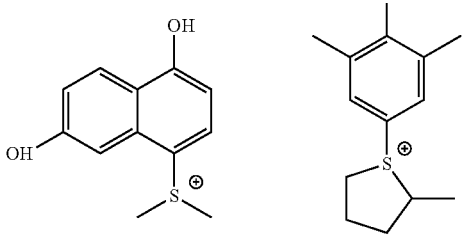
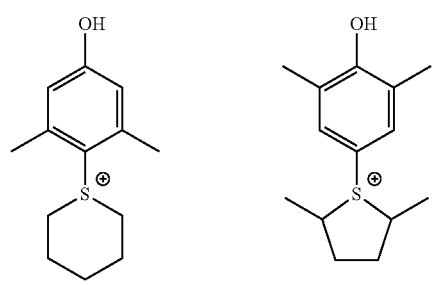
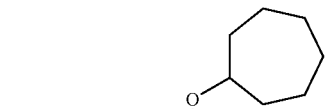
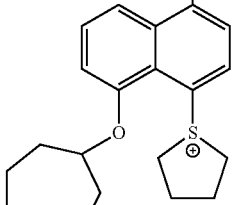
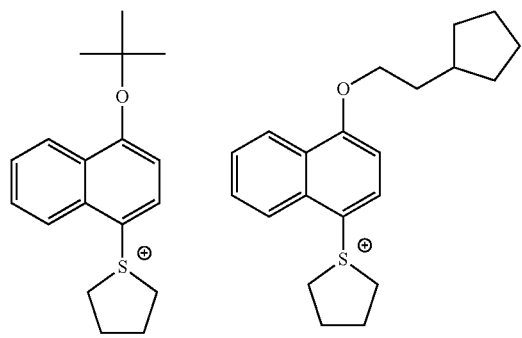
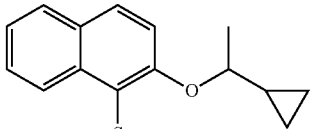
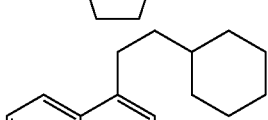
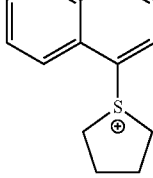
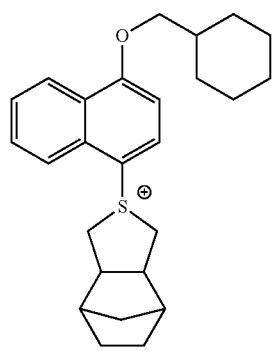
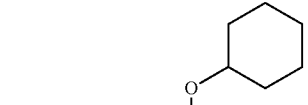
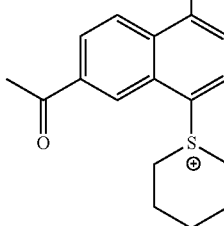

81
-continued
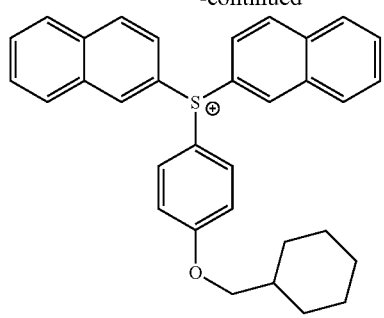
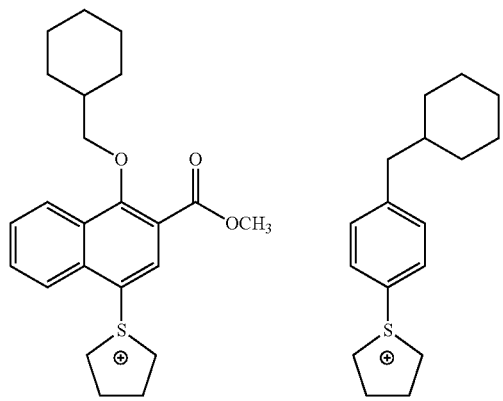
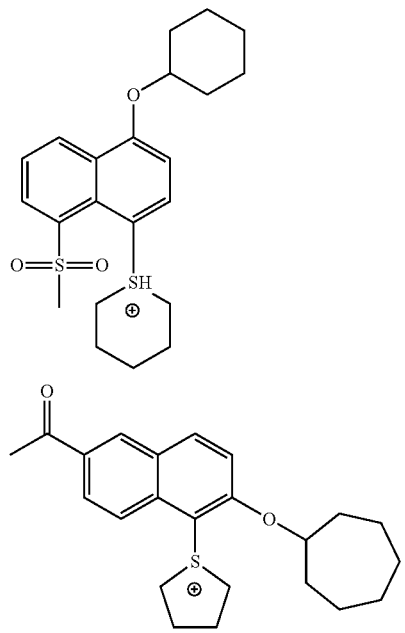
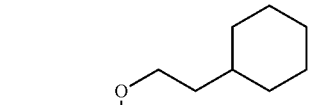
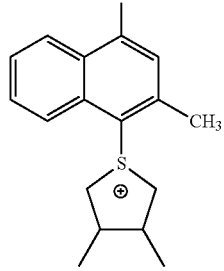
82
-continued
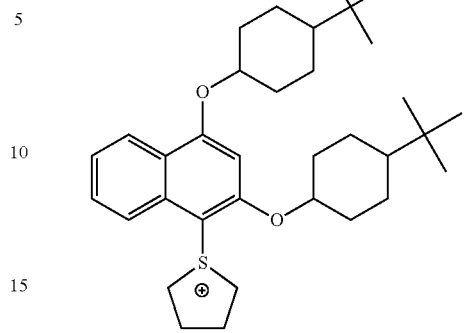
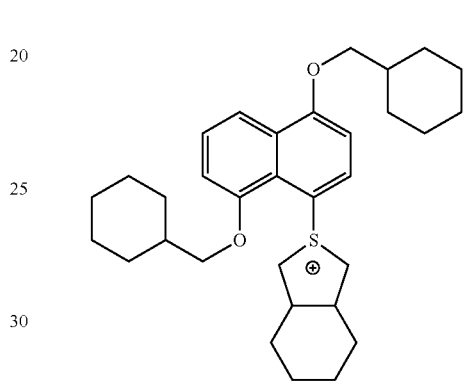
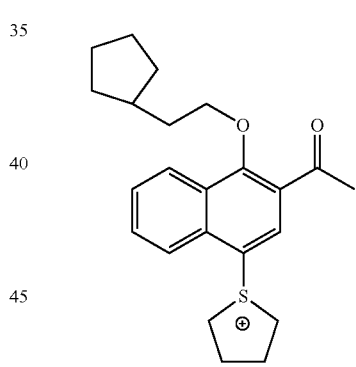
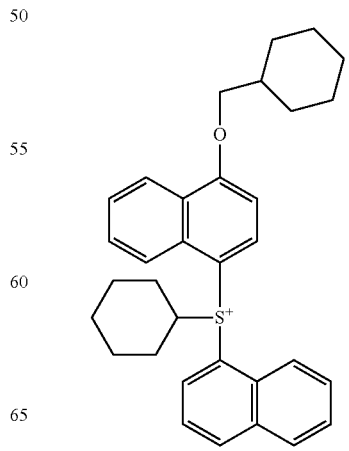

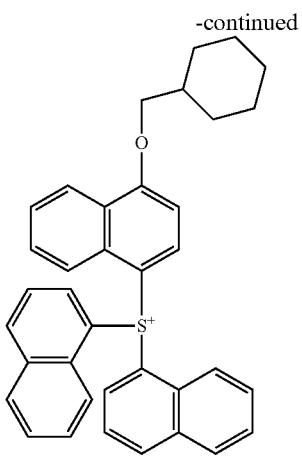

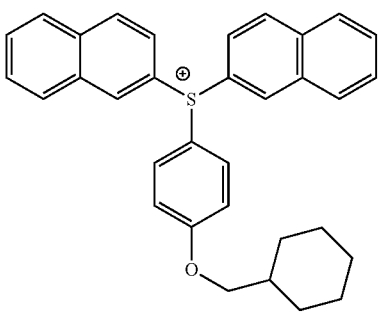

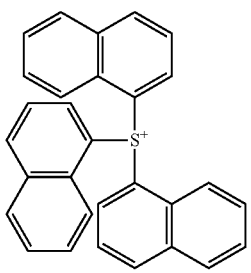

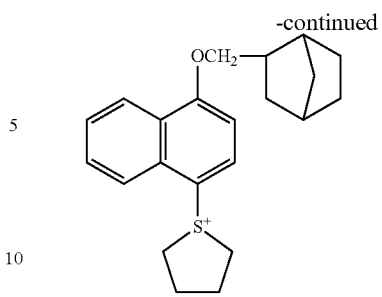

In general formulae (ZII) and (ZIII), each of $R_{204}$ to $R_{207}$ independently represents an aryl group, an alkyl group or a cycloalkyl group.

The aryl group represented by $R_{204}$ to $R_{207}$ is preferably a phenyl group or a naphthyl group, more preferably a phenyl group. The aryl group represented by $R_{204}$ to $R_{207}$ may be one having a heterocyclic structure containing an oxygen atom, nitrogen atom, sulfur atom or the like. As the heterocyclic structure, there can be mentioned, for example, a pyrrole, a furan, a thiophene, an indole, a benzofuran, a benzothiophene or the like.

As preferred alkyl groups and cycloalkyl groups represented by $R_{204}$ to $R_{207}$, there can be mentioned a linear or branched alkyl group having 1 to 10 carbon atoms and a cycloalkyl group having 3 to 10 carbon atoms.

The aryl group, alkyl group and cycloalkyl group represented by $R_{204}$ to $R_{207}$ may have a substituent. As a possible substituent on the aryl group, alkyl group and cycloalkyl group represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group or the like.

$Z^-$ represents a normucleophilic anion. As such, there can be mentioned the same normucleophilic anions as mentioned with respect to the $Z^-$ of the general formula (ZI).

As the acid generators, there can be further mentioned the compounds of the following general formulae (ZIV), (ZV) and (ZVI).

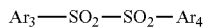

ZIV

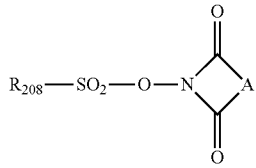

ZV

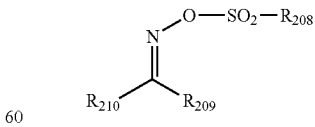

ZVI

In the general formulae (ZIV) to (ZVI), each of $Ar_3$ and $Ar_4$ independently represents an aryl group.

Each of $R_{208}$, $R_{209}$ and $R_{210}$ independently represents an alkyl group, a cycloalkyl group or an aryl group.

A represents an alkylene group, an alkenylene group or an arylene group.

As specific examples of the aryl groups represented by $Ar_3$, $Ar_4$, $R_{208}$, $R_{209}$ and $R_{210}$, there can be mentioned the same groups as mentioned with respect to the aryl groups represented by $R_{201}$, $R_{202}$ and $R_{203}$ of general formula (ZI-1) above.

As specific examples of each of the alkyl groups and the cycloalkyl groups represented by $R_{208}$, $R_{209}$ and $R_{210}$, there can be mentioned the same groups as mentioned with respect to each of the alkyl groups and the cycloalkyl groups represented by $R_{201}$, $R_{202}$ and $R_{203}$ of general formula (ZI-1) above.

As the alkylene group represented by A, there can be mentioned an alkylene group having 1 to 12 carbon atoms such as a methylene group, an ethylene group, a propylene group, an isopropylene group, a butylene group, an isobutylene group or the like. As the alkenylene group represented by A, there can be mentioned an alkenylene group having 2 to 12 carbon atoms such as an ethynylene group, a propenylene group, a butenylene group or the like. As the arylene group represented by A, there can be mentioned an arylene group having 6 to 10 carbon atoms such as a phenylene group, a tolylene group, a naphthylene group or the like.

Among the acid generators, the compounds of the general formulae (ZI) to (ZIII) are more preferred.

Especially preferred examples of the acid generators are as follows.

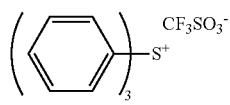

(z1)

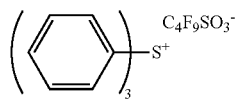

(z2)

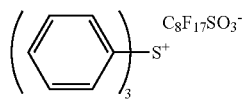

(z3)

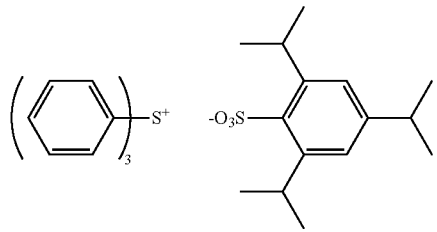

(z4)

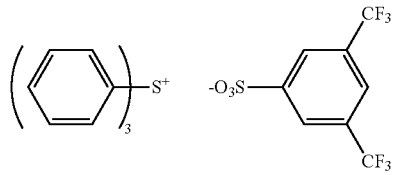

(z5)

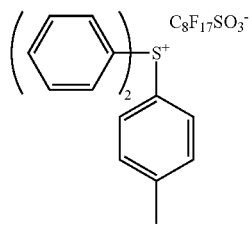

(z6)

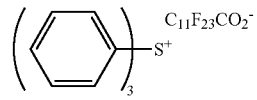

(z7)

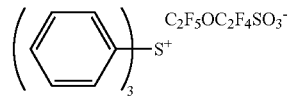

(z8)

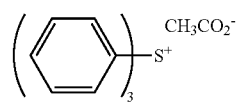

(z9)

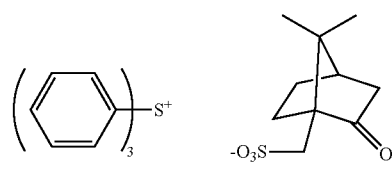

(z10)

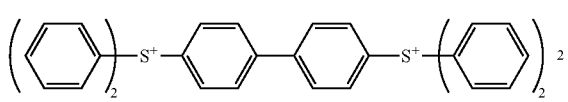

(z11)

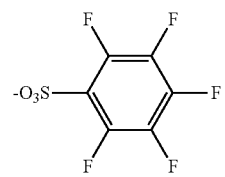

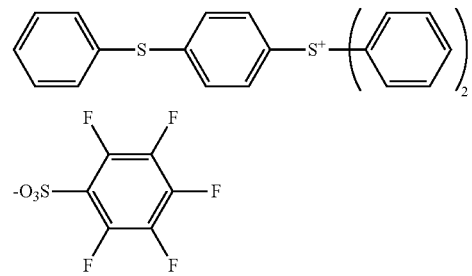

(z12)

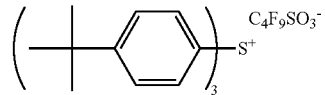

(z13)

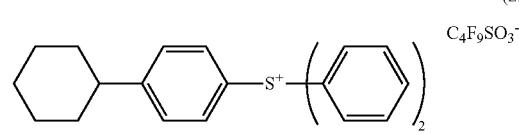

(z14)

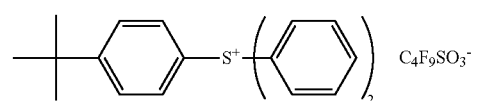

(z15)

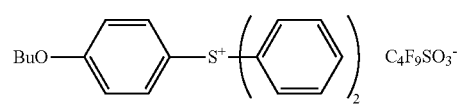

(z16)

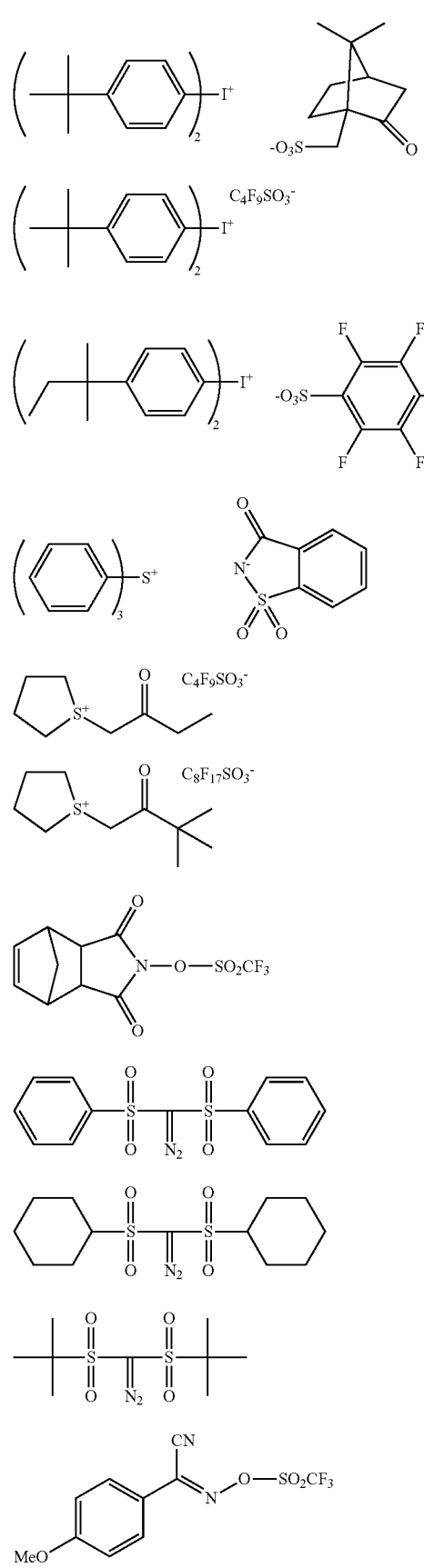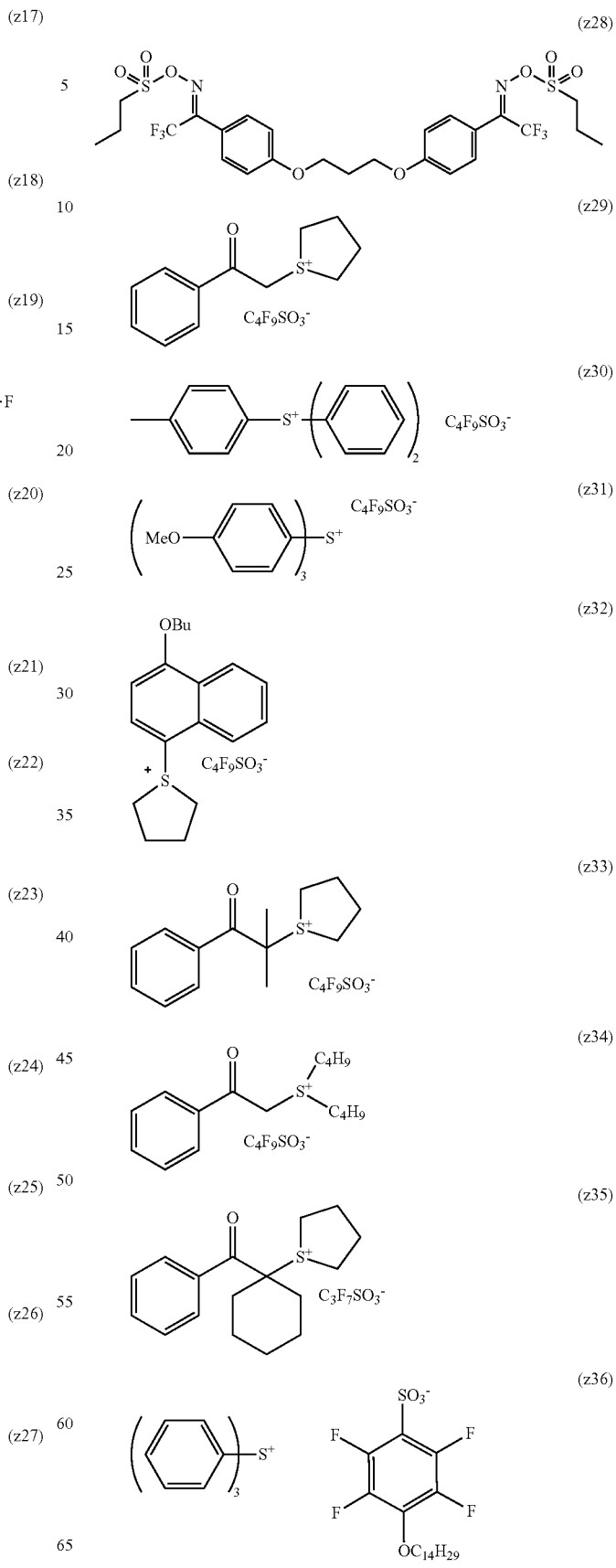

-continued
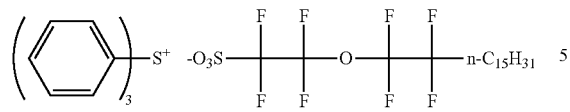 (z37)
 (z38)
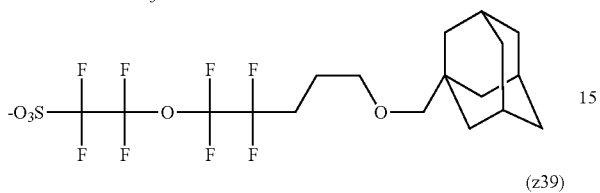 (z39)
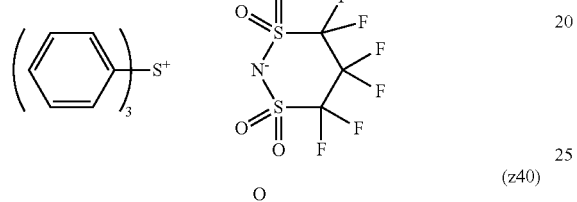 (z40)
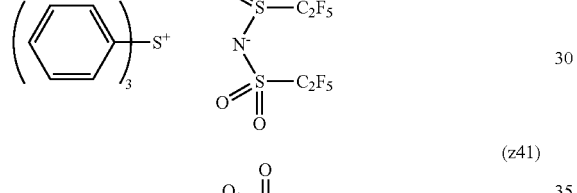 (z41)
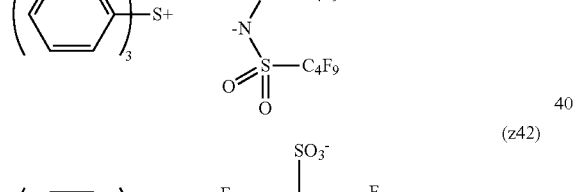 (z42)
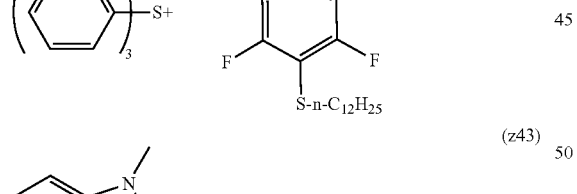 (z43)
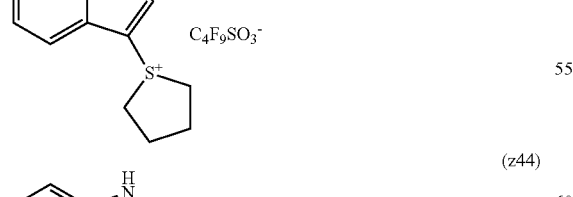 (z44)
-continued
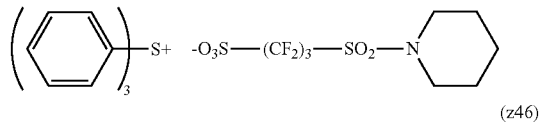 (z45)
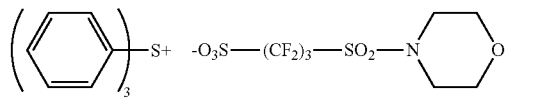 (z46)
 (z47)
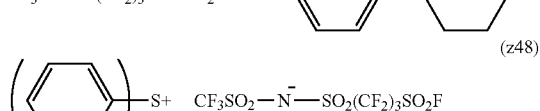 (z48)
 (z49)
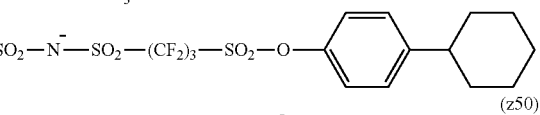 (z50)
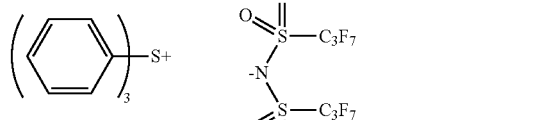 (z51)
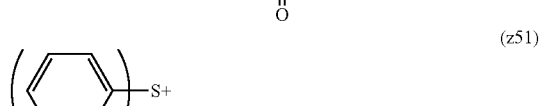 (z52)
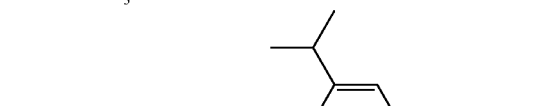 (z53)

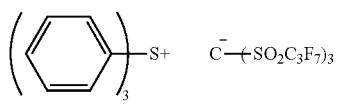 (z54)
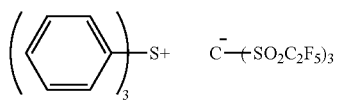 (z55)
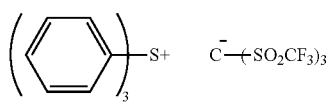 (z56)
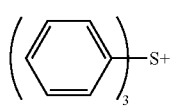 (z57)
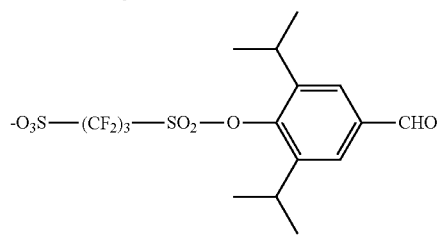
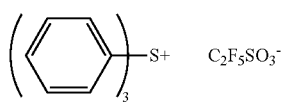 (z58)
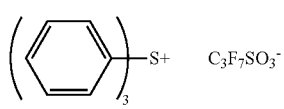 (z59)
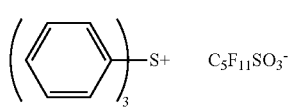 (z60)
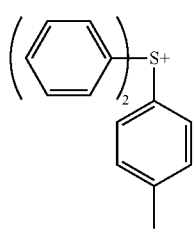 (z61)
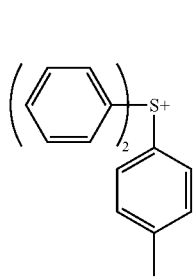 (z62)
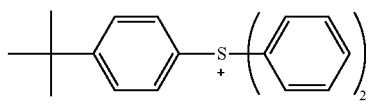 (z63)
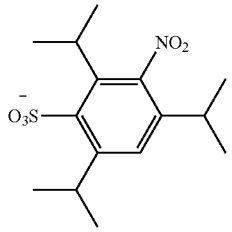
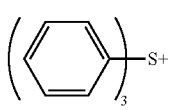 (z64)
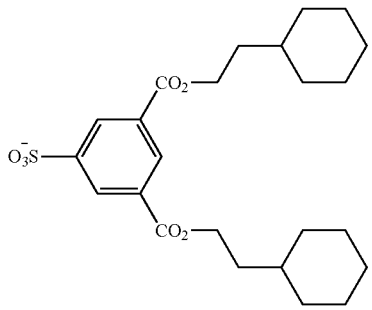
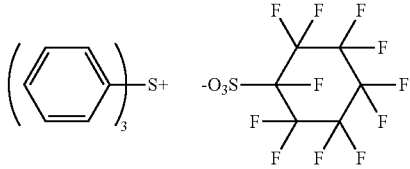 (z65)
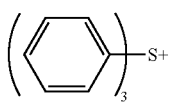 (z66)
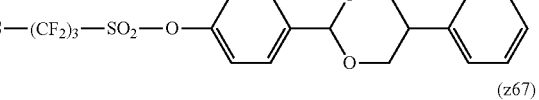
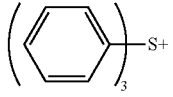 (z67)
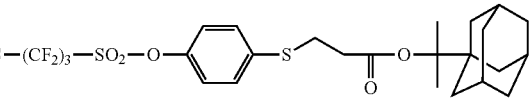
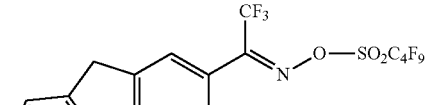 (z68)
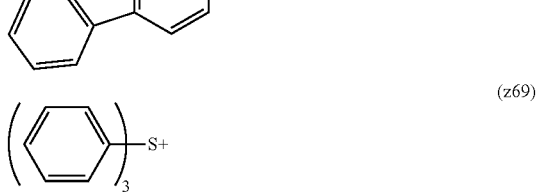 (z69)

-continued
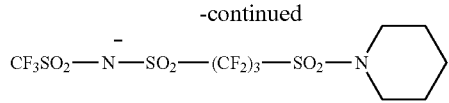
(z70)
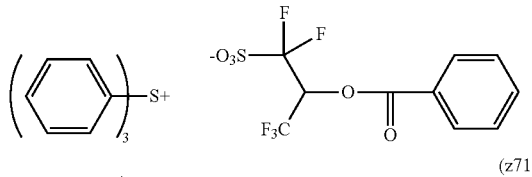
(z71)
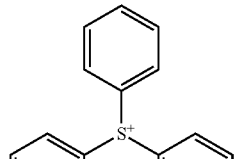
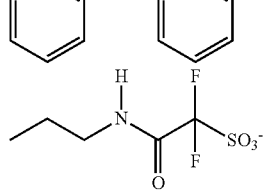
(z72)
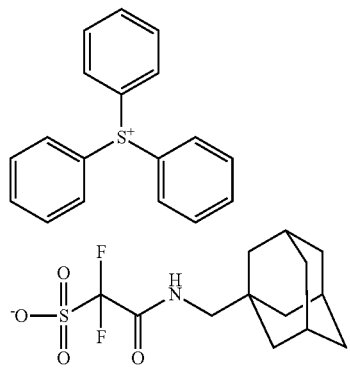
(z73)
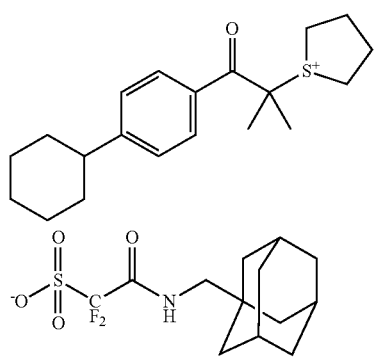
(z74)
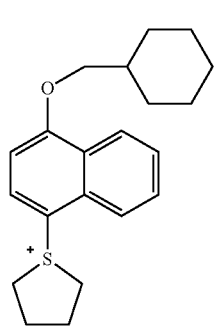
-continued
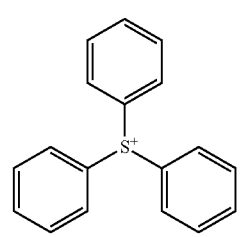
(z75)
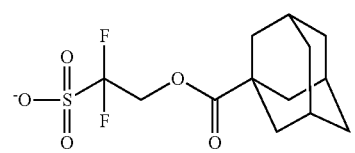
(z76)
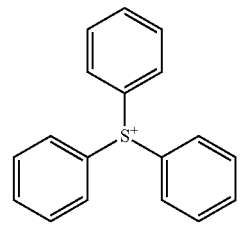
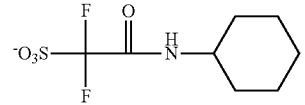
(z77)
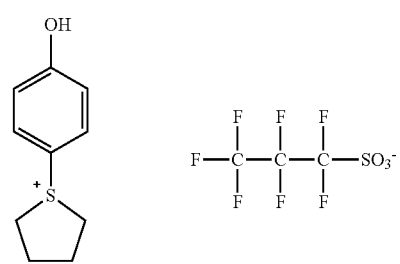
(z78)
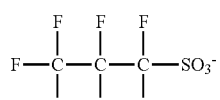

(z79) 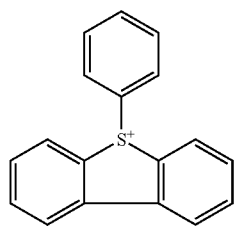 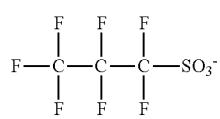
(z80) 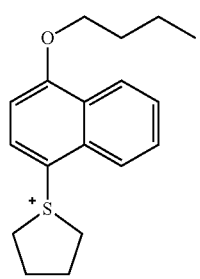 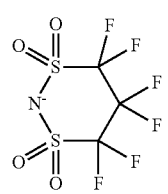
(z81) 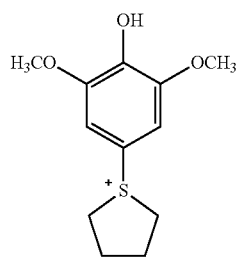 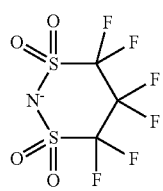
(z82) 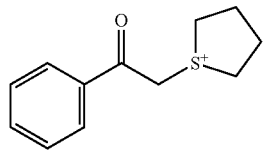
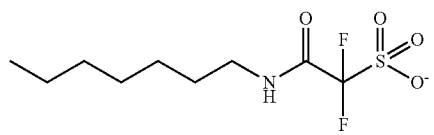
(z83) 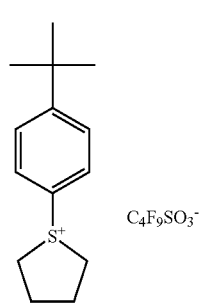
(z84) 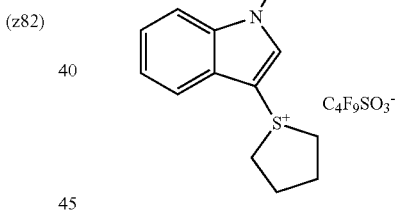
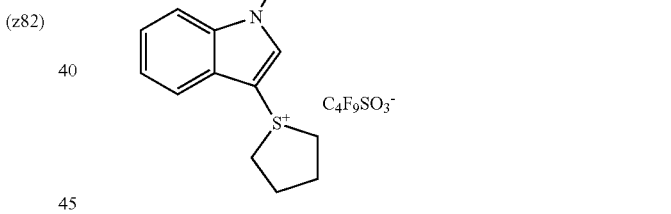
(z85)
(z86) 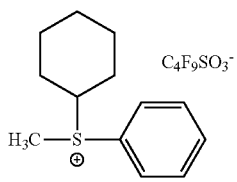
(z87)
(z88) 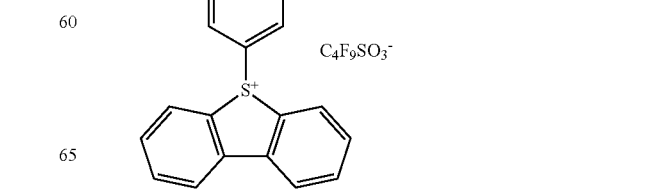

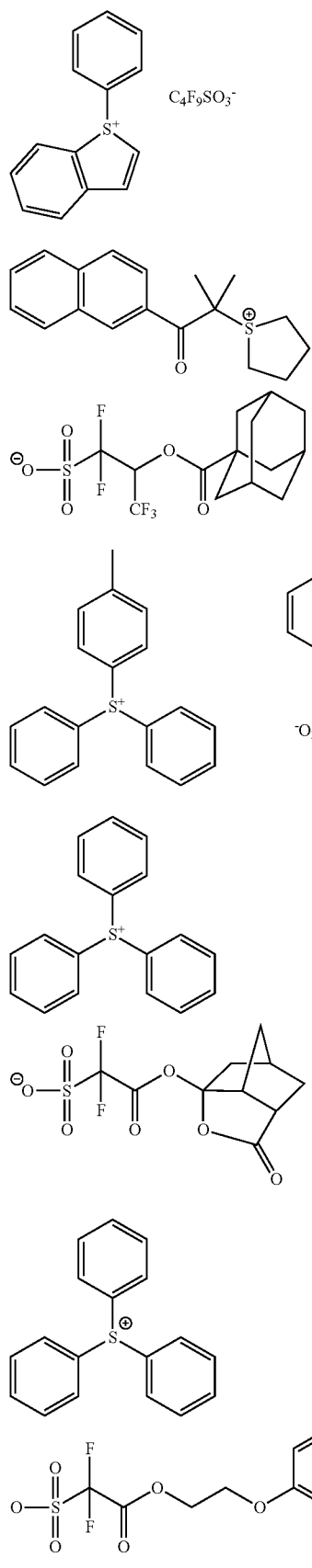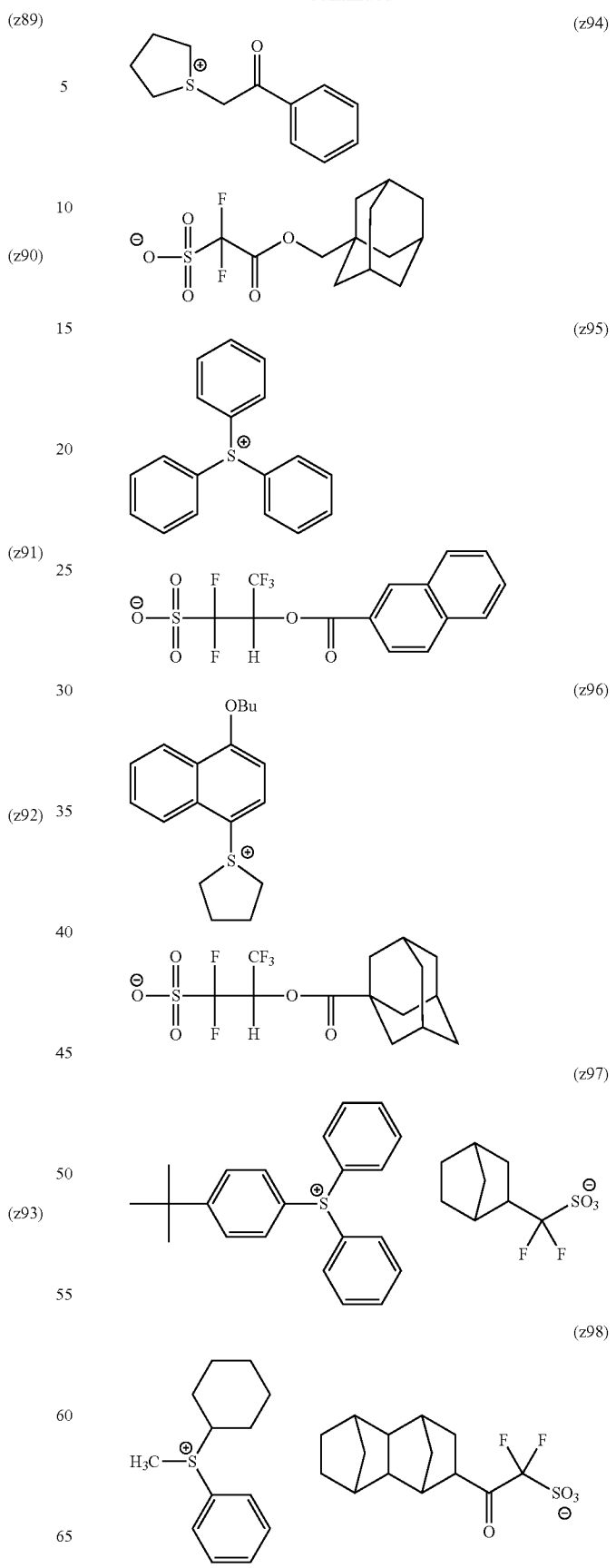

(z99)
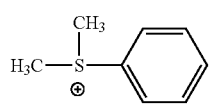
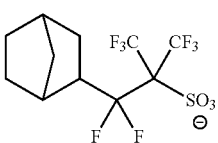

(z100)
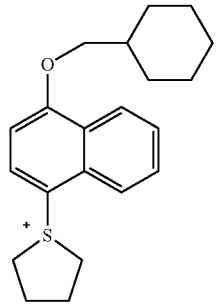

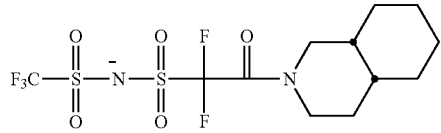

(z101)
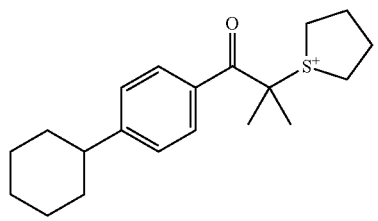

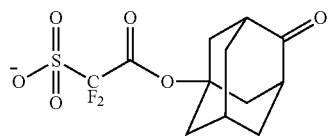

(z102)
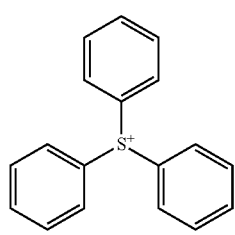

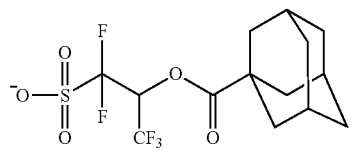

(z103)
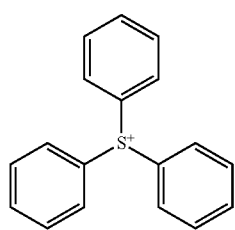

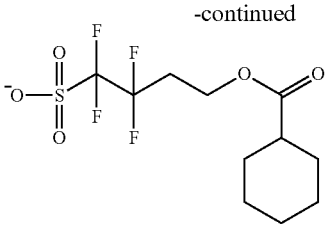

(z104)

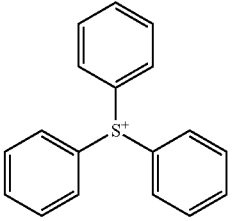

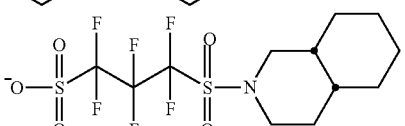

(z105)
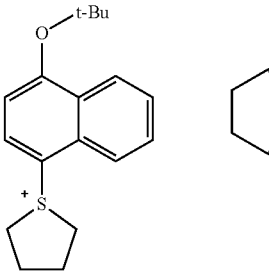
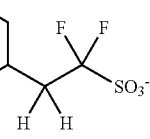

(z106)
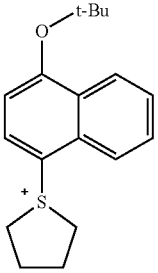
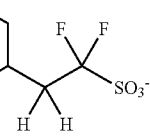

The acid generators can be used alone or in combination. The content of acid generator in the composition is preferably in the range of 0.1 to 20 mass %, more preferably 0.5 to 10 mass %, and still more preferably 1 to 7 mass % based on the total solids of the actinic-ray- or radiation-sensitive resin composition.

[3-3] Crosslinking Agent (C)

The resist composition according to the present invention may contain, together with the resin (A), a compound (hereinafter referred to as a crosslinking agent) capable of crosslinking the resin (A) under the action of an acid. In the present invention, heretofore known crosslinking agents can be effectively used. When the crosslinking agent is used, as mentioned hereinbefore, it is preferred for the resin (A) to contain a repeating unit (a2) containing an alcoholic hydroxyl group.

The crosslinking agent (C) is a compound containing a crosslinking group capable of crosslinking the resin (A). As the crosslinking group, there can be mentioned a hydroxymethyl group, an alkoxymethyl group, a vinyl ether group, an epoxy group or the like. It is preferred for the crosslinking agent (C) to have two or more such crosslinking groups.

The crosslinking agent (C) is preferably one consisting of a melamine compound, a urea compound, an alkyleneurea compound or a glycoluril compound.

Specific examples of the crosslinking agent (C) will be shown below, which however in no way limit the scope of the present invention.

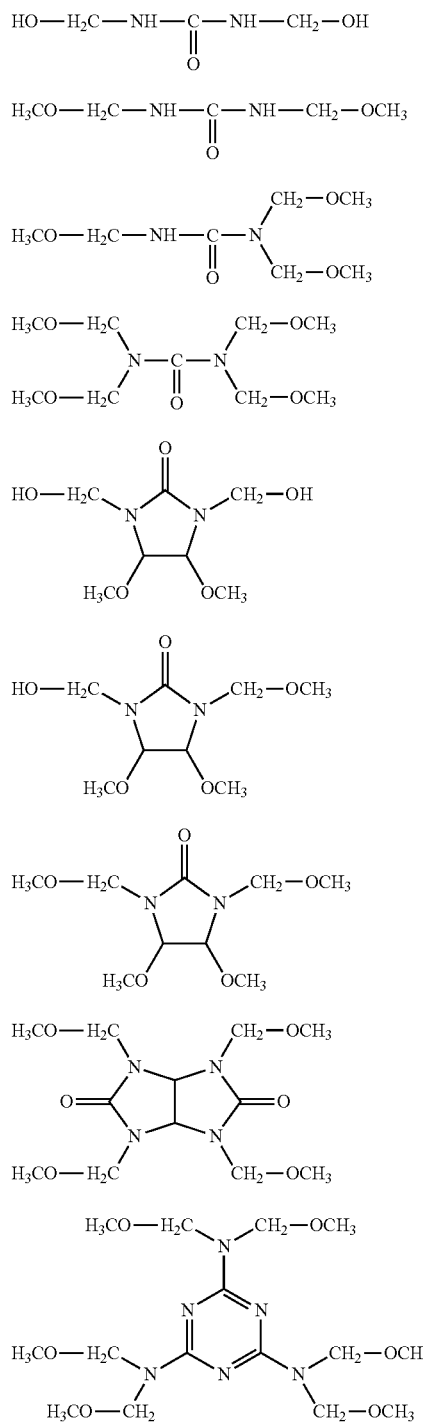

In the present invention, each of these crosslinking agents may be used alone, or two or more thereof may be used in combination.

When the resist composition contains a crosslinking agent, the content of the crosslinking agent in the resist composition is preferably in the range of 3 to 15 mass %, more preferably 4 to 12 mass % and further more preferably 5 to 10 mass % based on the total solids of the resist composition.

[3-4] Solvent (D)

The actinic-ray- or radiation-sensitive resin composition of the present invention contains a solvent.

The solvent is not limited as long as it can be used in the preparation of the composition. As the solvent, there can be mentioned, for example, an organic solvent, such as an alkylene glycol monoalkyl ether carboxylate, an alkylene glycol monoalkyl ether, an alkyl lactate, an alkyl alkoxypropionate, a cyclolactone (preferably having 4 to 10 carbon atoms), an optionally cyclized monoketone compound (preferably having 4 to 10 carbon atoms), an alkylene carbonate, an alkyl alkoxyacetate or an alkyl pyruvate.

Particular examples and preferred examples of the solvents are the same as those described in [0244] to [0248] of JP-A-2008-292975.

In the present invention, a mixed solvent consisting of a mixture of a solvent having a hydroxyl group in its structure and a solvent having no hydroxyl group may be used as the organic solvent.

The solvent having a hydroxyl group and the solvent having no hydroxyl group can appropriately be selected from among the compounds mentioned above, as examples. The solvent having a hydroxyl group is preferably an alkylene glycol monoalkyl ether, an alkyl lactate or the like, more preferably propylene glycol monomethyl ether (PGME, another name: 1-methoxy-2-propanol) or ethyl lactate. The solvent having no hydroxyl group is preferably an alkylene glycol monoalkyl ether acetate, an alkyl alkoxypropionate, an optionally cyclized monoketone compound, a cyclolactone, an alkyl acetate or the like. Among these, propylene glycol monomethyl ether acetate (PGMEA, another name: 1-methoxy-2-acetoxypropane), ethyl ethoxypropionate, 2-heptanone, γ-butyrolactone, cyclohexanone and butyl acetate are especially preferred. Propylene glycol monomethyl ether acetate, ethyl ethoxypropionate and 2-heptanone are most preferred.

The mixing ratio (mass) of a solvent having a hydroxyl group and a solvent having no hydroxyl group is commonly in the range of 1/99 to 99/1, preferably 10/90 to 90/10 and more preferably 20/80 to 60/40. The mixed solvent containing 50 mass % or more of a solvent having no hydroxyl group is especially preferred from the viewpoint of uniform applicability.

It is preferred for the solvent to be a mixed solvent consisting of two or more solvents containing propylene glycol monomethyl ether acetate.

[3-5] Hydrophobic Resin (HR)

The composition of the present invention may further contain a hydrophobic resin (HR) containing at least either a fluorine atom or a silicon atom especially when a liquid immersion exposure is applied thereto. This localizes the hydrophobic resin (HR) in the surface layer of the film. Accordingly, when the immersion medium is water, the static/dynamic contact angle of the surface of the resist film with respect to water can be increased, thereby enhancing the immersion water tracking property.

Although the hydrophobic resin (HR) is unevenly localized in the interface as mentioned above, as different from surfactants, the hydrophobic resin does not necessarily have to have a hydrophilic group in its molecule and does not need to contribute toward uniform mixing of polar/nonpolar substances.

The hydrophobic resin typically contains a fluorine atom and/or a silicon atom. The fluorine atom and/or silicon atom may be introduced in the principal chain of the resin or a side chain thereof.

When the hydrophobic resin contains a fluorine atom, it is preferred for the resin to comprise, as a partial structure containing a fluorine atom, an alkyl group containing a fluorine atom, a cycloalkyl group containing a fluorine atom or an aryl group containing a fluorine atom.

The alkyl group containing a fluorine atom is a linear or branched alkyl group having at least one hydrogen atom thereof substituted with a fluorine atom. This alkyl group preferably has 1 to 10 carbon atoms, more preferably 1 to 4 carbon atoms. A substituent other than the fluorine atom may further be introduced in the alkyl group containing a fluorine atom.

The cycloalkyl group containing a fluorine atom is a mono- or polycycloalkyl group having at least one hydrogen atom thereof substituted with a fluorine atom. A substituent other than the fluorine atom may further be introduced in the cycloalkyl group containing a fluorine atom.

The aryl group containing a fluorine atom is an aryl group having at least one hydrogen atom thereof substituted with a fluorine atom. As the aryl group, there can be mentioned, for example, a phenyl or naphthyl group. A substituent other than the fluorine atom may further be introduced in the aryl group containing a fluorine atom.

As preferred examples of the alkyl groups each containing a fluorine atom, cycloalkyl groups each containing a fluorine atom and aryl groups each containing a fluorine atom, there can be mentioned the groups of general formulae (F2) to (F4) below.

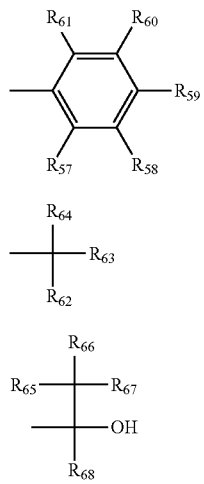

In general formulae (F2) to (F4), each of $R_{57}$ to $R_{68}$ independently represents a hydrogen atom, a fluorine atom or an alkyl group, provided that at least one of $R_{57}$ to $R_{61}$ represents a fluorine atom or an alkyl group having at least one hydrogen atom thereof substituted with a fluorine atom, provided that at least one of $R_{62}$ to $R_{64}$ represents a fluorine atom or an alkyl group having at least one hydrogen atom thereof substituted with a fluorine atom, and provided that at least one of $R_{65}$ to $R_{68}$ represents a fluorine atom or an alkyl group having at least one hydrogen atom thereof substituted with a fluorine atom. It is preferred for each of these alkyl groups to have 1 to 4 carbon atoms.

Specific examples of the repeating units having a fluorine atom will be shown below.

In the specific examples, $X_1$ represents a hydrogen atom, —$CH_3$, —F or —$CF_3$. $X_2$ represents —F or —$CF_3$.

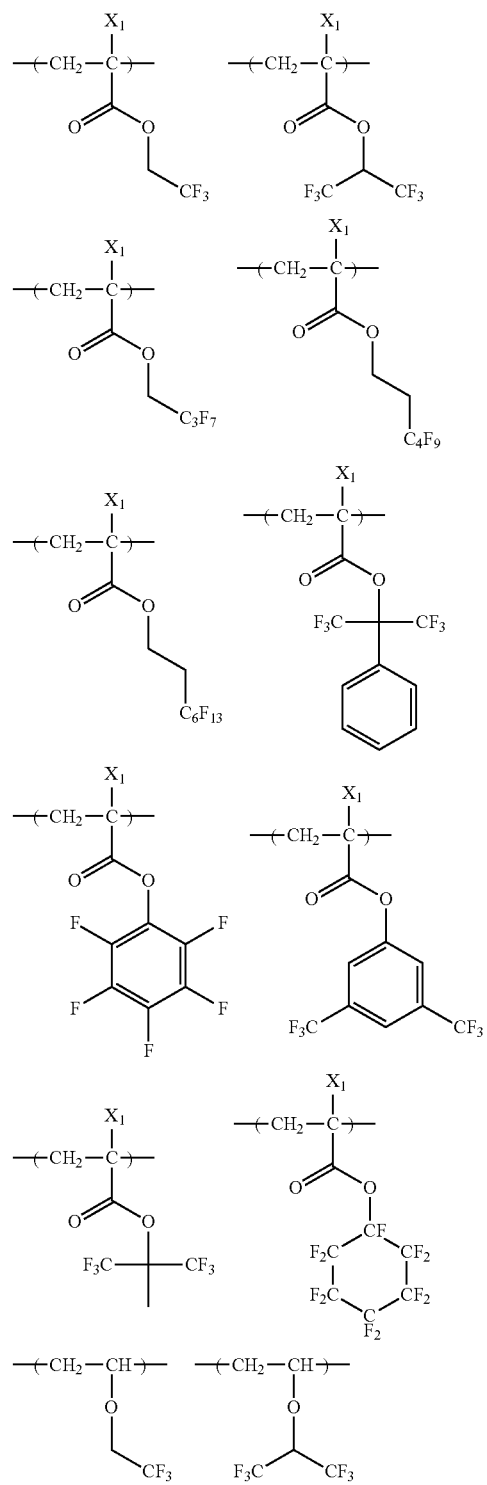

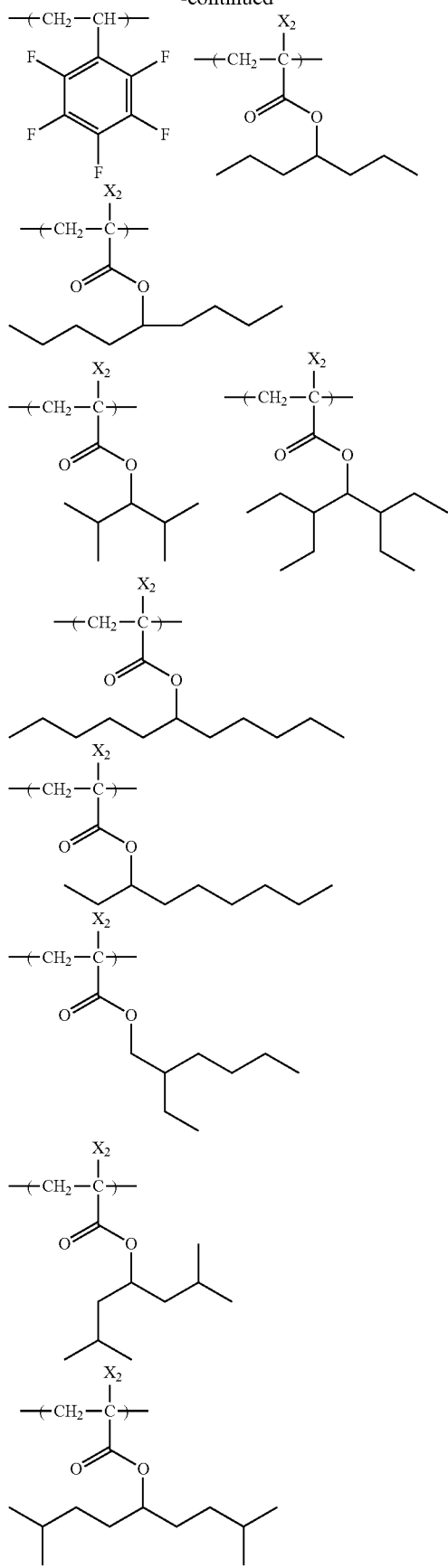

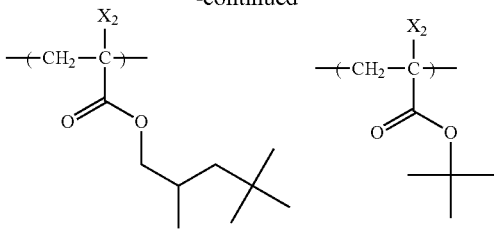

When the hydrophobic resin contains a silicon atom, it is preferred for the resin to comprise, as a partial structure containing a silicon atom, an alkylsilyl structure or a cyclosiloxane structure. This alkylsilyl structure is preferably a structure containing a trialkylsilyl group.

As preferred examples of the alkylsilyl structures and cyclosiloxane structures, there can be mentioned the groups of general formulae (CS-1) to (CS-3) below.

(CS-1)

(CS-2)

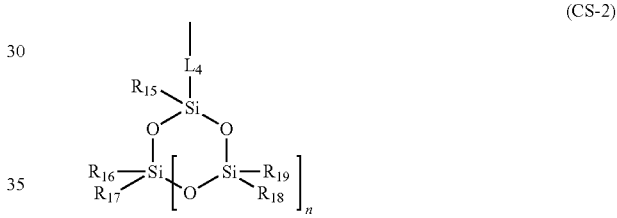

(CS-3)

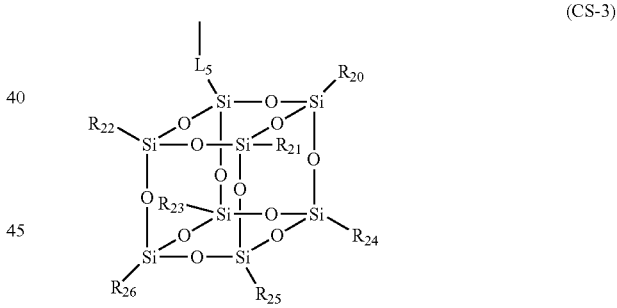

In general formulae (CS-1) to (CS-3), each of $R_{12}$ to $R_{26}$ independently represents a linear or branched alkyl group or a cycloalkyl group. The alkyl group is preferably one having 1 to 20 carbon atoms. The cycloalkyl group is preferably one having 3 to 20 carbon atoms.

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5, preferably an integer of 2 to 4.

Specific examples of the repeating units having the groups of general formulae (CS-1) to (CS-3) will be shown below.

In the specific examples, $X_1$ represents a hydrogen atom, —$CH_3$, —F or —$CF_3$.

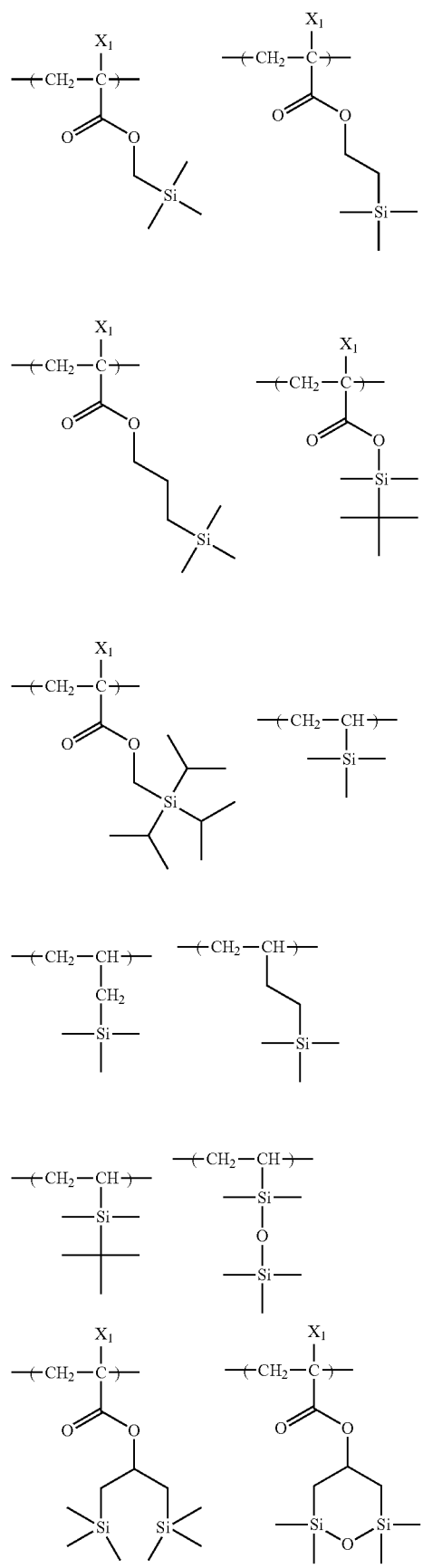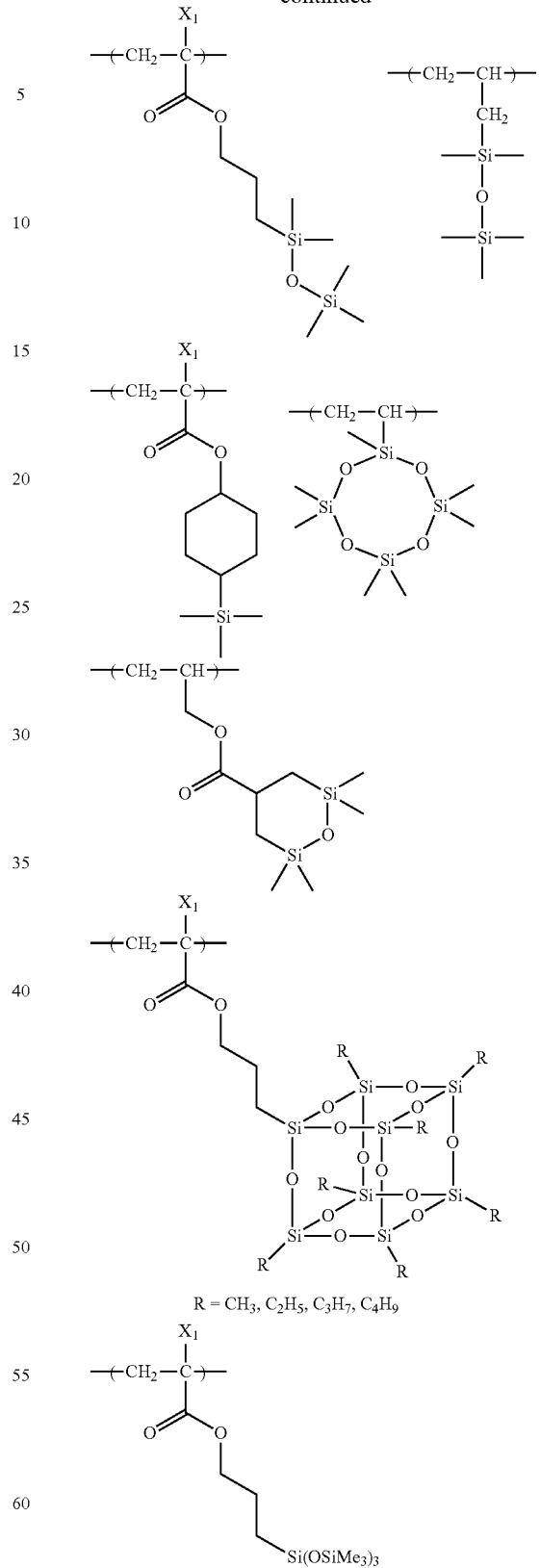
R = CH₃, C₂H₅, C₃H₇, C₄H₉
The hydrophobic resin may further contain at least one group selected from the group consisting of the following groups (x) to (z).

Namely, (x) an acid group, (y) a group with a lactone structure, an acid anhydride group or an acid imido group, and (y) an acid-decomposable group.

As the acid group (x), there can be mentioned, for example, a phenolic hydroxyl group, a carboxylic acid group, a fluoroalcohol group, a sulfonic acid group, a sulfonamido group, a sulfonimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl) imido group, a bis(alkylsulfonyl)methylene group, a bis(alkylsulfonyl)imido group, a tris(alkylcarbonyl)methylene group or a tris(alkylsulfonyl)methylene group. As preferred acid groups, there can be mentioned a fluoroalcohol group, a sulfonimido group and a bis(alkylcarbonyl)methylene group. As a preferred fluoroalcohol group, there can be mentioned a hexafluoroisopropanol group.

The repeating unit containing an acid group is, for example, a repeating unit wherein the acid group is directly bonded to the principal chain of a resin, such as a repeating unit derived from acrylic acid or methacrylic acid. Alternatively, this repeating unit may be a repeating unit wherein the acid group is bonded via a connecting group to the principal chain of a resin. Still alternatively, this repeating unit may be a repeating unit wherein the acid group is introduced in a terminal of the resin by using a chain transfer agent or polymerization initiator containing the acid group in the stage of polymerization.

The content of the repeating unit containing an acid group based on all the repeating units of the hydrophobic resin is preferably in the range of 1 to 50 mol %, more preferably 3 to 35 mol % and further more preferably 5 to 20 mol %.

Particular examples of the repeating units each containing an acid group are shown below. In the formulae, Rx represents a hydrogen atom, $CH_3$, $CF_3$ or $CH_2OH$.

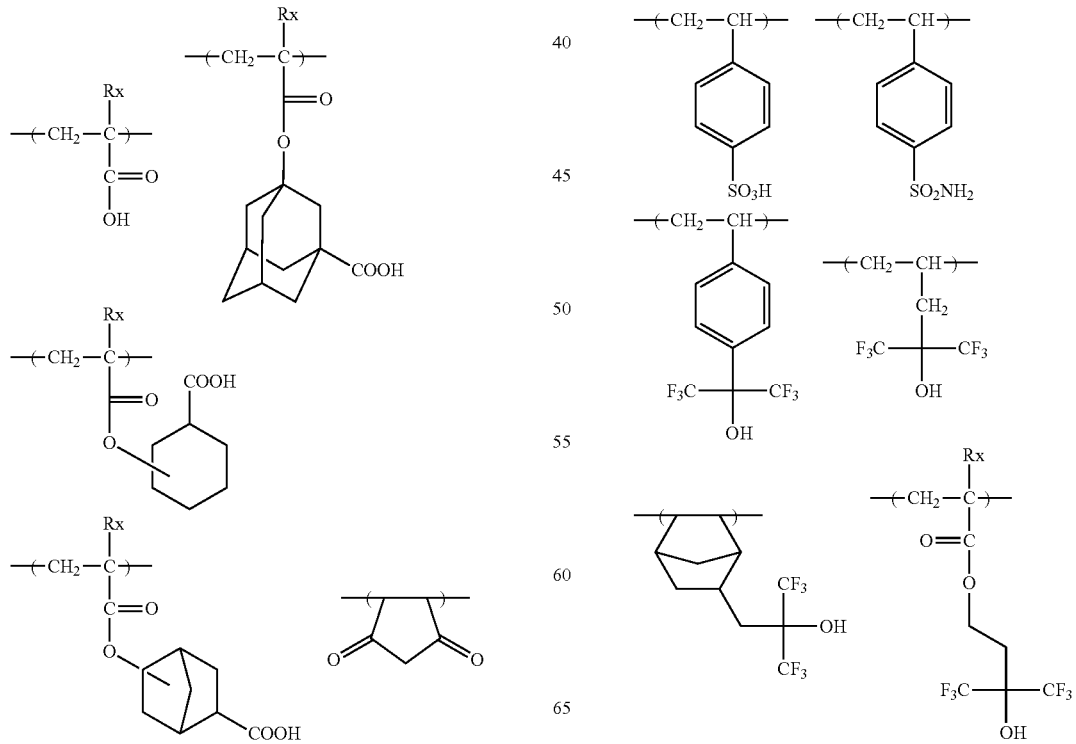

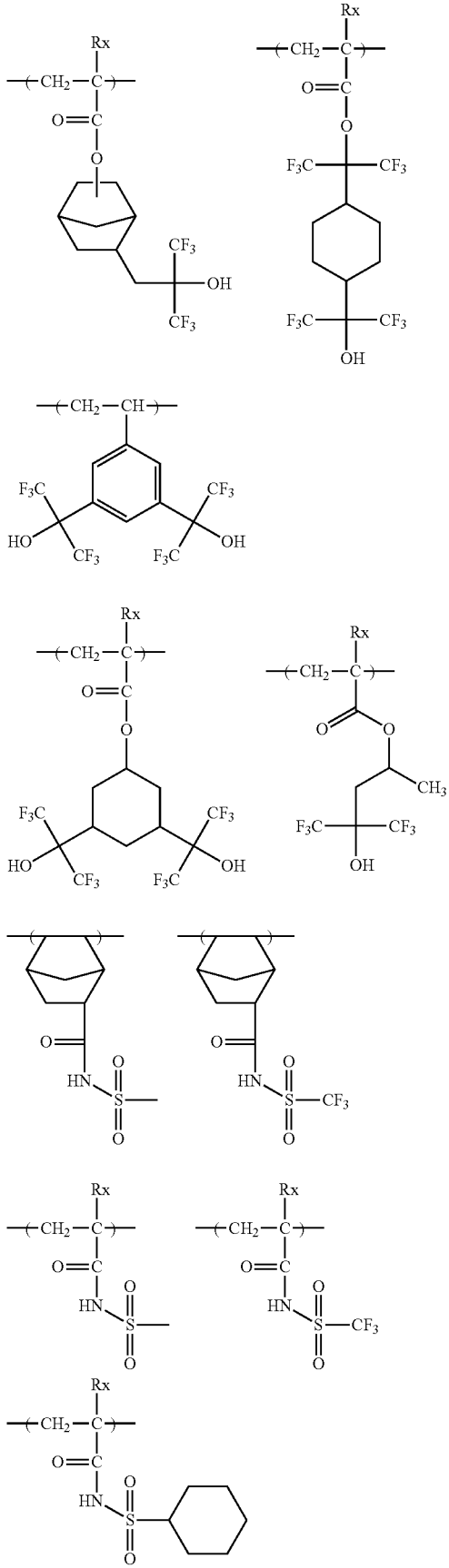

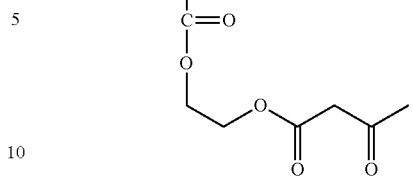

Among the group with a lactone structure, acid anhydride group and acid imido group (y), the group with a lactone structure is especially preferred.

The repeating unit containing any of these groups is, for example, a repeating unit wherein the group is directly bonded to the principal chain of a resin, such as a repeating unit derived from an acrylic ester or a methacrylic ester. Alternatively, this repeating unit may be a repeating unit wherein the group is bonded via a connecting group to the principal chain of a resin. Still alternatively, this repeating unit may be a repeating unit wherein the group is introduced in a terminal of the resin by using a chain transfer agent or polymerization initiator containing the group in the stage of polymerization.

The repeating units each containing a group with a lactone structure can be, for example, the same as the repeating units each with a lactone structure described above in the section of the resin (A).

The content of the repeating unit containing a group with a lactone structure, an acid anhydride group or an acid imido group, based on all the repeating units of the hydrophobic resin, is preferably in the range of 1 to 40 mol %, more preferably 3 to 30 mol % and further more preferably 5 to 15 mol %.

As the acid-decomposable group (z), there can be mentioned, for example, those set forth above in the section of the acid-decomposable resin (A).

The content of the repeating unit containing an acid-decomposable group, based on all the repeating units of the hydrophobic resin, is preferably in the range of 1 to 80 mol %, more preferably 10 to 80 mol % and further more preferably 20 to 60 mol %.

The hydrophobic resin may contain any of the repeating units of general formula (III') below.

$$\left(\begin{array}{c} H_2 \\ C \end{array} - \begin{array}{c} R_{c31} \\ | \\ C \\ | \\ L_{c3} \\ | \\ R_{c32} \end{array}\right) \quad (III')$$

In general formula (III'), $R_{c31}$ represents a hydrogen atom, an alkyl group (optionally substituted with a fluorine atom or the like), a cyano group or —$CH_2$—O—$Rac_2$ group, wherein $Rac_2$ represents a hydrogen atom, an alkyl group or an acyl group.

$R_{c31}$ is preferably a hydrogen atom, a methyl group or a trifluoromethyl group, especially preferably a hydrogen atom or a methyl group.

$R_{c32}$ represents a group having any of an alkyl group, a cycloalkyl group, an alkenyl group, a cycloalkenyl group and an aryl group. Thease groups may optionally be substituted with a group having a fluorine atom or a silicon atom.

$L_{c3}$ represents a single bond or a bivalent connecting group.

As the bivalent connecting group represented by $L_{c3}$, there can be mentioned, for example, an alkylene group (preferably having 1 to 5 carbon atoms), an oxy group, a phenylene group, an ester bond (group of the formula —COO—), or a group comprising a combination of two or more of these. The total number of carbon atoms in the bivalent connecting group is preferably in the range of 1 to 12.

The hydrophobic resin may contain any of the repeating units of general formula (CII-AB) below.

(CII-AB)

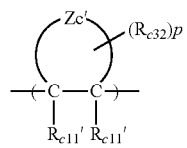

In formula (CII-AB),

Each of $R_{c11}'$ and $R_{c12}'$ independently represents a hydrogen atom, a cyano group, a halogen atom or an alkyl group. Zc' represents an atomic group required for forming an alicyclic structure in cooperation with two carbon atoms (C—C) to which $R_{c11}'$ and $R_{c12}'$ are respectively bonded.

$R_{c32}$ is a substituent that is introduced in the alicyclic structure. The definition thereof is the same as that of $R_{c32}$ of general formula (III').

In the formula, p is an integer of 0 to 3, preferably 0 or 1.

Specific examples of the repeating units of general formula (III') and general formula (CII-AB) will be shown below. In the formulae, Ra represents H, $CH_3$, $CH_2OH$, $CF_3$ or CN.

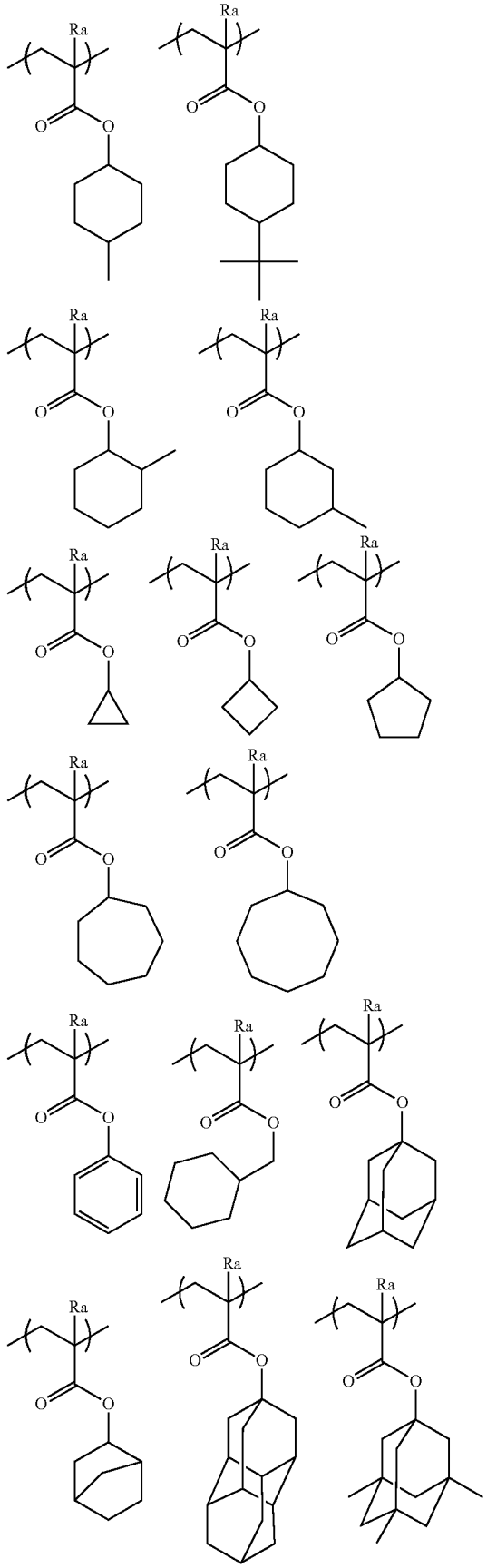

-continued

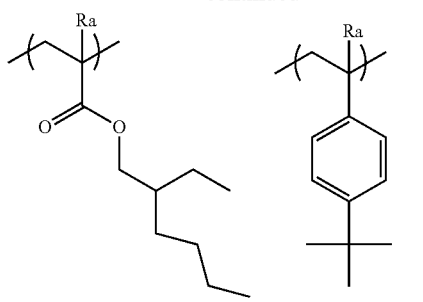
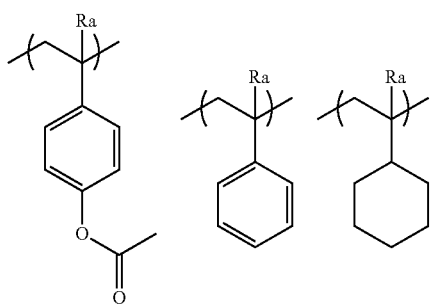
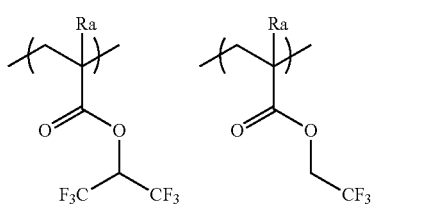
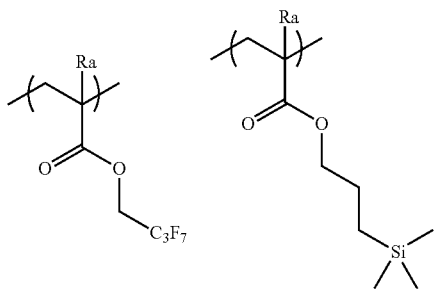
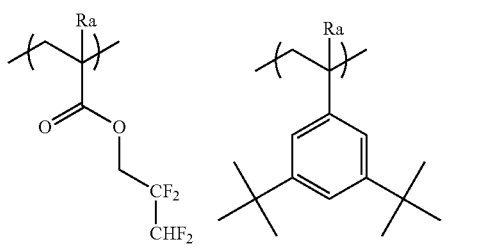
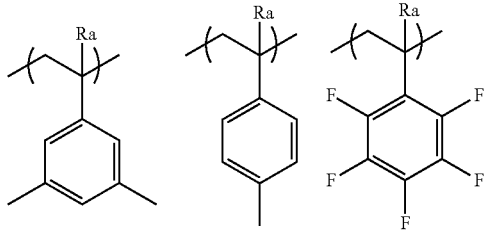

-continued

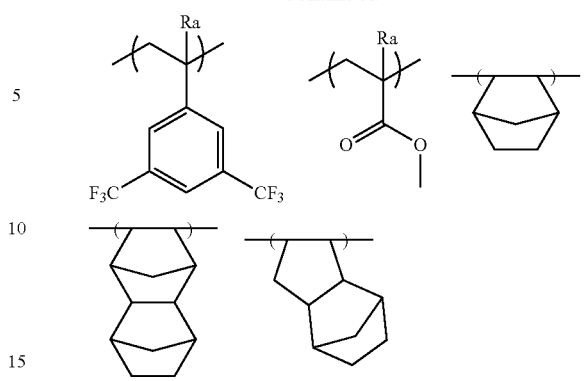

When the hydrophobic resin (HR) contains any of the repeating units of general formulae (III') and (CII-AB), the content of such a repeating unit, based on all the repeating units constructing the hydrophobic resin (HR), is preferably in the range of 1 to 100 mol %, more preferably 5 to 95 mol % and further more preferably 20 to 80 mol %.

Specific examples of the hydrophobic resins (HR) will be shown below. The following Table 2 shows the molar ratio of individual repeating units (corresponding to individual repeating units in order from the left), weight average molecular weight and degree of dispersal (Mw/Mn) with respect to each of the resins.

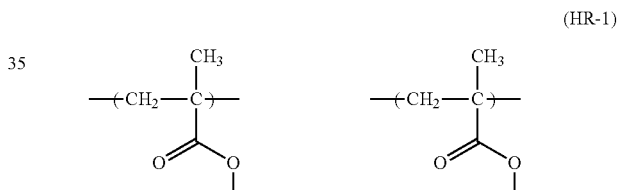
(HR-1)

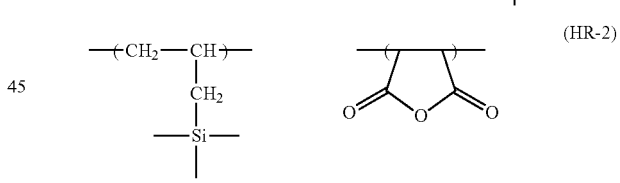
(HR-2)

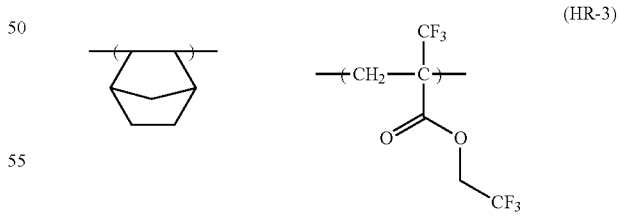
(HR-3)

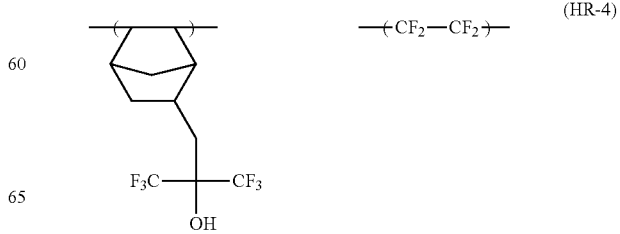
(HR-4)

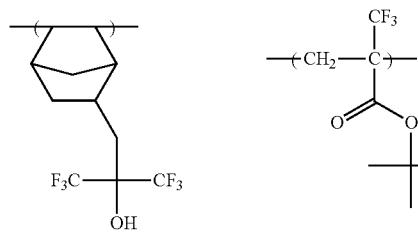
(HR-5)
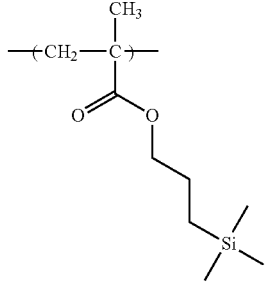
(HR-11)
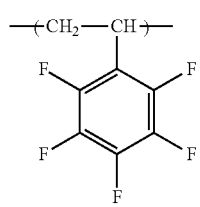
(HR-6)
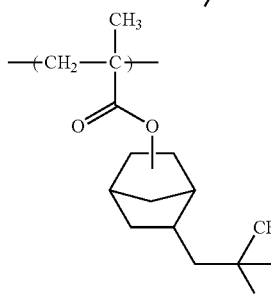
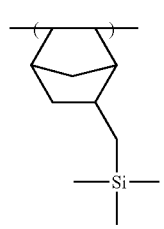
(HR-7)
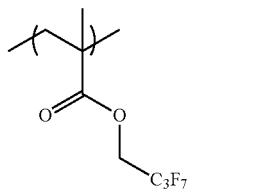
(HR-12)
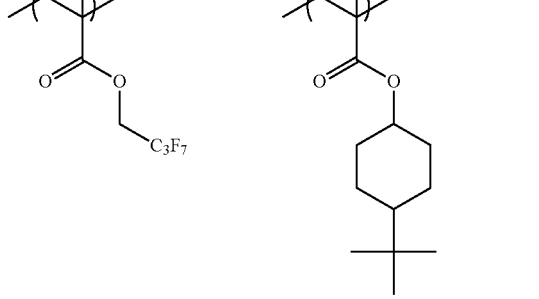
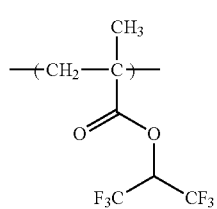
(HR-8)
(HR-9)
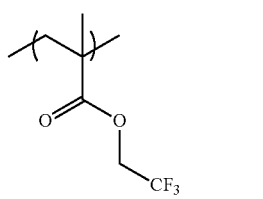
(HR-13)
(HR-10)
(HR-14)
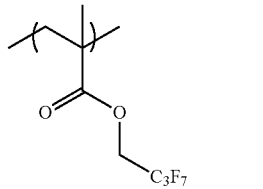
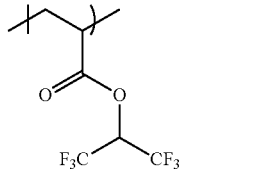
(HR-15)

(HR-16) 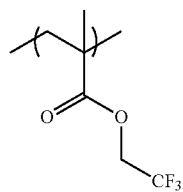
(HR-17) 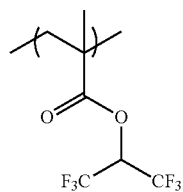
(HR-18) 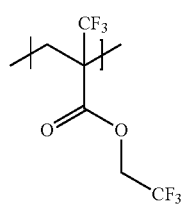
(HR-19) 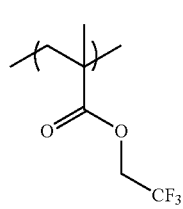
(HR-20) 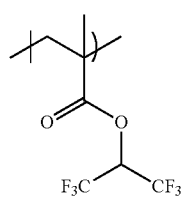
(HR-21) 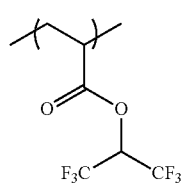
(HR-22) 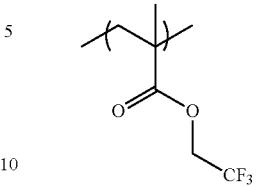 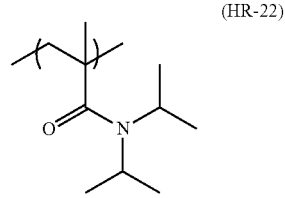
(HR-23) 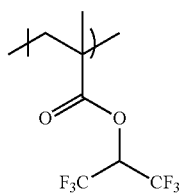 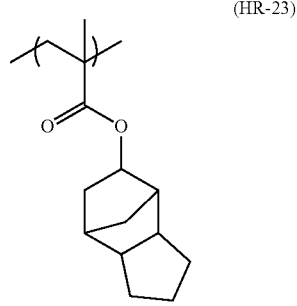
(HR-24) 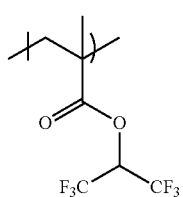 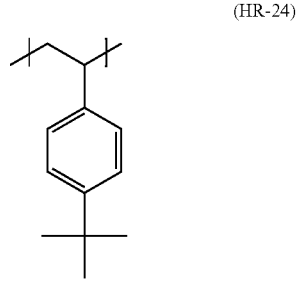
(HR-25) 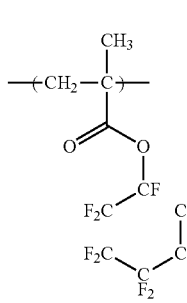 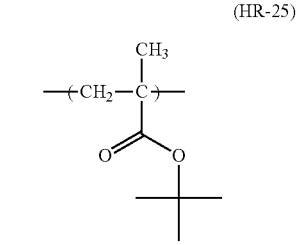
(HR-26) 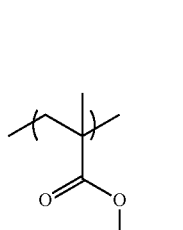 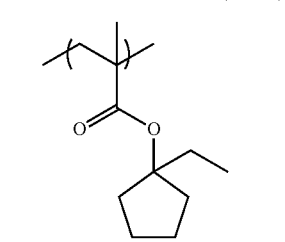

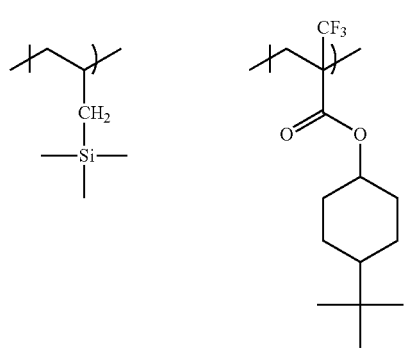
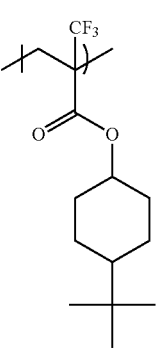
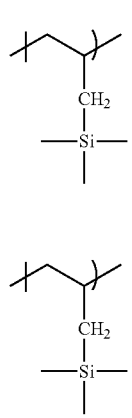
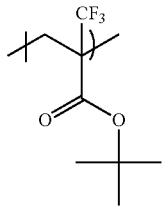
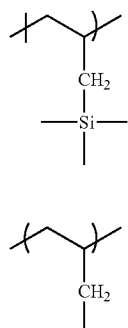
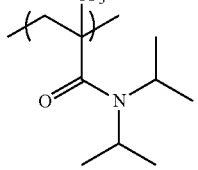
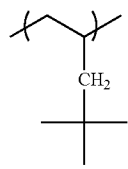
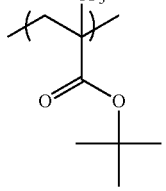
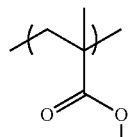
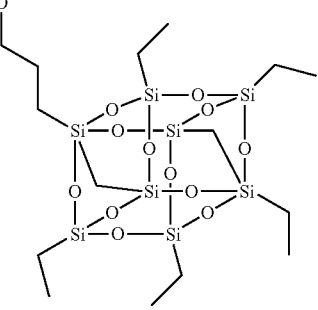
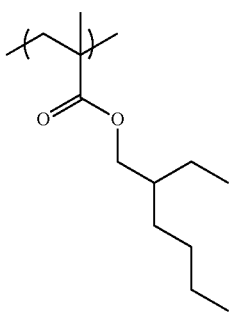
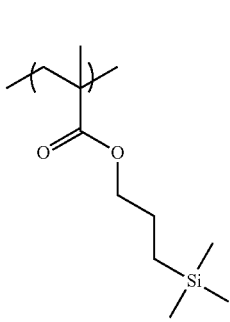
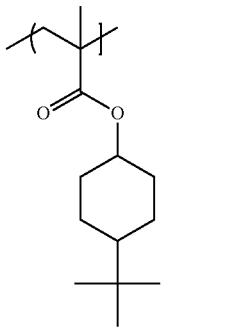
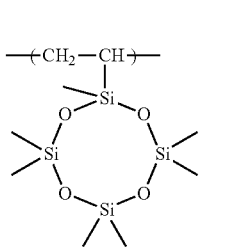
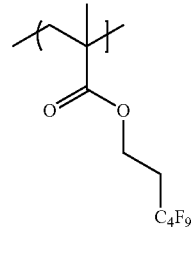
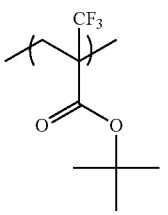
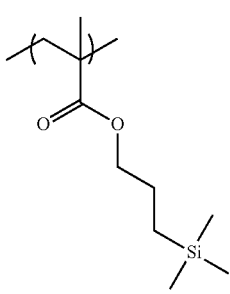
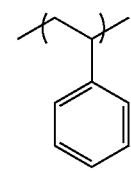

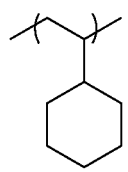 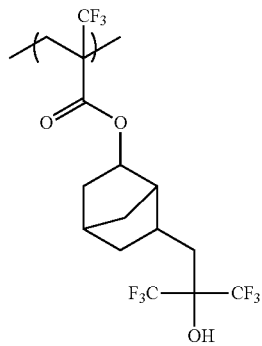 (HR-36)
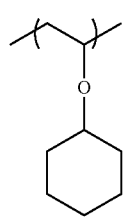 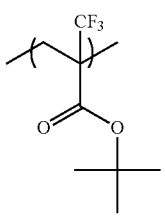 (HR-37)
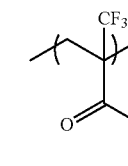 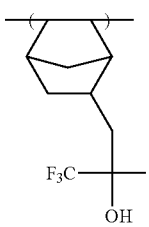 (HR-38)
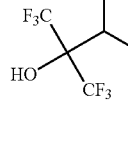 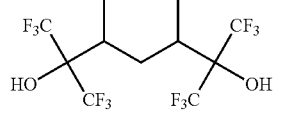 (HR-39)
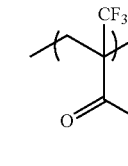 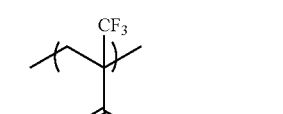 (HR-40)
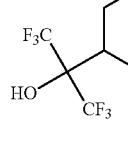 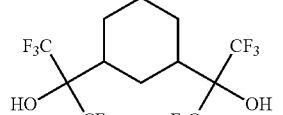 (HR-41)
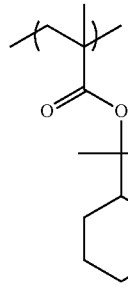 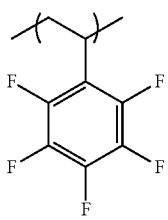 (HR-42)
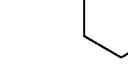 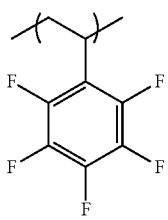 (HR-43)
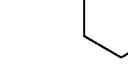 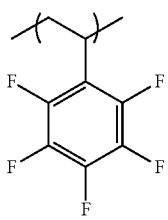 (HR-44)
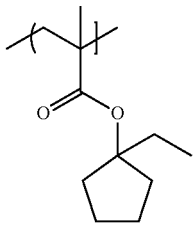 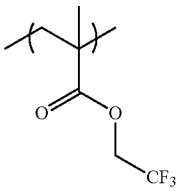 (HR-41)
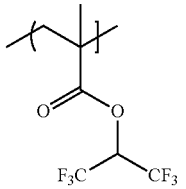 (HR-42)
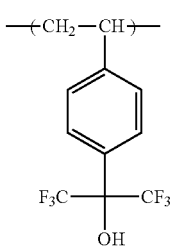 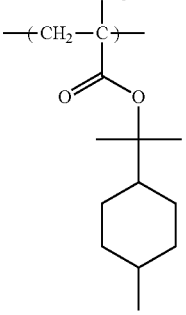 (HR-43)
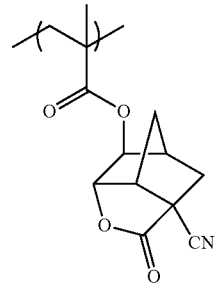 (HR-44)
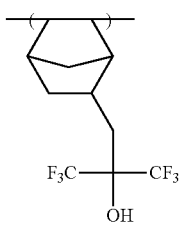 (HR-45)
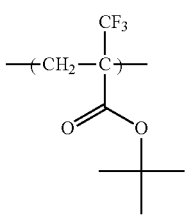

(HR-46)
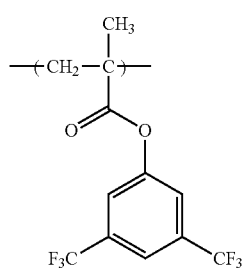
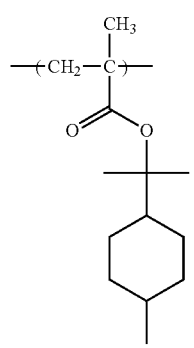
(HR-47)
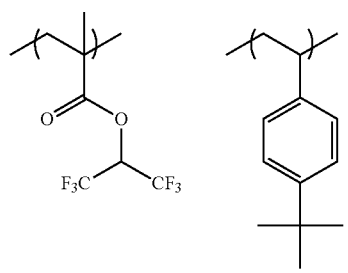
(HR-48)
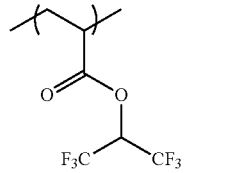
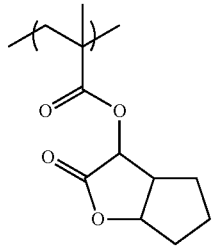
(HR-49)
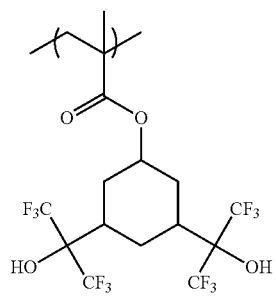
(HR-50)
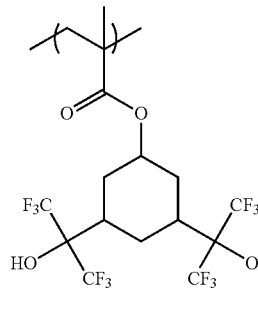
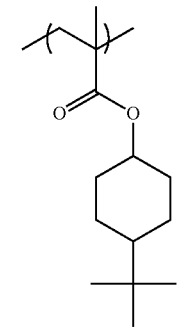
(HR-51)
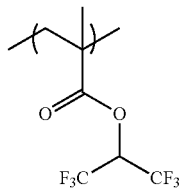
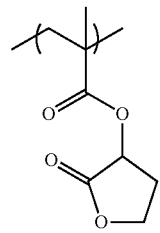
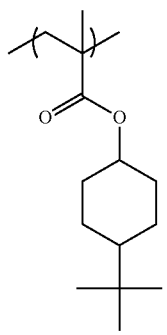
(HR-52)
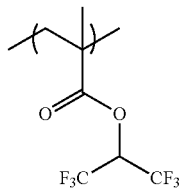
(HR-53)
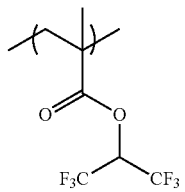
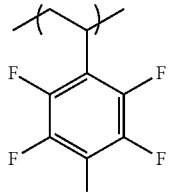
(HR-54)
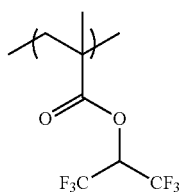
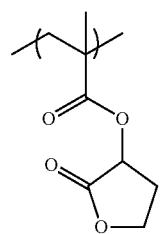

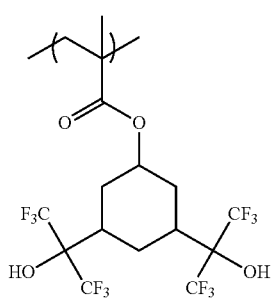
(HR-55)
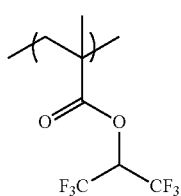
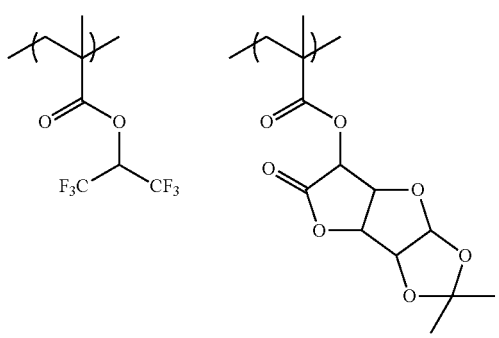
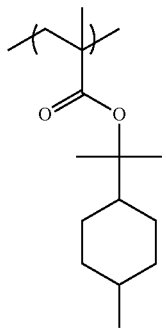
(HR-56)
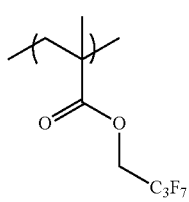
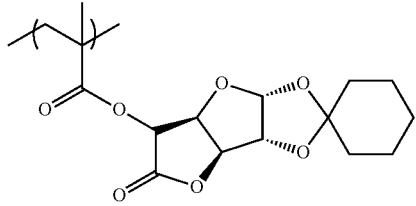
(HR-57)
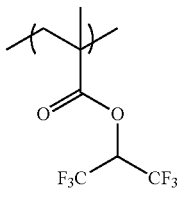
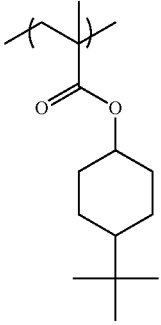
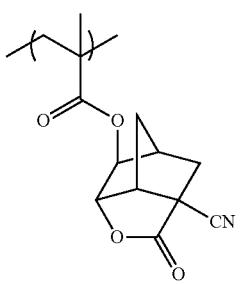
(HR-58)
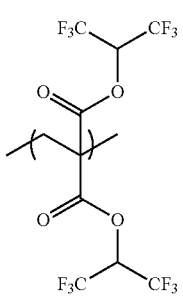
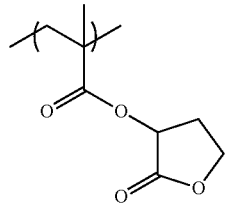
(HR-59)
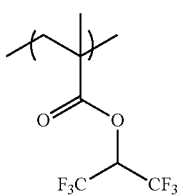
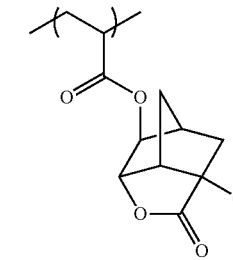
(HR-60)
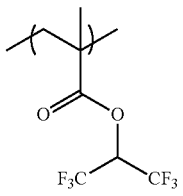
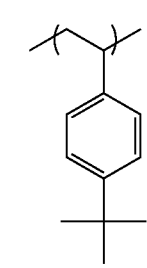

-continued
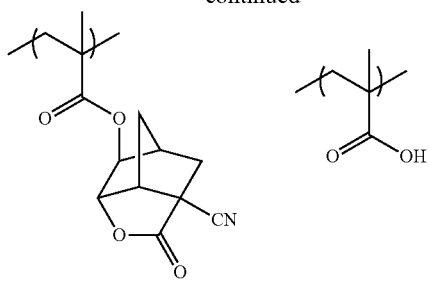
(HR-61)
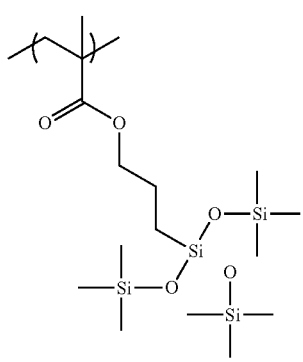
(HR-62)
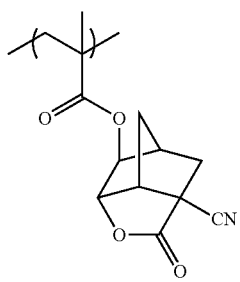
(HR-63)
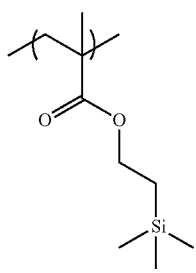
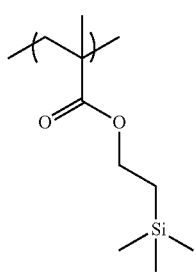
-continued
(HR-64)
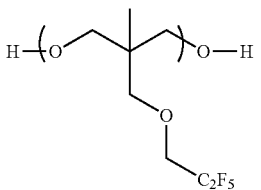
(HR-65)
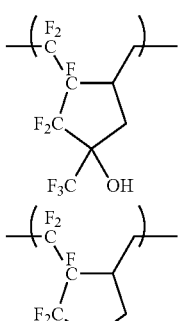
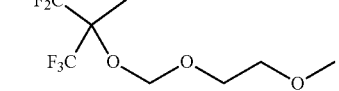
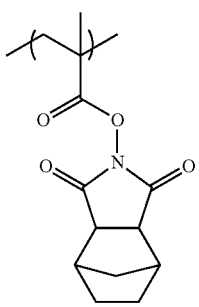
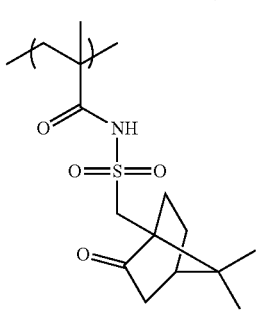
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |

TABLE 1-continued

| Resin | Composition | Mw | Mw/Mn |
|---|---|---|---|
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

When the hydrophobic resin contains a fluorine atom, the content of fluorine atom(s) is preferably in the range of 5 to 80 mass %, more preferably 10 to 80 mass %, based on the molecular weight of the hydrophobic resin. The content of the repeating unit containing a fluorine atom is preferably in the range of 10 to 100 mass %, more preferably 30 to 100 mass %, based on all the repeating units of the hydrophobic resin.

When the hydrophobic resin contains a silicon atom, the content of silicon atom(s) is preferably in the range of 2 to 50 mass %, more preferably 2 to 30 mass %, based on the molecular weight of the hydrophobic resin. The content of the repeating unit containing a silicon atom is preferably in the range of 10 to 100 mass %, more preferably 20 to 100 mass %, based on all the repeating units of the hydrophobic resin.

The weight average molecular weight of the hydrophobic resin is preferably in the range of 1000 to 100,000, more preferably 1000 to 50,000 and still more preferably 2000 to 15,000.

From the viewpoint of resolving power, pattern profile, roughness property, etc., the degree of dispersal of the hydrophobic resin is preferably in the range of 1 to 5, more preferably 1 to 3 and still more preferably 1 to 2.

The hydrophobic resins may be used either individually or in combination. The content of the hydrophobic resin in the composition is preferably in the range or 0.01 to 10 mass %, more preferably 0.05 to 8 mass % and still more preferably 0.1 to 5 mass % based on the total solid of the composition of the present invention.

A variety of commercially available products can be used as the hydrophobic resin, and also the resin can be synthesized in accordance with conventional methods. As general synthesizing methods, there can be mentioned, for example, the same method as mentioned with respect to the resin (A).

Impurities, such as metals, should naturally be of low quantity in the hydrophobic resin. The content of residual monomers and oligomer components is preferably 0 to 10 mass %, more preferably 0 to 5 mass % and still more preferably 0 to 1 mass %. Accordingly, there can be obtained a resist being free from a change of in-liquid foreign matter, sensitivity, etc. over time.

[3-6] Surfactant (F)

The composition of the present invention may further contain a surfactant. When the composition contains a surfactant, the composition preferably contains any one, or two or more members, of fluorinated and/or siliconized surfactants (fluorinated surfactant, siliconized surfactant and surfactant containing both fluorine and silicon atoms).

The composition of the present invention when containing the above surfactant would, in the use of an exposure light source of 250 nm or below, especially 220 nm or below, realize favorable sensitivity and resolving power and produce a resist pattern with less adhesion and development defects.

As fluorinated and/or siliconized surfactants, there can be mentioned, for example, those described in section [0276] of US 2008/0248425 A1. As useful commercially available surfactants, there can be mentioned, for example, fluorinated surfactants/siliconized surfactants, such as Eftop EF301 and EF303 (produced by Shin-Akita Kasei Co., Ltd.), Florad FC 430, 431 and 4430 (produced by Sumitomo 3M Ltd.), Megafac F171, F173, F176, F189, F113, F110, F177, F120 and R08 (produced by Dainippon Ink & Chemicals, Inc.), Surflon S-382, SC101, 102, 103, 104, 105 and 106 (produced by Asahi Glass Co., Ltd.), Troy Sol S-366 (produced by Troy Chemical Co., Ltd.), GF-300 and GF-150 (produced by TOA-GOSEI CO., LTD.), Sarfron S-393 (produced by SEIMI CHEMICAL CO., LTD.), Eftop EF121, EF122A, EF122B, RF122C, EF125M, EF135M, EF351, EF352, EF801, EF802 and EF601 (produced by JEMCO INC.), PF636, PF656, PF6320 and PF6520 (produced by OMNOVA), and FTX-204G, 208G, 218G, 230G, 204D, 208D, 212D, 218D and 222D (produced by NEOS). Further, polysiloxane polymer KP-341 (produced by Shin-Etsu Chemical Co., Ltd.) can be employed as the siliconized surfactant.

As the surfactant, besides the above publicly known surfactants, use can be made of a surfactant based on a polymer having a fluorinated aliphatic group derived from a fluorinated aliphatic compound, produced by a telomerization technique (also called a telomer process) or an oligomerization technique (also called an oligomer process). The fluorinated aliphatic compound can be synthesized by the process described in JP-A-2002-90991.

As such a surfactant, there can be mentioned, for example, Megafac F178, F-470, F-473, F-475, F-476 or F-472 (produced by Dainippon Ink & Chemicals, Inc.). Further, there can be mentioned a copolymer from an acrylate (or methacrylate) having a $C_6F_{13}$ group and a poly(oxyalkylene) acrylate (or methacrylate), a copolymer from an acrylate (or methacrylate) having a $C_3F_7$ group, poly(oxyethylene) acrylate (or methacrylate) and poly(oxypropylene) acrylate (or methacrylate), or the like.

In the present invention, surfactants other than the fluorinated and/or siliconized surfactants can also be employed. In particular, there can be mentioned, for example, those described in section [0280] of US 2008/0248425 A1.

These surfactants may be used either individually or in combination.

When the composition contain the surfactant, the amount of the surfactant used is preferably in the range of 0.0001 to 2 mass %, more preferably 0.0005 to 1 mass % based on the total mass of the composition of the present invention (excluding the solvent).

On the other hand, when the amount of surfactant added is controlled at 10 ppm or less based on the whole amount (excluding the solvent) of the resist composition, the uneven distribution of the hydrophobic resin in the surface portion is promoted, so that the surface of the resist film can be rendered highly hydrophobic, thereby enhancing the water tracking property in the stage of liquid-immersion exposure.

[3-7] Basic Compound or Compound (H) Whose Basicity is Increased by the Action of an Acid The composition of the present invention preferably contains at least one compound (H) selected from a basic compound and a compound whose basicity is increased by the action of an acid so as to decrease any performance alteration over time from exposure to heating.

As preferred basic compounds, there can be mentioned the compounds having the structures of the following formulae (A) to (E).

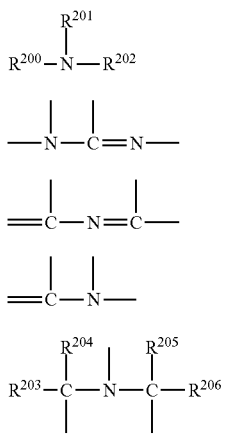

In the general formulae (A) and (E), $R^{200}$, $R^{201}$ and $R^{202}$ may be identical to or different from each other and each represent a hydrogen atom, an alkyl group (preferably having 1 to 20 carbon atoms), a cycloalkyl group (preferably having 3 to 20 carbon atoms) or an aryl group (having 6 to 20 carbon atoms). $R^{201}$ and $R^{202}$ may be bonded with each other to thereby form a ring. $R^{203}$, $R^{204}$, $R^{205}$ and $R^{206}$ may be identical to or different from each other and each represent an alkyl group having 1 to 20 carbon atoms.

With respect to the above alkyl group, as a preferred substituted alkyl group, there can be mentioned an aminoalkyl group having 1 to 20 carbon atoms, a hydroxyalkyl group having 1 to 20 carbon atoms or a cyanoalkyl group having 1 to 20 carbon atoms.

More preferably, in these general formulae (A) and (E) the alkyl group is unsubstituted.

As preferred compounds, there can be mentioned guanidine, aminopyrrolidine, pyrazole, pyrazoline, piperazine, aminomorpholine, aminoalkylmorpholine, piperidine and the like. Further, as preferred compounds, there can be mentioned compounds with an imidazole structure, a diazabicyclo structure, an onium hydroxide structure, an onium carboxylate structure, a trialkylamine structure, an aniline structure or a pyridine structure, alkylamine derivatives having a hydroxyl group and/or an ether bond, aniline derivatives having a hydroxyl group and/or an ether bond and the like.

As the compounds with an imidazole structure, there can be mentioned imidazole, 2,4,5-triphenylimidazole, benzimidazole, 2-phenylbenzoimidazole and the like. As the compounds with a diazabicyclo structure, there can be mentioned 1,4-diazabicyclo[2,2,2]octane, 1,5-diazabicyclo[4,3,0]non-5-ene, 1,8-diazabicyclo[5,4,0]undec-7-ene and the like. As the compounds with an onium hydroxide structure, there can be mentioned tetrabutylammonium hydroxide, triarylsulfonium hydroxide, phenacylsulfonium hydroxide, and sulfonium hydroxides having a 2-oxoalkyl group such as triphenylsulfonium hydroxide, tris(t-butylphenyl)sulfonium hydroxide, bis(t-butylphenyl)iodonium hydroxide, phenacylthiophenium hydroxide, 2-oxopropylthiophenium hydroxide and the like. As the compounds with an onium carboxylate structure, there can be mentioned those having a carboxylate at the anion moiety of the compounds with an onium hydroxide structure, for example, acetate, adamantane-1-carboxylate, perfluoroalkyl carboxylate and the like. As the compounds with a trialkylamine structure, there can be mentioned tri(n-butyl)amine, tri(n-octyl)amine and the like. As the aniline compounds, there can be mentioned 2,6-diisopropylaniline, N,N-dimethylaniline, N,N-dibutylaniline, N,N-dihexylaniline and the like. As the alkylamine derivatives having a hydroxyl group and/or an ether bond, there can be mentioned ethanolamine, diethanolamine, triethanolamine, N-phenyldiethanolamine, tris(methoxyethoxyethyl) amine and the like. As the aniline derivatives having a hydroxyl group and/or an ether bond, there can be mentioned N,N-bis(hydroxyethyl)aniline and the like.

As preferred basic compounds, there can be further mentioned an amine compound having a phenoxy group, an ammonium salt compound having a phenoxy group, an amine compound having a sulfonic ester group and an ammonium salt compound having a sulfonic ester group.

Each of the above amine compound having a phenoxy group, ammonium salt compound having a phenoxy group, amine compound having a sulfonic ester group and ammonium salt compound having a sulfonic ester group preferably has at least one alkyl group bonded to the nitrogen atom thereof. Further preferably, the alkyl group in its chain contains an oxygen atom, thereby forming an oxyalkylene group. The number of oxyalkylene groups in each molecule is one or more, preferably 3 to 9 and more preferably 4 to 6. Oxyalkylene groups having the structure of —CH$_2$CH$_2$O—, —CH(CH$_3$)CH$_2$O— or —CH$_2$CH$_2$CH$_2$O— are preferred.

As specific examples of the above amine compound having a phenoxy group, ammonium salt compound having a phenoxy group, amine compound having a sulfonic ester group and ammonium salt compound having a sulfonic ester group, there can be mentioned the compounds (C1-1) to (C3-3) shown as examples in Section [0066] of US 2007/0224539 A, which are however nonlimiting.

The molecular weight of compound (H) is preferably 250 to 2000, more preferably 400 to 1000.

Compound (H) may be used either individually or in combination.

When the composition contains compound (H), the content of compound (H) is preferably in the range of 0.05 to 8.0 mass %, more preferably 0.05 to 5.0 mass % and most preferably 0.05 to 4.0 mass % based on the total solids of the composition.

With respect to the ratio of the acid generator to compound (H) used in the composition, preferably, the acid generator/compound (H) (molar ratio)=2.5 to 300. The reason for this is that the molar ratio is preferred to be 2.5 or higher from the viewpoint of sensitivity and resolving power. The molar ratio is preferred to be 300 or below from the viewpoint of the inhibition of any resolving power deterioration due to thickening of resist pattern over time from exposure to heating treatment. The acid generator/compound (H) (molar ratio) is more preferably in the range of 5.0 to 200, still more preferably 7.0 to 150.

[3-8] Basic Compound and Ammonium Salt Compound that when Exposed to Actinic Rays or Radiation, Exhibit Lowered Basicity The resist composition of the present invention may contain a basic compound or ammonium salt compound that when exposed to actinic rays or radiation, exhibits a lowered basicity (hereinafter also referred to as a "compound (PA)"). Namely, the compound (PA) is a compound that when exposed to actinic rays or radiation, undergoes a change of chemical structure, exhibiting photosensitivity.

It is preferred for the compound (PA) to be a compound (PA') containing a basic functional group or ammonium group and a group that when exposed to actinic rays or radiation, produces an acid functional group. Namely, it is preferred for the compound (PA) to be a basic compound containing a basic functional group and a group that when exposed to actinic rays or radiation, produces an acid functional group, or an ammonium salt compound containing an ammonium group and a group that when exposed to actinic rays or radiation, produces an acid functional group.

As the compounds each exhibiting a lowered basicity, produced by the decomposition of compound (PA) or compound (PA') upon exposure to actinic rays or radiation, there can be mentioned the compounds of general formulae (PA-I), (PA-II) and (PA-III) below. The compounds of general formulae (PA-II) and (PA-III) are especially preferred from the viewpoint of the higher-order simultaneous attainment of excellent effects concerning LWR and DOF.

First, the compounds of general formula (PA-I) will be described.

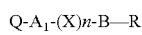 (PA-I)

In general formula (PA-I), $A_1$ represents a single bond or a bivalent connecting group.

Q represents —$SO_3H$ or —$CO_2H$. Q corresponds to the acid functional group produced upon exposure to actinic rays or radiation.

X represents —$SO_2$— or —CO—.

n is 0 or 1.

B represents a single bond, an oxygen atom or —N(Rx)—.

Rx represents a hydrogen atom or a monovalent organic group.

R represents a monovalent organic group containing a basic functional group or a monovalent organic group containing an ammonium group.

The bivalent connecting group represented by $A_1$ is preferably a bivalent connecting group having 2 to 12 carbon atoms. As such, there can be mentioned, for example, an alkylene group, a phenylene group or the like. An alkylene group containing at least one fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, an alkylene group, 30 to 100% of the hydrogen atoms of which are substituted with fluorine atoms, is preferred. It is more preferred for the carbon atom bonded to the Q-moiety to have a fluorine atom. Further, perfluoroalkylene groups are preferred. A perfluoroethylene group, a perfluoropropylene group and a perfluorobutylene group are more preferred.

The monovalent organic group represented by Rx preferably has 4 to 30 carbon atoms. As such, there can be mentioned, for example, an alkyl group, a cycloalkyl group, an aryl group, an aralkyl group, an alkenyl group or the like.

A substituent may be introduced in the alkyl group represented by Rx. The alkyl group is preferably a linear or branched alkyl group having 1 to 20 carbon atoms. An oxygen atom, a sulfur atom or a nitrogen atom may be introduced in the alkyl chain.

As the substituted alkyl group, in particular, there can be mentioned a linear or branched alkyl group substituted with a cycloalkyl group (for example, an adamantylmethyl group, an adamantylethyl group, a cyclohexylethyl group, a camphor residue, or the like).

A substituent may be introduced in the cycloalkyl group represented by Rx. The cycloalkyl group preferably has 3 to 20 carbon atoms. An oxygen atom may be introduced in the ring.

A substituent may be introduced in the aryl group represented by Rx. The aryl group preferably has 6 to 14 carbon atoms.

A substituent may be introduced in the aralkyl group represented by Rx. The aralkyl group preferably has 7 to 20 carbon atoms.

A substituent may be introduced in the alkenyl group represented by Rx. For example, there can be mentioned groups each resulting from the introduction of a double bond at an arbitrary position of any of the alkyl groups mentioned above as being represented by Rx.

As preferred partial structures of the basic functional groups, there can be mentioned, for example, the structures of a crown ether, a primary to tertiary amine and a nitrogenous heterocycle (pyridine, imidazole, pyrazine or the like).

As preferred partial structures of the ammonium groups, there can be mentioned, for example, the structures of a primary to tertiary ammonium, pyridinium, imidazolinium, pyrazinium and the like.

The basic functional group is preferably a functional group containing a nitrogen atom, more preferably a structure having a primary to tertiary amino group or a nitrogenous heterocyclic structure. In these structures, from the viewpoint of basicity increase, it is preferred for all the atoms adjacent to the nitrogen atom contained in each of the structures to be carbon atoms or hydrogen atoms. Further, from the viewpoint of basicity increase, it is preferred to avoid the direct bonding of electron-withdrawing functional groups (a carbonyl group, a sulfonyl group, a cyano group, a halogen atom, etc.) to nitrogen atoms.

With respect to the monovalent organic group (R-group) containing any of these structures, the monovalent organic group preferably has 4 to 30 carbon atoms. As such, there can be mentioned an alkyl group, a cycloalkyl group, an aryl group, an aralkyl group, an alkenyl group or the like. A substituent may be introduced in each of these groups.

The alkyl group, cycloalkyl group, aryl group, aralkyl group and alkenyl group contained in the alkyl group, cycloalkyl group, aryl group, aralkyl group and alkenyl group each containing a basic functional group or an ammonium group, represented by R are the same as the alkyl group, cycloalkyl group, aryl group, aralkyl group and alkenyl group set forth above as being represented by Rx.

As substituents that may be introduced in these groups, there can be mentioned, for example, a halogen atom, a hydroxyl group, a nitro group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 20 carbon atoms), an acyloxy group (preferably 2 to 10 carbon atoms), an alkoxycarbonyl group (preferably 2 to 20 carbon atoms), an aminoacyl group (preferably 2 to 20 carbon atoms) and the like. Further, with respect to the ring structure of the aryl group, cycloalkyl group, etc., an alkyl group (preferably 1 to 20 carbon atoms, more preferably 1 to 10 carbon atoms) can be mentioned as a substituent. Further, with respect to the aminoacyl group, one or two alkyl groups (each preferably 1 to 20 carbon atoms, more preferably 1 to 10 carbon atoms) can be mentioned as substituents. As the substituted alkyl groups, there can be mentioned, for example, perfluoroalkyl groups, such as a perfluoromethyl group, a perfluoroethyl group, a perfluoropropyl group and a perfluorobutyl group.

When B is —N(Rx)—, it is preferred for R and Rx to be bonded to each other to thereby form a ring. When a ring structure is formed, the stability thereof is enhanced, and thus the storage stability of the composition containing the same is enhanced. The number of carbon atoms constituting the ring is preferably in the range of 4 to 20. The ring may be monocyclic or polycyclic, and an oxygen atom, a sulfur atom or a nitrogen atom may be introduced in the ring.

As the monocyclic structure, there can be mentioned a 4- to 8-membered ring containing a nitrogen atom, or the like. As the polycyclic structure, there can be mentioned structures each resulting from a combination of two, three or more monocyclic structures. Substituents may be introduced in the monocyclic structure and polycyclic structure. As preferred substituents, there can be mentioned, for example, a halogen atom, a hydroxyl group, a cyano group, a carboxyl group, a carbonyl group, a cycloalkyl group (preferably 3 to 10 carbon atoms), an aryl group (preferably 6 to 14 carbon atoms), an alkoxy group (preferably 1 to 10 carbon atoms), an acyl group (preferably 2 to 15 carbon atoms), an acyloxy group (preferably 2 to 15 carbon atoms), an alkoxycarbonyl group (preferably 2 to 15 carbon atoms), an aminoacyl group (preferably 2 to 20 carbon atoms) and the like. Further, with respect to the ring structure of the aryl group, cycloalkyl group, etc., an alkyl group (preferably 1 to 15 carbon atoms) can be mentioned as a substituent. Further, with respect to the aminoacyl group, one or more alkyl groups (each preferably 1 to 15 carbon atoms) can be mentioned as substituents.

Among the compounds of general formula (PA-1), the compounds wherein the Q-moiety is sulfonic acid can be synthesized by using a common sulfonamidation reaction. For example, these compounds can be synthesized by a method in which one sulfonyl halide moiety of a bissulfonyl halide compound is caused to selectively react with an amine compound to thereby form a sulfonamido bond and thereafter the other sulfonyl halide moiety is hydrolyzed, or alternatively by a method in which a cyclic sulfonic anhydride is caused to react with an amine compound to thereby effect a ring opening.

Now, the compounds of general formula (PA-II) will be described.

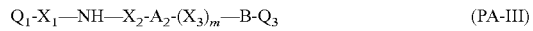  (PA-II)

In general formula (PA-II), each of $Q_1$ and $Q_2$ independently represents a monovalent organic group, provided that either $Q_1$ or $Q_2$ contains a basic functional group. $Q_1$ and $Q_2$ may be bonded to each other to thereby form a ring, the ring containing a basic functional group.

Each of $X_1$ and $X_2$ independently represents —CO— or —SO$_2$—.

In the formula, —NH— corresponds to the acid functional group produced upon exposure to actinic rays or radiation.

The monovalent organic group represented by each of $Q_1$ and $Q_2$ in general formula (PA-II) preferably has 1 to 40 carbon atoms. As such, there can be mentioned, for example, an alkyl group, a cycloalkyl group, an aryl group, an aralkyl group, an alkenyl group or the like.

A substituent may be introduced in the alkyl group represented by each of $Q_1$ and $Q_2$. The alkyl group is preferably a linear or branched alkyl group having 1 to 30 carbon atoms. An oxygen atom, a sulfur atom or a nitrogen atom may be introduced in the alkyl chain.

A substituent may be introduced in the cycloalkyl group represented by each of $Q_1$ and $Q_2$. The cycloalkyl group preferably has 3 to 20 carbon atoms. An oxygen atom or a nitrogen atom may be introduced in the ring.

A substituent may be introduced in the aryl group represented by each of $Q_1$ and $Q_2$. The aryl group preferably has 6 to 14 carbon atoms.

A substituent may be introduced in the aralkyl group represented by each of $Q_1$ and $Q_2$. The aralkyl group preferably has 7 to 20 carbon atoms.

A substituent may be introduced in the alkenyl group represented by each of $Q_1$ and $Q_2$. For example, there can be mentioned groups each resulting from the introduction of a double bond at an arbitrary position of any of the above alkyl groups.

As substituents that may be introduced in these groups, there can be mentioned those set forth above by way of example as being introducible in the groups of general formula (PA-I).

As preferred partial structures of the basic functional groups contained in at least either $Q_1$ or $Q_2$, there can be mentioned those described above as the basic functional groups contained in R of general formula (PA-I).

As the structure in which $Q_1$ and $Q_2$ are bonded to each other to thereby form a ring, the ring containing a basic functional group, there can be mentioned, for example, a structure in which the organic groups represented by $Q_1$ and $Q_2$ are bonded to each other by an alkylene group, an oxy group, an imino group or the like.

In general formula (PA-II), it is preferred for at least one of $X_1$ and $X_2$ to be —SO$_2$—.

Below, the compounds of general formula (PA-III) will be described.

  (PA-III)

In general formula (PA-III), each of $Q_1$ and $Q_3$ independently represents a monovalent organic group, provided that either $Q_1$ or $Q_3$ contains a basic functional group. $Q_1$ and $Q_3$ may be bonded to each other to thereby form a ring, the ring containing a basic functional group.

Each of $X_1$, $X_2$ and $X_3$ independently represents —CO— or —SO$_2$—.

$A_2$ represents a bivalent connecting group.

B represents a single bond, an oxygen atom or —N(Qx)-.

Qx represents a hydrogen atom or a monovalent organic group.

When B is —N(Qx)-, $Q_3$ and Qx may be bonded to each other to thereby form a ring.

m is 0 or 1.

In the formula, —NH— corresponds to the acid functional group produced upon exposure to actinic rays or radiation.

$Q_1$ has the same meaning as that of $Q_1$ of general formula (PA-II).

As the organic groups represented by $Q_3$, there can be mentioned those set forth above as being represented by $Q_1$ and $Q_2$ of general formula (PA-II).

The bivalent connecting group represented by $A_2$ is preferably a bivalent connecting group having 1 to 8 carbon atoms in which a fluorine atom is introduced. As such, there can be mentioned, for example, an alkylene group having 1 to 8 carbon atoms in which a fluorine atom is introduced, a phenylene group in which a fluorine atom is introduced, or the like. An alkylene group containing a fluorine atom is more preferred, which has preferably 2 to 6 carbon atoms, more preferably 2 to 4 carbon atoms. A connecting group, such as an oxygen atom or a sulfur atom, may be introduced in the alkylene chain. In particular, an alkylene group, 30 to 100% of the hydrogen atoms of which are substituted with fluorine atoms, is preferred. Further, perfluoroalkylene groups are preferred. Perfluoroalkylene groups each having 2 to 4 carbon atoms are most preferred.

The monovalent organic group represented by Qx preferably has 4 to 30 carbon atoms. As such, there can be mentioned, for example, an alkyl group, a cycloalkyl group, an aryl group, an aralkyl group, an alkenyl group or the like. As the alkyl group, cycloalkyl group, aryl group, aralkyl group and alkenyl group, there can be mentioned those set forth above as being represented by Rx of general formula (PA-I).

In general formula (PA-III), it is preferred for each of $X_1$, $X_2$ and $X_3$ to be $-SO_2-$.

The compounds (PA) are preferably sulfonium salt compounds from the compounds of general formulae (PA-I), (PA-II) and (PA-III) and iodonium salt compounds from the compounds of general formulae (PA-I), (PA-II) and (PA-III), more preferably the compounds of general formulae (PA1) and (PA2) below.

In general formula (PA1), each of $R_{201}$, $R_{202}$ and $R_{203}$ independently represents an organic group. In particular, these are the same as $R_{201}$, $R_{202}$ and $R_{203}$ of formula ZI mentioned above in connection with the acid generator.

$X^-$ represents a sulfonate anion or carboxylate anion resulting from the cleavage of a hydrogen atom from the $-SO_3H$ moiety or $-COOH$ moiety of each of the compounds of general formula (PA-I), or an anion resulting from the cleavage of a hydrogen atom from the $-NH-$ moiety of each of the compounds of general formulae (PA-II) and (PA-III).

In general formula (PA2) above, each of $R_{204}$ and $R_{205}$ independently represents an aryl group, an alkyl group or a cycloalkyl group. In particular, these are the same as $R_{204}$ and $R_{205}$ of formula ZII mentioned above in connection with the acid generator.

$X^-$ represents a sulfonate anion or carboxylate anion resulting from the cleavage of a hydrogen atom from the $-SO_3H$ moiety or $-COOH$ moiety of each of the compounds of general formula (PA-I), or an anion resulting from the cleavage of a hydrogen atom from the $-NH-$ moiety of each of the compounds of general formulae (PA-II) and (PA-III).

The compounds (PA) when exposed to actinic rays or radiation are decomposed to thereby produce, for example, the compounds of general formulae (PA-I), (PA-II) and (PA-III).

Each of the compounds of general formula (PA-I) contains a sulfonic acid group or a carboxylic acid group together with a basic functional group or an ammonium group, so that it is a compound having its basicity lowered as compared with that of the compound (PA) or dissipated, or having its basicity converted to acidity.

Each of the compounds of general formulae (PA-II) and (PA-III) contains an organic sulfonylimino group or an organic carbonylimino group together with a basic functional group, so that it is a compound having its basicity lowered as compared with that of the compound (PA) or dissipated, or having its basicity converted to acidity.

In the present invention, the lowering of basicity upon exposure to actinic rays or radiation means that the acceptor properties for the proton (acid produced by exposure to actinic rays or radiation) of the compound (PA) are lowered by exposure to actinic rays or radiation. The lowering of acceptor properties means that when an equilibrium reaction in which a noncovalent-bond complex being a proton adduct is formed from a proton and a compound containing a basic functional group occurs, or when an equilibrium reaction in which the counter cation of a compound containing an ammonium group is replaced by a proton occurs, the equilibrium constant of the chemical equilibrium is lowered.

When the compound (PA) whose basicity is lowered upon exposure to actinic rays or radiation is contained in the resist film, in nonexposed areas, the acceptor properties of the compound (PA) are fully exhibited, so that any unintended reaction between the acid diffused from exposed areas, etc. and the resin (A) can be suppressed. In exposed areas, the acceptor properties of the compound (PA) are lowered, so that the intended reaction between the acid and the resin (A) occurs with high certainty. It is presumed that, by virtue of the contribution of this activity mechanism, a pattern excelling in line width roughness (LWR), focus latitude (depth of focus DOF) and pattern shape can be obtained.

The basicity can be ascertained by performing pH measurement. Also, calculated values of basicity can be obtained by utilizing commercially available software.

As particular examples of the compounds (PA) whose basicity is lowered upon exposure to actinic rays or radiation, there can be mentioned, for example, those described in JP-A-2006-208781 and JP-A-2006-330098.

Particular examples of the compounds (PA) that produce the compounds of general formula (PA-I) upon exposure to actinic rays or radiation are shown below, which in no way limit the scope of the present invention.

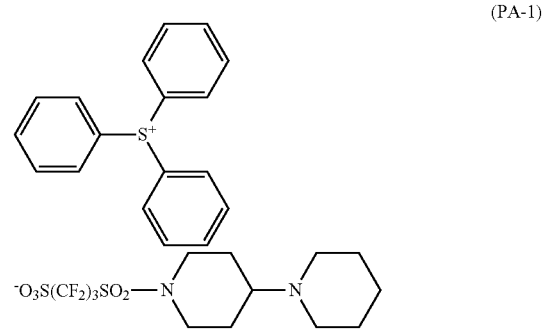

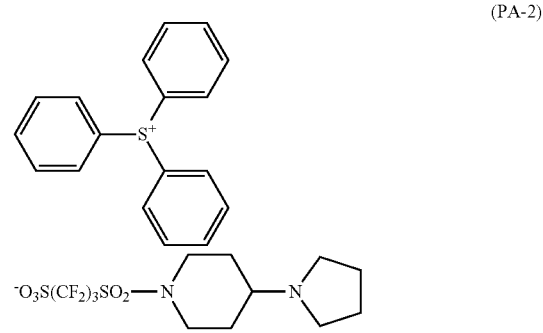

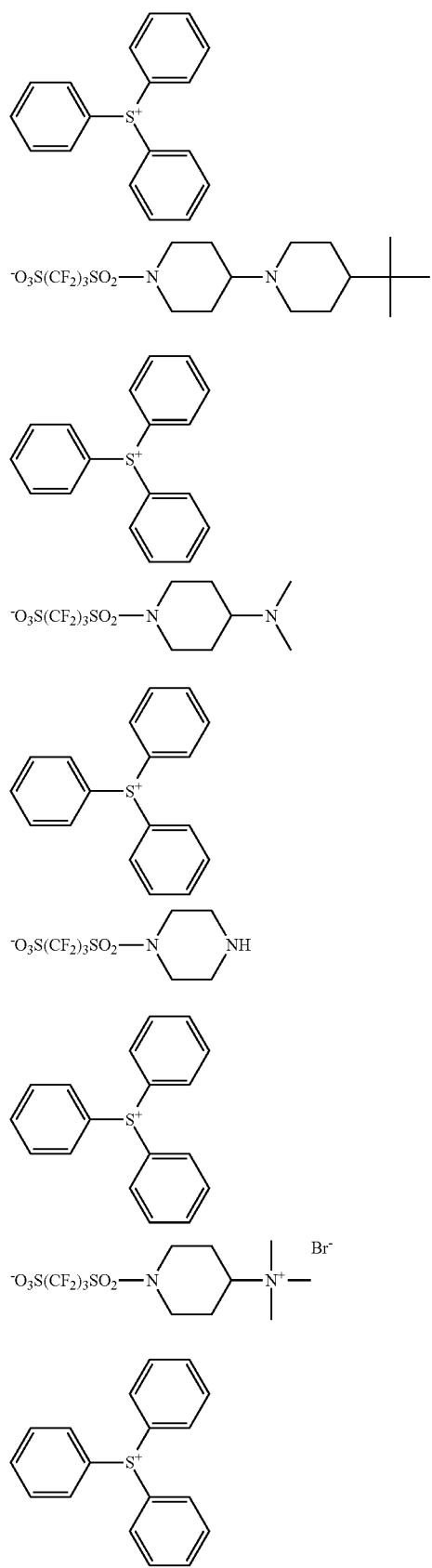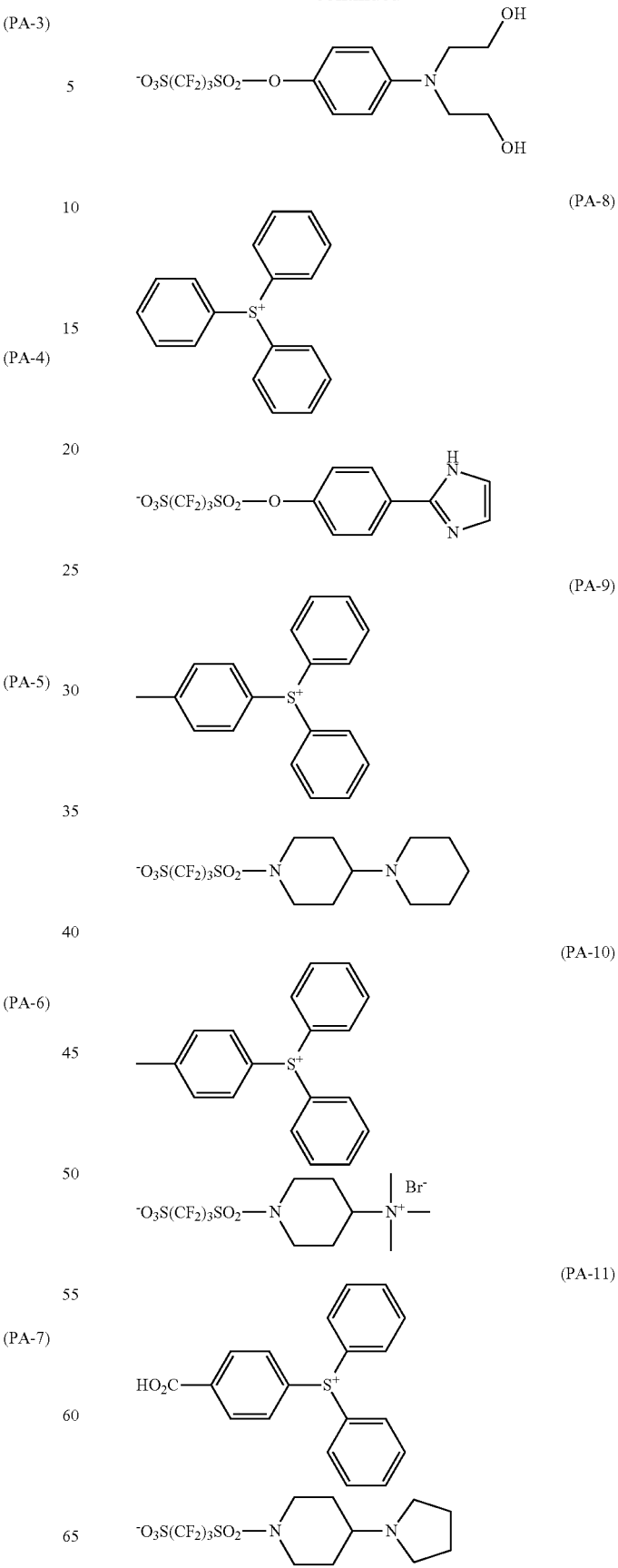

(PA-12)
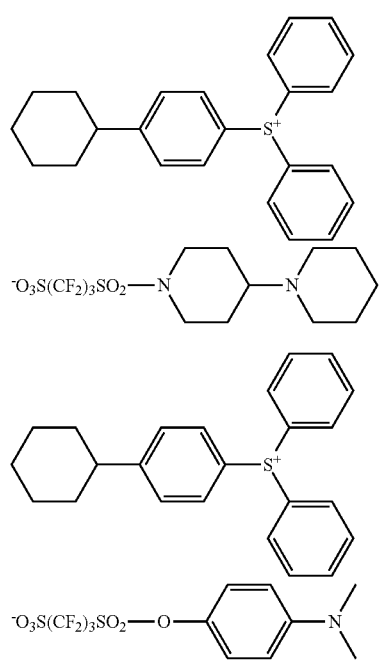
(PA-13)
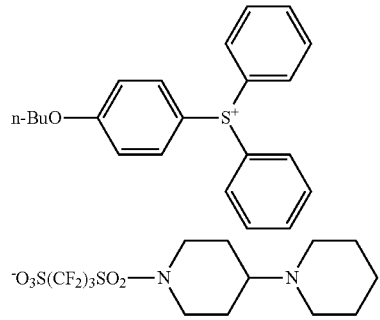
(PA-14)
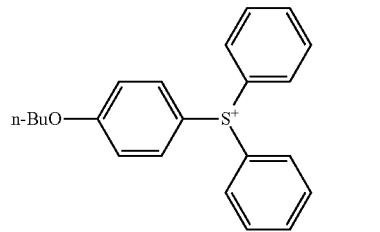
(PA-15)
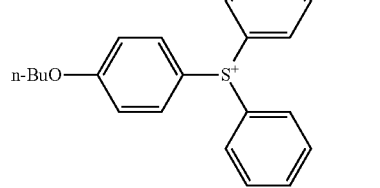
(PA-16)
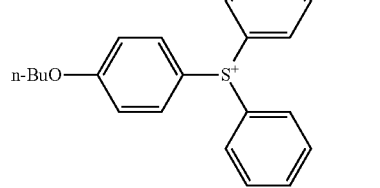
(PA-17)
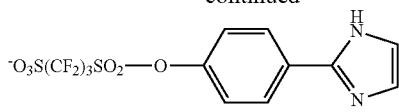
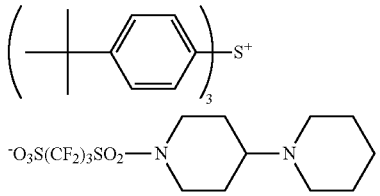
(PA-18)
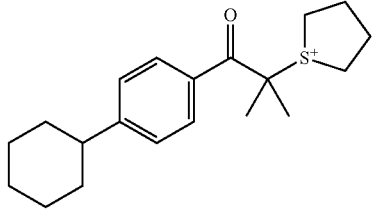
(PA-19)
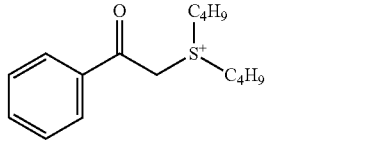
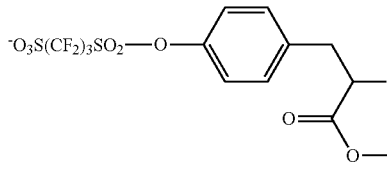
(PA-20)
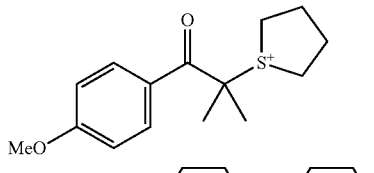
(PA-21)
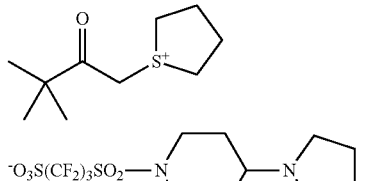
(PA-22)
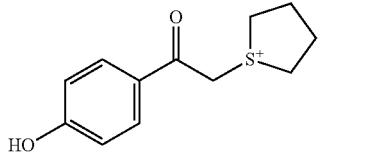

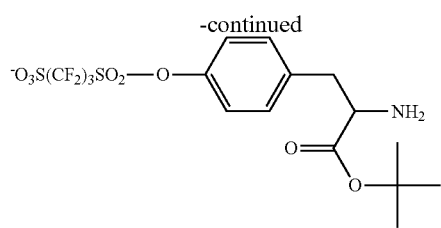
(PA-23)
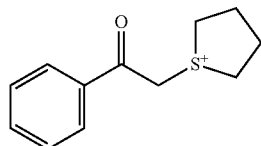
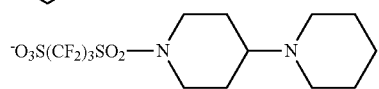
(PA-24)
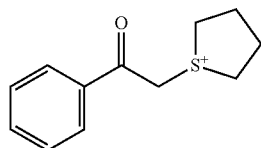
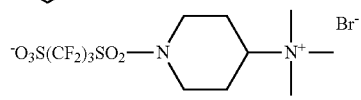
(PA-25)
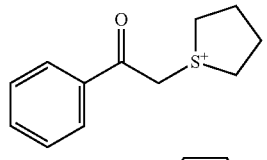
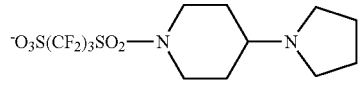
(PA-26)
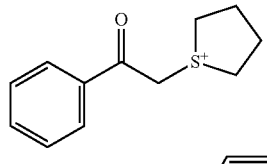
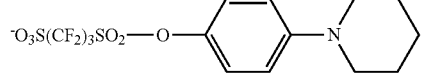
(PA-27)
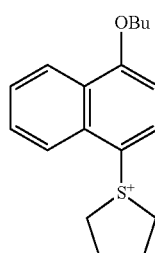
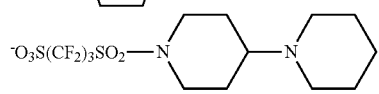
(PA-28)
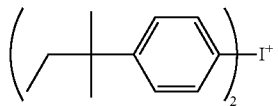
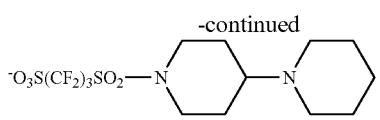
(PA-29)
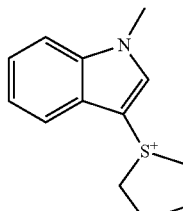
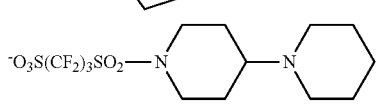
(PA-30)
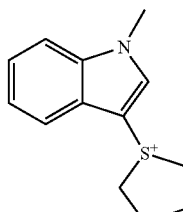
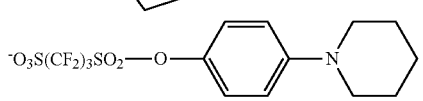
(PA-31)
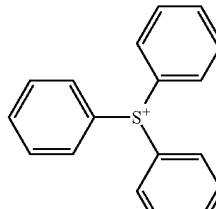
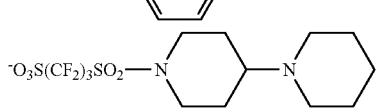
(PA-32)
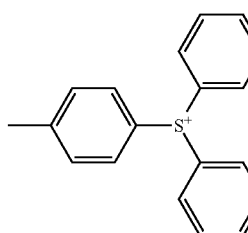
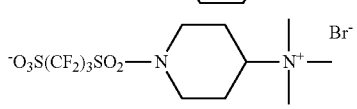
(PA-33)
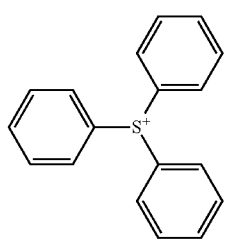

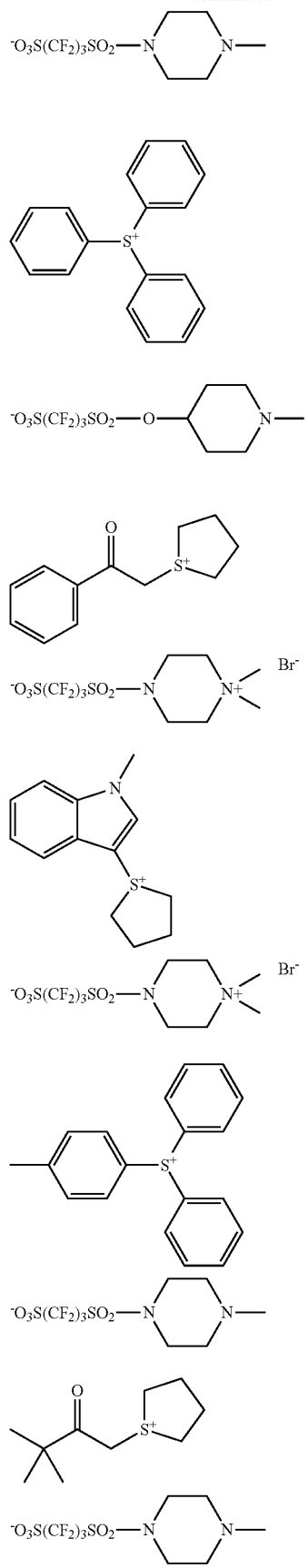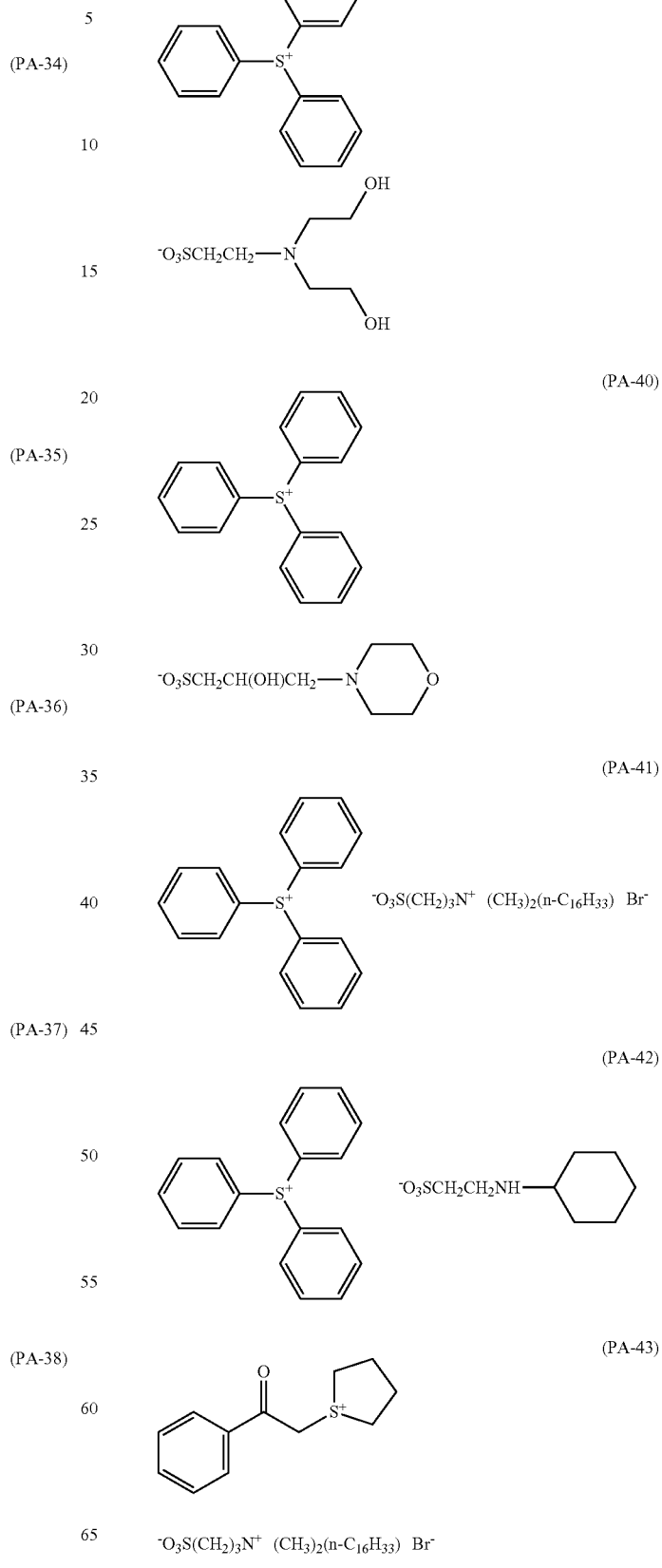

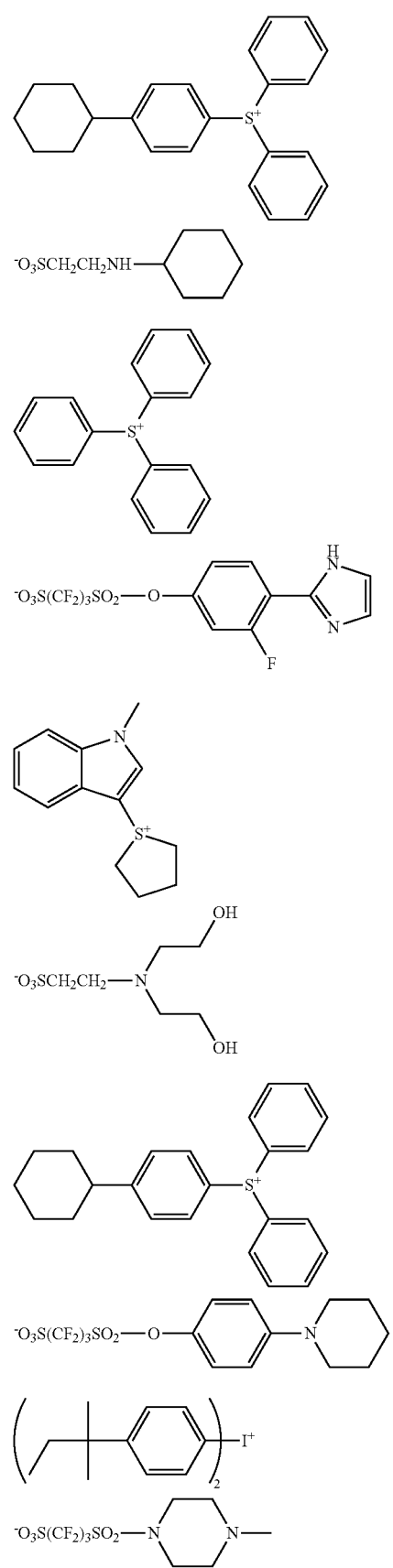

-continued

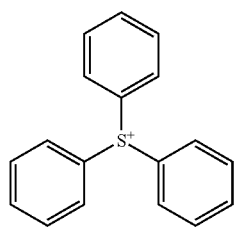 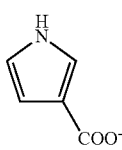
(PA-54)

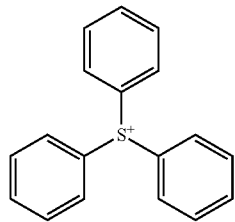 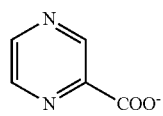
(PA-55)

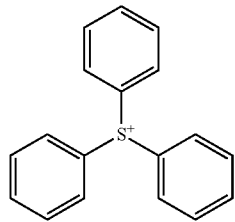 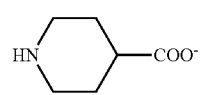
(PA-56)

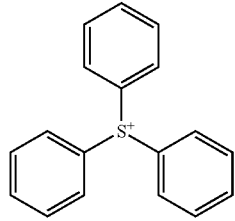 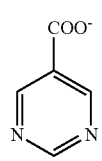
(PA-57)

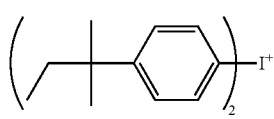 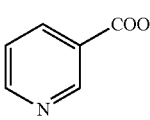
(PA-58)

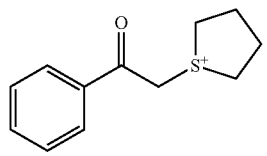
(PA-59)

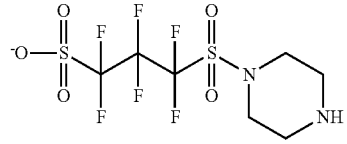

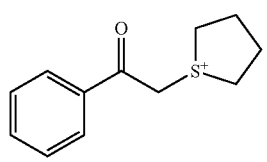 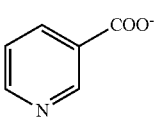
(PA-60)

These compounds can be easily synthesized from the compounds of general formula (PA-I), or a lithium, sodium or potassium salt thereof, and a hydroxide, bromide or chloride of iodonium or sulfonium, etc. by the salt exchange method described in Jpn. PCT National Publication No. H11-501909 and JP-A-2003-246786. Also, the synthesis can be performed in accordance with the method described in JP-A-H7-333851.

Particular examples of the compounds (PA) that produce the compounds of general formulae (PA-II) and (PA-III) upon exposure to actinic rays or radiation are shown below, which in no way limit the scope of the present invention.

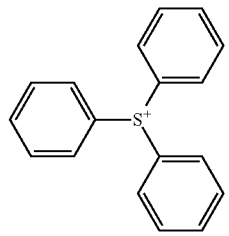
(PA-61)

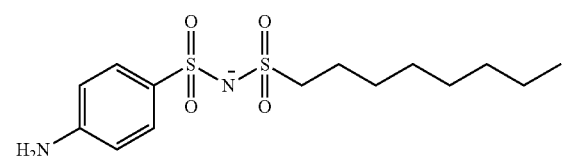

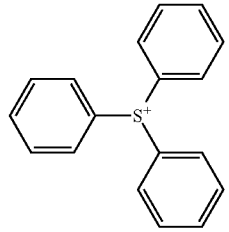
(PA-62)

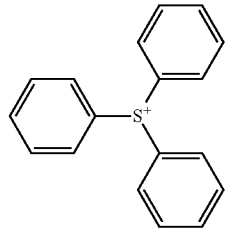
(PA-63)

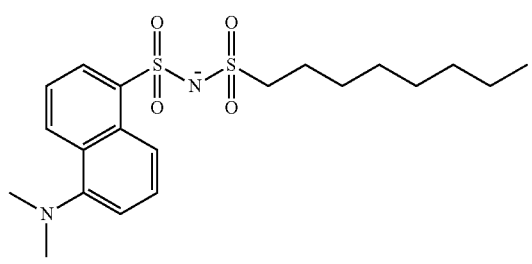

(PA-64)
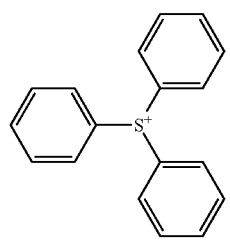
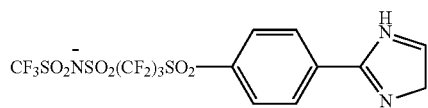
(PA-65)
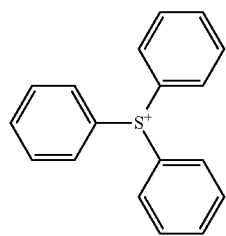
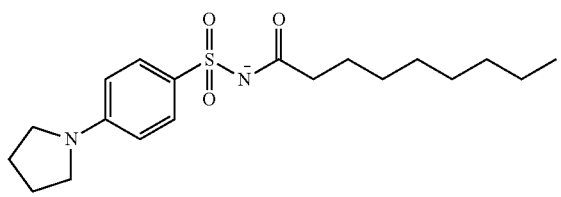
(PA-66)
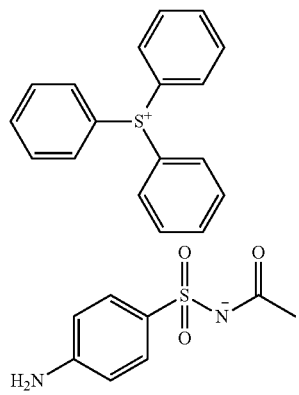
(PA-67)
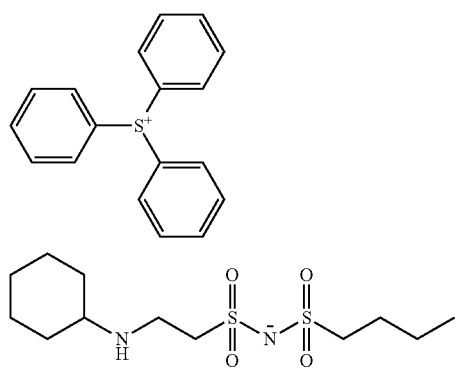
(PA-68)
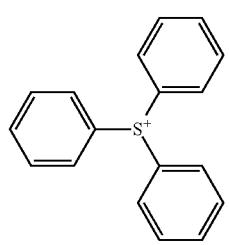
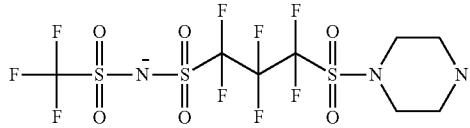
(PA-69)
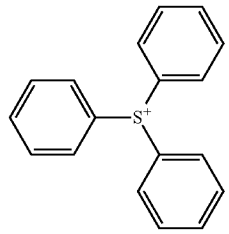
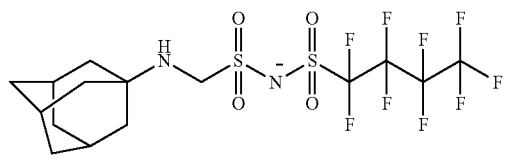
(PA-70)
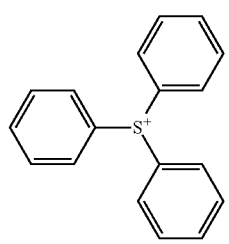
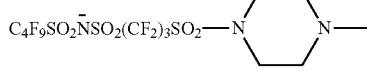
(PA-71)
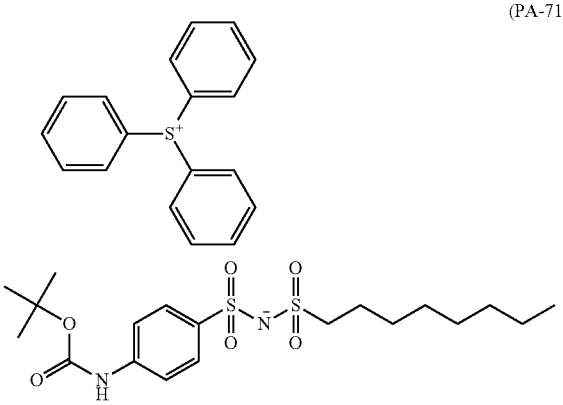

(PA-72)
(PA-73)
(PA-74)
(PA-75)
(PA-76)
(PA-77)
(PA-78)
(PA-79)
(PA-80)

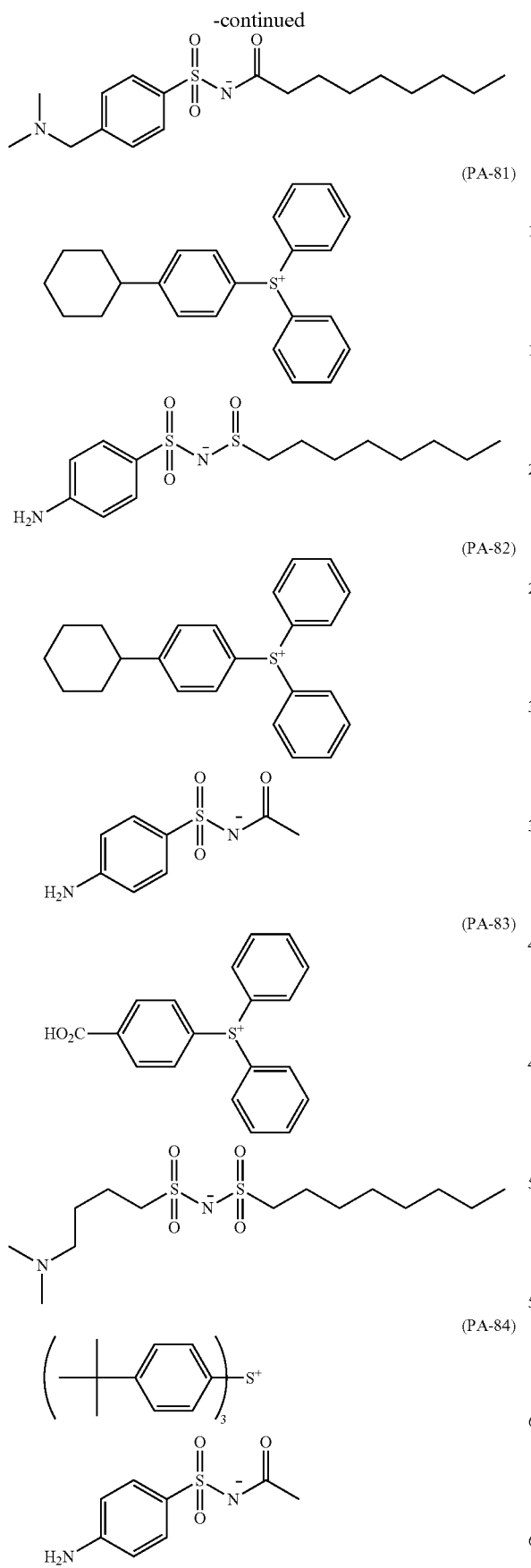
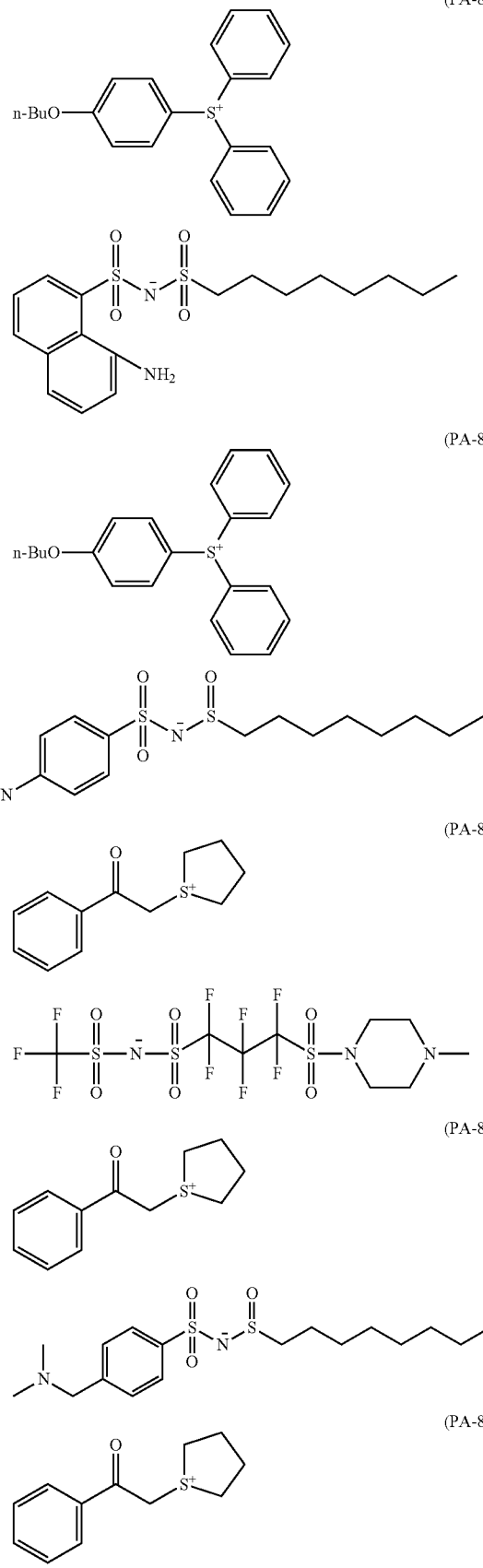

-continued
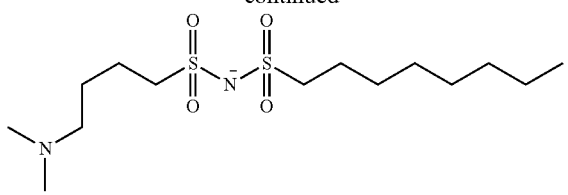
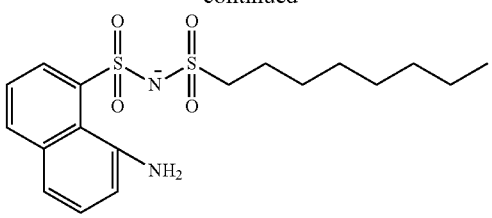
(PA-90)
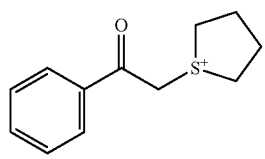
(PA-95)
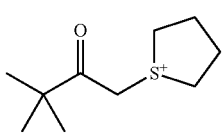
(PA-91)
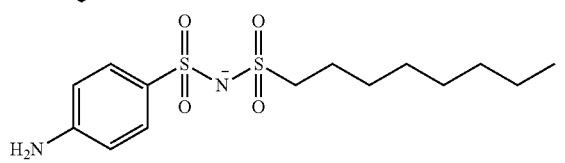
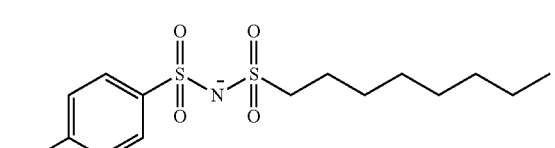
(PA-96)
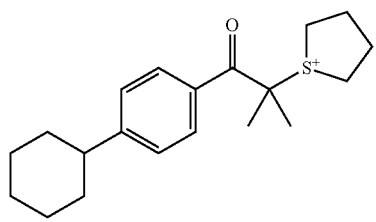
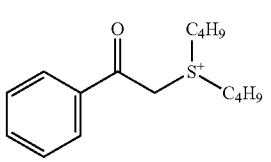
(PA-92)
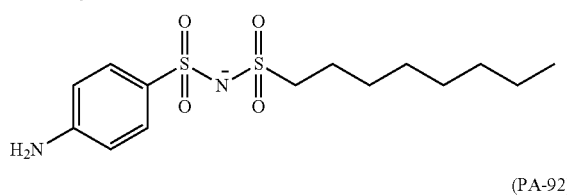
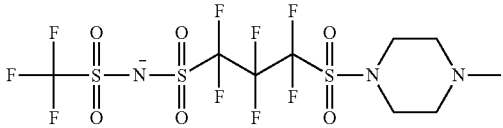
(PA-97)
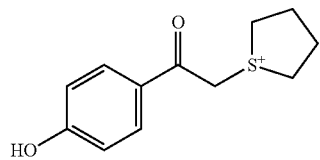
CF₃SO₂N̄SO₂(CF₂)₃SO₂ 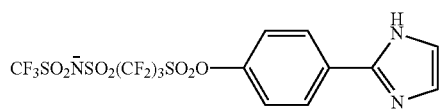
(PA-93)
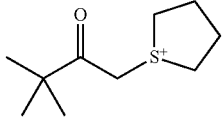
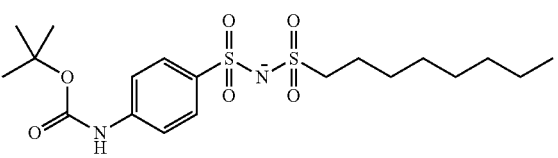
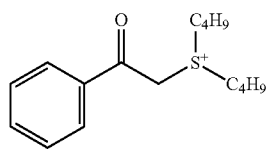
(PA-98)
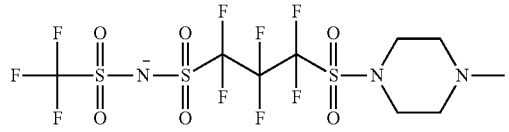
(PA-94)
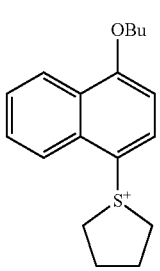
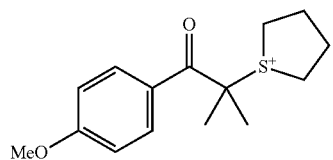
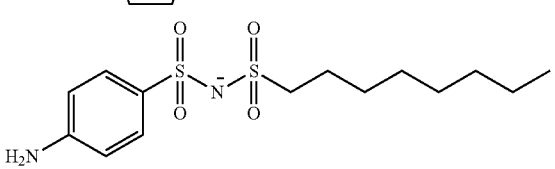

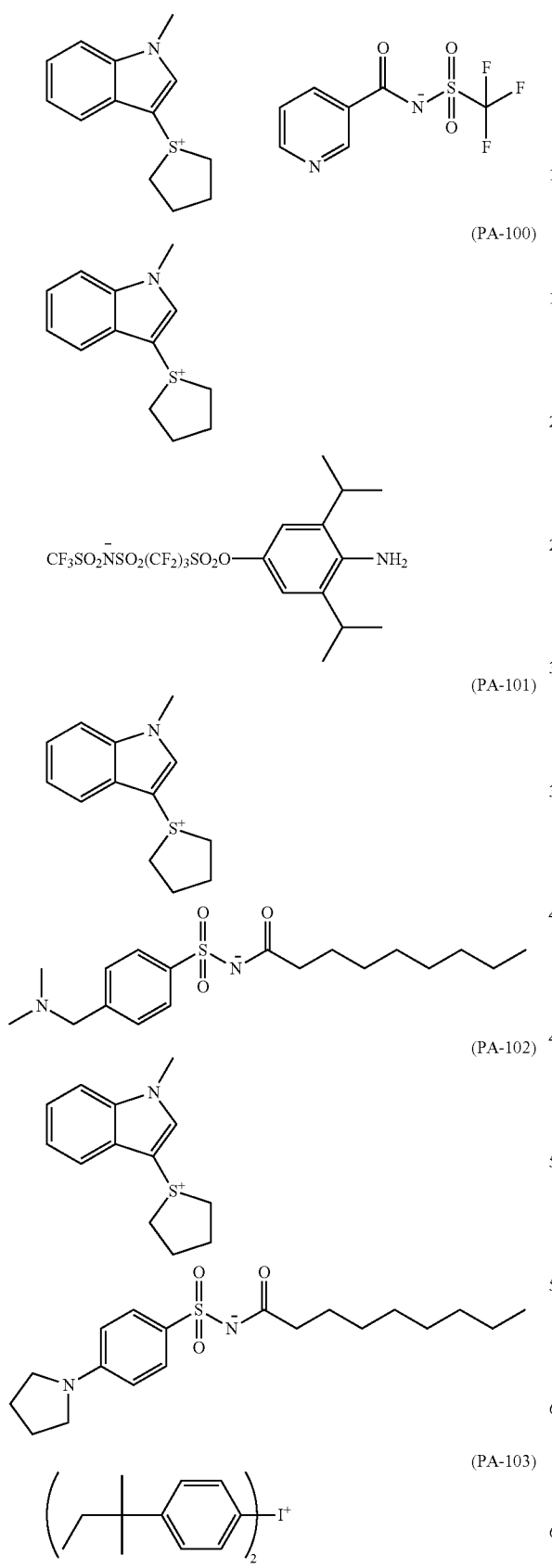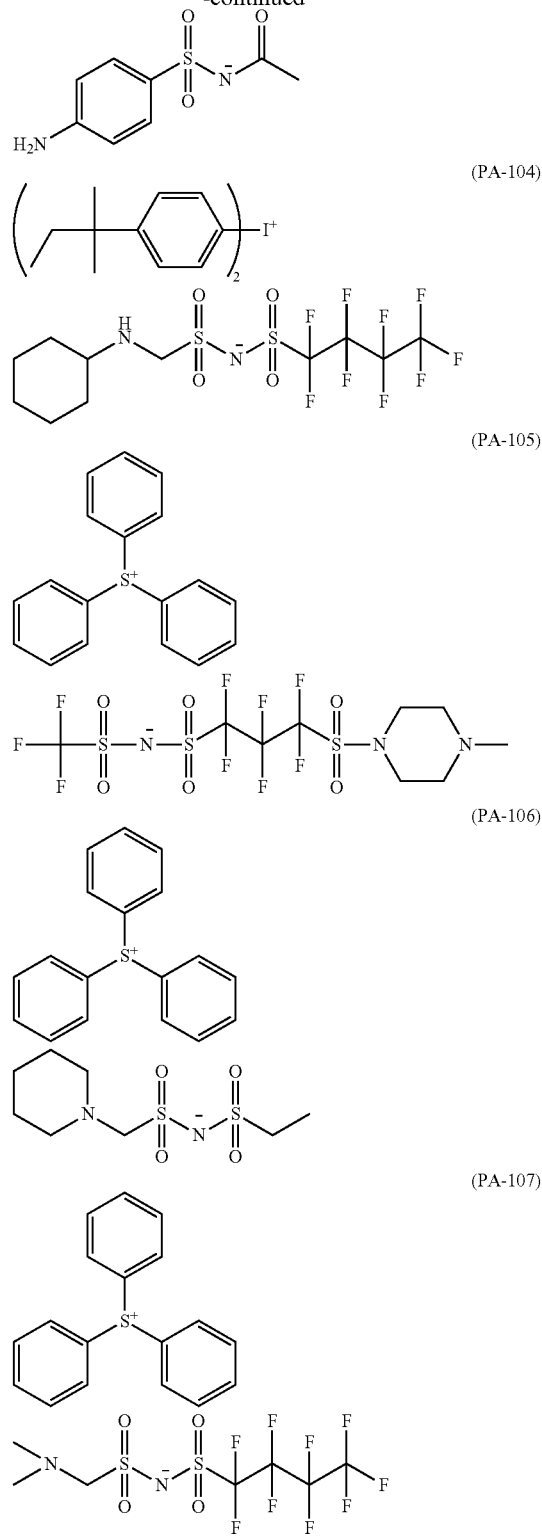
These compounds can be synthesized by, for example, the method described in JP-A-2006-330098.
The molecular weight of each of the compounds (PA) is preferably in the range of 500 to 1000.
When the resist composition of the present invention contains any of the compounds (PA), the content thereof based on the solids of the composition is preferably in the range of 0.1 to 20 mass %, more preferably 0.1 to 10 mass %.

Any of the compounds (PA) may be used alone, or two or more thereof may be used in combination. The compounds (PA) may be used in combination with the above-mentioned basic compounds.

[3-9] Other Additive

The resist composition of the present invention according to necessity can further be loaded with a dye, a plasticizer, a photosensitizer, a light absorber, a dissolution inhibitor, a dissolution accelerator, etc.

The total solid content of the resist composition of the present invention is generally in the range of 1.0 to 10 mass %, preferably 2.0 to 5.7 mass % and more preferably 2.0 to 5.3 mass %. When the solid content falls within the above range, the resist solution can be uniformly applied onto a substrate, and a resist pattern excelling in line edge roughness can be formed. The reason therefor has not been elucidated but is presumed to be that when the solid content is 10 mass % or less, preferably 5.7 mass % or less, the aggregation of materials, especially the photoacid generator, contained in the resist solution can be suppressed with the result that a uniform resist film can be formed.

The solid content refers to the percentage of the mass of resist components other than the solvent in the total mass of the resist composition.

The present invention will be described in greater detail below by way of its examples. However, the present invention is in no way limited to these examples.

[Preparation of Resist]

Solutions each of 6 mass % solid content were prepared using the components of Table 2 below. The solutions were each passed through a 0.03 μm polyethylene filter. Thus, resist compositions were obtained.

TABLE 2

| Comp. | (a) | (b) | (c) | (d) | (e) | (f) |
|---|---|---|---|---|---|---|
| Ar-01 | Resin(1) (10) | PAG-1 (0.8) | TPI (0.03) | W-1 (0.03) | (1b) (0.05) | A1/B1 (70/30) |
| Ar-02 | Resin(2) (10) | PAG-2 (0.7) | TPI (0.03) | W-1 (0.03) | (1b) (0.05) | A1/A3 (80/20) |

In Table 2, (a) signifies a resin (A) (mass/g); (b) signifies an acid generator (mass/g); (c) signifies a basic compound (mass/g); (d) signifies a surfactant (mass/g); (e) signifies a resin (B) (mass/g); and (f) signifies a solvent (mass ratio). The meanings of the abbreviations used in Table 2 are as follows.

<Resin (A)>

Resin (1)

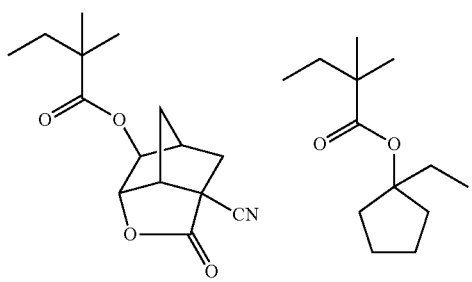

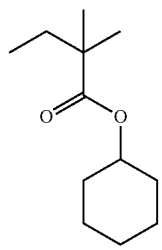

Resin (2)

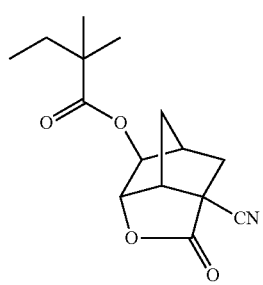 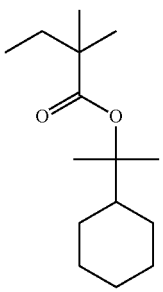

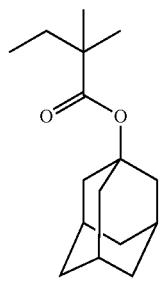

<Resin (B)>

The following resin (1b) was provided as the resin (B).

(1b)

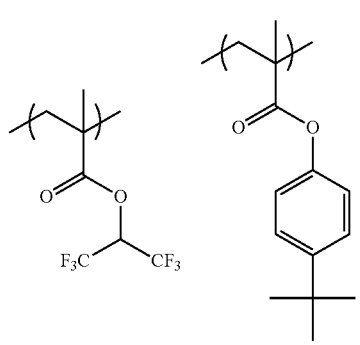

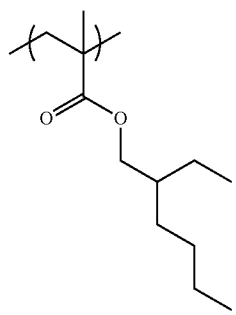

With respect to each of the resins, the component ratio (molar ratio) of repeating units, weight average molecular weight and dispersity (Pd) are given in Table 3 below.

TABLE 3

| Resin | (1) | (2) | (1b) |
|---|---|---|---|
| Comp. | 50/40/10 | 40/50/10 | 30/60/10 |
| Molecular weight | 10000 | 12000 | 5000 |
| Pd | 1.68 | 1.76 | 1.40 |

<Acid Generator>

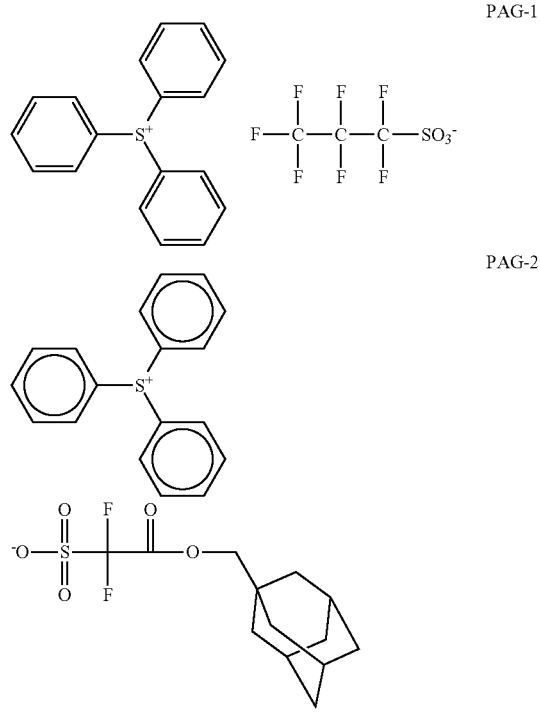

PAG-1

PAG-2

<Basic Compound>
TPI: 2,4,5-triphenylimidazole.
<Surfactant>
W-1: PF6320 (produced by OMNOVA SOLUTIONS, INC.).
<Solvent>
A1: propylene glycol monomethyl ether acetate,
A2: γ-butyrolactone,
A3: cyclohexanone,
B1: propylene glycol monomethyl ether, and
B2: ethyl lactate.
[Formation of Resist Pattern]
An organic antireflection film ARC29A (produced by Nissan Chemical Industries, Ltd.) was applied onto a silicon wafer and baked at 205° C. for 60 seconds, thereby forming a 86 nm-thick antireflection film. Each of the prepared resist compositions was applied thereonto and baked at 100° C. for 60 seconds (PreBake; PB), thereby forming a 100 nm-thick resist film. The resultant wafer was patternwise exposed by means of an ArF excimer laser scanner (NA0.75). Thereafter, the exposed wafer was baked at 100° C. for 60 seconds (Post-Exposure Bake, PEB). The thus baked wafer was developed with the below-identified developer for 30 seconds, rinsed with the below-identified rinse liquid and rotated at a rotating speed of 4000 rpm for 30 seconds. Thus, (1:1) line-and-space patterns of 75 nm line width were obtained.

[Developer and Rinse Liquid]
Each of the developers and rinse liquids was subjected to an appropriate combination of the following processings.
(Processing 1: Filtration)
In an ordinary laboratory environment, a commercially available chemical of electronic material grade was passed through a polyethylene filter of 0.03 μm pore size, and placed and stored in a bloomed clean bottle.
(Processing 2: Class 1000 Environment)
In a class 1000 environment, a commercially available chemical of electronic material grade was passed through a polyethylene filter of 0.03 μm pore size, and placed and stored in a bloomed clean bottle.
(Processing 3: Class 100 Environment)
In a class 100 environment, a commercially available chemical of electronic material grade was passed through a polyethylene filter of 0.03 μm pore size, and placed and stored in a bloomed clean bottle.
Tables 4 and 5 below give a summary of the developers and rinse liquids employed in the Examples and Comparative Examples. In the tables, "o" signifies having carried out the relevant processing, and "x" signifies not having carried out the relevant processing.
With respect to each of the developers and rinse liquids, the density of particles each having a diameter of 0.3 μm or greater was measured by means of an in-liquid particle sensor KS-41A (manufactured by Rion Co., Ltd.). This measurement was carried out in a class 1000 clean room at a measuring flow rate of 10 ml/min. The results are also given in Tables 4 and 5 below.
[Developer]

TABLE 4

| | Developer: butyl acetate | | | |
|---|---|---|---|---|
| Processing/quality | (1-1) | (1-2) | (1-3) | (1-4) |
| Filtration | x | o | o | o |
| Class 1000 environ. | x | x | o | x |
| Class 100 environ. | x | x | x | o |
| Particle density (no./ml) | 194 | 26 | 19 | 11 |

| | Developer: methyl amyl ketone | | | |
|---|---|---|---|---|
| Processing/quality | (2-1) | (2-2) | (2-3) | (2-4) |
| Filtration | x | o | o | o |
| Class 1000 environ. | x | x | o | x |
| Class 100 environ. | x | x | x | o |
| Particle density (no./ml) | 237 | 29 | 22 | 18 |

| | Developer: 3-ethoxypropionate | | | |
|---|---|---|---|---|
| Processing/quality | (3-1) | (3-2) | (3-3) | (3-4) |
| Filtration | x | o | o | o |
| Class 1000 environ. | x | x | o | x |
| Class 100 environ. | x | x | x | o |
| Particle density (no./ml) | 218 | 25 | 18 | 13 |

[Rinse liquid]

TABLE 5

| | Rinse liquid: 4-methyl-2-pentanol | | | |
|---|---|---|---|---|
| Processing/quality | (4-1) | (4-2) | (4-3) | (4-4) |
| Filtration | x | o | o | o |
| Class 1000 environ. | x | x | o | x |

TABLE 5-continued

| | | | | |
|---|---|---|---|---|
| Class 100 environ. | x | x | x | ○ |
| Particle density (no./ml) | 189 | 31 | 19 | 14 |

| | Rinse liquid: decane | | | |
|---|---|---|---|---|
| Processing/quality | (5-1) | (5-2) | (5-3) | (5-4) |
| Filtration | x | ○ | ○ | ○ |
| Class 1000 environ. | x | x | ○ | x |
| Class 100 environ. | x | x | x | ○ |
| Particle density (no./ml) | 179 | 20 | 13 | 8 |

<Evaluation>
[Defect]

The optimum exposure amount and optimum focus were respectively defined as the exposure amount and focus that form a 1:1 line-and-space resist pattern of 75 nm line width. The number of defects of each pattern obtained under the conditions of the optimum exposure amount and optimum focus was digitized and evaluated on the following criteria. The results are given in Table 6 below.

⊚ (Excellent): 0 to 50 defects,
○ (Good): 51 to 100 defects,
Δ (Fair): 101 to 150 defects, and
x (Insufficient): 151 or more defects.

TABLE 6

| Resist | Ar-01 | | | |
|---|---|---|---|---|
| Developer | (1-1) | (1-2) | (1-3) | (1-4) |
| Rinse liquid | (4-4) | (4-4) | (4-4) | (4-4) |
| Defect no. | x | Δ | ○ | ○ |

| Resist | Ar-02 | | | |
|---|---|---|---|---|
| Developer | (2-1) | (2-2) | (2-3) | (2-4) |
| Rinse liquid | (4-4) | (4-4) | (4-4) | (4-4) |
| Defect no. | x | Δ | ○ | ○ |

| Resist | Ar-01 | | | |
|---|---|---|---|---|
| Developer | (3-1) | (3-2) | (3-3) | (3-4) |
| Rinse liquid | (5-4) | (5-4) | (5-4) | (5-4) |
| Defect no. | x | ○ | ○ | ○ |

| Resist | Ar-01 | | | |
|---|---|---|---|---|
| Developer | (1-4) | (1-4) | (1-4) | (1-4) |
| Rinse liquid | (4-1) | (4-2) | (4-3) | (4-4) |
| Defect no. | ○ | ○ | ○ | ⊚ |

| Resist | Ar-02 | | | |
|---|---|---|---|---|
| Developer | (1-4) | (1-4) | (1-4) | (1-4) |
| Rinse liquid | (5-1) | (5-2) | (5-3) | (5-4) |
| Defect no. | ○ | ○ | ○ | ⊚ |

| Resist | Ar-02 | | | |
|---|---|---|---|---|
| Developer | (1-1) | (1-2) | (1-3) | (1-4) |
| Rinse liquid | — | — | — | — |
| Defect no. | x | Δ | ○ | ○ |

As apparent from Table 6, the number of defects could be strikingly reduced by using the developer in which the density of particles each having a diameter of 0.3 μm or greater is 30 particles/ml or less.

What is claimed is:

1. A method of forming a pattern, comprising:
    (a) forming a chemically amplified resist composition into a film,
    (b) exposing the film to light, and
    (c) developing the exposed film with a developer containing a first organic solvent subjected to a distilling operation,
    wherein in the developer, particles each having a diameter of 0.3 μm or greater amount to a density of 30 particles/ml or less.

2. The method according to claim 1, wherein the first organic solvent contained in the developer is one filled in a storage container in an environment whose cleanliness defined in US Federal Standard 209E is class 10,000 or below.

3. The method according to claim 1, which further comprises:
    (d) rinsing the developed film by a rinse liquid containing a second organic solvent,
    wherein in the rinse liquid, particles each having a diameter of 0.3 μm or greater amount to a density of 30 particles/ml or less.

4. The method according to claim 3, wherein the second organic solvent contained in the rinse liquid is one filled in a storage container in an environment whose cleanliness defined in US Federal Standard 209E is class 10,000 or below.

5. The method according to claim 1, wherein the exposure (b) is carried out using an ArF excimer laser.

6. The method according to claim 1, wherein the composition comprises a resin containing a group that when acted on by an acid, is decomposed to thereby produce a polar group and a compound that when exposed to actinic rays or radiation, generates an acid.

7. The method according to claim 6, wherein the resin has an alicyclic hydrocarbon structure.

8. The method according to claim 6, wherein substantially no aromatic ring is contained in the resin.

9. A method of forming a pattern, comprising:
    (a) forming a chemically amplified resist composition into a film,
    (b) exposing the film to light, and
    (c) developing the exposed film with a developer containing a first organic solvent,
    wherein in the developer, particles each having a diameter of 0.3 μm or greater amount to a density of 30 particles/ml or less, and
    wherein the first organic solvent is filled in a storage container having been rinsed with the first organic solvent and dried.

10. The method according to claim 9, wherein the first organic solvent contained in the developer is one filled in a storage container in an environment whose cleanliness defined in US Federal Standard 209E is class 10,000 or below.

11. The method according to claim 9, which further comprises:
    (d) rinsing the developed film by a rinse liquid containing a second organic solvent,
    wherein in the rinse liquid, particles each having a diameter of 0.3 μm or greater amount to a density of 30 particles/ml or less.

12. The method according to claim 9, wherein the second organic solvent contained in the rinse liquid is one filled in a storage container in an environment whose cleanliness defined in US Federal Standard 209E is class 10,000 or below.

13. The method according to claim 9, wherein the exposure (b) is carried out using an ArF excimer laser.

14. The method according to claim 9, wherein the composition comprises a resin containing a group that when acted on by an acid, is decomposed to thereby produce a polar group and a compound that when exposed to actinic rays or radiation, generates an acid.

15. The method according to claim 9, wherein the resin has an alicyclic hydrocarbon structure.

16. The method according to claim 9, wherein substantially no aromatic ring is contained in the resin.

17. A method of forming a pattern, comprising:
 (a) forming a chemically amplified resist composition into a film,
 (b) exposing the film to light, and
 (c) developing the exposed film with a developer containing a first organic solvent that is methyl amyl ketone,
 wherein in the developer, particles each having a diameter of 0.3 μm or greater amount to a density of 30 particles/ml or less.

18. A method of forming a pattern, comprising:
 (a) forming a chemically amplified resist composition into a film,
 (b) exposing the film to light, and
 (c) developing the exposed film with a developer containing a first organic solvent, and
 (d) rinsing the developed film by a rinse liquid containing a second organic solvent that is 4-methyl-2-pentanol,
 wherein in the developer, particles each having a diameter of 0.3 μm or greater amount to a density of 30 particles/ml or less.

* * * * *